(12) United States Patent
Högasten et al.

(10) Patent No.: US 10,091,439 B2
(45) Date of Patent: Oct. 2, 2018

(54) IMAGER WITH ARRAY OF MULTIPLE INFRARED IMAGING MODULES

(71) Applicant: FLIR Systems, Inc., Wilsonville, OR (US)

(72) Inventors: Nicholas Högasten, Santa Barbara, CA (US); Mark Nussmeier, Goleta, CA (US); Eric A. Kurth, Santa Barbara, CA (US); Theodore R. Hoelter, Goleta, CA (US); Katrin Strandemar, Rimbo (SE); Pierre Boulanger, Goleta, CA (US); Barbara Sharp, Santa Barbara, CA (US)

(73) Assignee: FLIR Systems, Inc., Wilsonville, OR (US)

( * ) Notice: Subject to any disclaimer, the term of this patent is extended or adjusted under 35 U.S.C. 154(b) by 400 days.

(21) Appl. No.: 14/137,573

(22) Filed: Dec. 20, 2013

(65) Prior Publication Data

US 2014/0139643 A1    May 22, 2014

Related U.S. Application Data

(63) Continuation-in-part of application No. 13/043,123, filed on Mar. 8, 2011, now Pat. No. 8,766,808, and a
(Continued)

(51) Int. Cl.
*H04N 5/33* (2006.01)
*H04N 13/243* (2018.01)
(Continued)

(52) U.S. Cl.
CPC .......... *H04N 5/33* (2013.01); *H01L 27/14609* (2013.01); *H01L 27/14623* (2013.01);
(Continued)

(58) Field of Classification Search
USPC ............. 348/48, 164, 166, 139, 274, 275
See application file for complete search history.

(56) References Cited

U.S. PATENT DOCUMENTS

| 2,764,055 | A |   | 9/1956 | Clemens et al. |
| 5,600,143 | A | * | 2/1997 | Roberts ................... G01J 5/30 |
|           |   |   |        | 250/332 |

(Continued)

FOREIGN PATENT DOCUMENTS

| CA | 2764055 | 7/2012 |
| CN | 2874947 | 2/2007 |

(Continued)

OTHER PUBLICATIONS

Sandau, R., 2004. High resolution mapping with small satellites. IAPRS, vol. 35, Part Bl, Istanbul, Jul. 12-23, 2004, pp. 108-113.*

(Continued)

*Primary Examiner* — Behrooz Senfi
*Assistant Examiner* — Ana Picon-Feliciano
(74) *Attorney, Agent, or Firm* — Haynes and Boone, LLP

(57) ABSTRACT

An imager array may be provided as part of an imaging system. The imager array may include a plurality of infrared imaging modules. Each infrared imaging module may include a plurality of infrared sensors associated with an optical element. The infrared imaging modules may be oriented, for example, substantially in a plane facing the same direction and configured to detect images from the same scene. Such images may be processed in accordance with various techniques to provide images of infrared radiation. The infrared imaging modules may include filters or lens coatings to selectively detect desired ranges of infrared radiation. Such arrangements of infrared imaging modules in an imager array may be used to advantageous effect in a variety of different applications.

36 Claims, 36 Drawing Sheets

Related U.S. Application Data continuation-in-part of application No. 14/101,245, filed on Dec. 9, 2013, now Pat. No. 9,706,139, which is a continuation of application No. PCT/US2012/041744, filed on Jun. 8, 2012, application No. 14/137,573, which is a continuation-in-part of application No. 14/099,818, filed on Dec. 6, 2013, now Pat. No. 9,723,227, which is a continuation of application No. PCT/US2012/041749, filed on Jun. 8, 2012, application No. 14/137,573, which is a continuation-in-part of application No. 14/101,258, filed on Dec. 9, 2013, now Pat. No. 9,723,228, which is a continuation of application No. PCT/US2012/041739, filed on Jun. 8, 2012, application No. 14/137,573, which is a continuation-in-part of application No. 13/437,645, filed on Apr. 2, 2012, now Pat. No. 9,171,361, which is a continuation-in-part of application No. 13/105,765, filed on May 11, 2011, now Pat. No. 8,565,547, said application No. 13/105,765 is a continuation-in-part of application No. 12/766,739, filed on Apr. 23, 2010, now Pat. No. 8,520,970, and a continuation of application No. PCT/EP2011/056432, filed on Apr. 21, 2011, and a continuation-in-part of application No. 12/766,739, filed on Apr. 23, 2010, now Pat. No. 8,520,970, said application No. PCT/EP2011/056432 is a continuation-in-part of application No. 12/766,739, filed on Apr. 23, 2010, now Pat. No. 8,520,970, application No. 14/137,573, which is a continuation-in-part of application No. 12/477,828, filed on Jun. 3, 2009, now Pat. No. 8,749,635.

(60) Provisional application No. 61/745,193, filed on Dec. 21, 2012, provisional application No. 61/312,146, filed on Mar. 9, 2010, provisional application No. 61/656,889, filed on Jun. 7, 2012, provisional application No. 61/545,056, filed on Oct. 7, 2011, provisional application No. 61/495,873, filed on Jun. 10, 2011, provisional application No. 61/495,879, filed on Jun. 10, 2011, provisional application No. 61/495,888, filed on Jun. 10, 2011, provisional application No. 61/473,207, filed on Apr. 8, 2011, provisional application No. 61/748,018, filed on Dec. 31, 2012, provisional application No. 61/792,582, filed on Mar. 15, 2013, provisional application No. 61/793,952, filed on Mar. 15, 2013, provisional application No. 61/746,069, filed on Dec. 26, 2012, provisional application No. 61/746,074, filed on Dec. 26, 2012.

(51) Int. Cl.
*H01L 27/146* (2006.01)
*H04N 5/225* (2006.01)
*H04N 5/365* (2011.01)
*H04N 5/367* (2011.01)
*H04N 13/218* (2018.01)

(52) U.S. Cl.
CPC .. *H01L 27/14627* (2013.01); *H01L 27/14685* (2013.01); *H04N 5/2258* (2013.01); *H04N 13/243* (2018.05); *H01L 27/14621* (2013.01); *H01L 27/14625* (2013.01); *H04N 5/367* (2013.01); *H04N 5/3651* (2013.01); *H04N 5/3656* (2013.01); *H04N 13/218* (2018.05)

(56) References Cited

U.S. PATENT DOCUMENTS

| | | | |
|---|---|---|---|
| 5,777,328 A | * | 7/1998 | Gooch ............... H01L 27/1465 216/2 |
| 5,903,659 A | * | 5/1999 | Kilgore ............... G06T 5/20 250/332 |
| 5,990,481 A | * | 11/1999 | Beratan ............... G01J 5/34 250/338.3 |
| 6,348,951 B1 | | 2/2002 | Kim |
| 6,396,543 B1 | | 5/2002 | Shin et al. |
| 6,424,843 B1 | | 7/2002 | Reitmaa et al. |
| 6,633,231 B1 | | 10/2003 | Okamoto et al. |
| 6,681,120 B1 | | 1/2004 | Kim, II |
| 6,759,949 B2 | | 7/2004 | Miyahara |
| 6,883,054 B2 | | 4/2005 | Yamaguchi et al. |
| 6,911,652 B2 | | 6/2005 | Walkenstein |
| 7,030,378 B2 | * | 4/2006 | Allen ............... G01J 5/06 250/252.1 |
| 7,050,107 B1 | | 5/2006 | Frank et al. |
| D524,785 S | | 7/2006 | Huang |
| 7,084,857 B2 | | 8/2006 | Lieberman et al. |
| 7,208,733 B2 | | 4/2007 | Mian et al. |
| 7,224,382 B2 | | 5/2007 | Baker |
| 7,263,379 B1 | | 8/2007 | Parkulo et al. |
| 7,284,921 B2 | | 10/2007 | Lapstun et al. |
| 7,296,747 B2 | | 11/2007 | Rohs |
| 7,305,368 B2 | | 12/2007 | Lieberman et al. |
| 7,321,783 B2 | | 1/2008 | Kim, II |
| 7,333,832 B2 | | 2/2008 | Tsai et al. |
| 7,377,835 B2 | | 5/2008 | Parkulo et al. |
| 7,420,663 B2 | | 9/2008 | Wang et al. |
| 7,453,064 B2 | | 11/2008 | Lee |
| 7,477,309 B2 | | 1/2009 | Cuccias |
| 7,567,818 B2 | | 7/2009 | Pylkko |
| 7,572,077 B2 | | 8/2009 | Lapstun et al. |
| 7,575,077 B2 | | 8/2009 | Priepke et al. |
| 7,595,904 B2 | | 9/2009 | Lapstun et al. |
| 7,627,364 B2 | | 12/2009 | Sato |
| 7,697,962 B2 | | 4/2010 | Cradick et al. |
| 7,723,686 B2 | | 5/2010 | Hannebauer |
| 7,725,141 B2 | | 5/2010 | Su |
| 7,728,281 B2 | | 6/2010 | Chen |
| 7,735,974 B2 | | 6/2010 | Silverbrook et al. |
| 7,747,454 B2 | | 6/2010 | Bartfeld et al. |
| 7,760,919 B2 | | 7/2010 | Namgoong |
| 7,761,114 B2 | | 7/2010 | Silverbrook et al. |
| 7,773,870 B2 | | 8/2010 | Naruse |
| 7,801,733 B2 | | 9/2010 | Lee et al. |
| 7,810,733 B2 | | 10/2010 | Silverbrook et al. |
| 7,872,574 B2 | | 1/2011 | Betts et al. |
| 7,900,842 B2 | | 3/2011 | Silverbrook et al. |
| 7,903,152 B2 | | 3/2011 | Kim, II |
| 7,928,395 B2 | * | 4/2011 | Grimberg ............... G01J 5/22 250/349 |
| 7,947,222 B2 | | 5/2011 | Bae et al. |
| 7,960,700 B2 | | 6/2011 | Craig et al. |
| 8,193,496 B2 | * | 6/2012 | Furry ............... G01J 5/061 250/330 |
| 8,275,413 B1 | | 9/2012 | Fraden et al. |
| 8,305,577 B2 | | 11/2012 | Kivioja et al. |
| 8,345,226 B2 | | 1/2013 | Zhang |
| 8,537,343 B2 | | 9/2013 | Zhang |
| 8,781,420 B2 | | 7/2014 | Schlub et al. |
| 8,825,112 B1 | | 9/2014 | Fraden et al. |
| 2002/0006337 A1 | | 1/2002 | Kimura et al. |
| 2002/0113196 A1 | * | 8/2002 | Hou ............... H04N 5/37206 250/208.1 |
| 2002/0122036 A1 | | 9/2002 | Sasaki |
| 2002/0135571 A1 | | 9/2002 | Klocek et al. |
| 2002/0140542 A1 | | 10/2002 | Prokoski et al. |
| 2002/0149600 A1 | | 10/2002 | Van Splunter et al. |
| 2003/0007193 A1 | | 1/2003 | Sato et al. |
| 2003/0112871 A1 | | 6/2003 | Demos |
| 2003/0122957 A1 | | 7/2003 | Emme |
| 2003/0223623 A1 | | 12/2003 | Gutta et al. |
| 2004/0047518 A1 | | 3/2004 | Tiana |

(56) References Cited

U.S. PATENT DOCUMENTS

| | | |
|---|---|---|
| 2004/0101298 A1 | 5/2004 | Mandelbaum et al. |
| 2004/0127156 A1 | 7/2004 | Park |
| 2004/0128070 A1 | 7/2004 | Schmidt et al. |
| 2004/0157612 A1 | 8/2004 | Kim, II |
| 2004/0165788 A1 | 8/2004 | Perez et al. |
| 2004/0169860 A1 | 9/2004 | Jung et al. |
| 2004/0207036 A1 | 10/2004 | Ikeda |
| 2004/0256561 A1 | 12/2004 | Beuhler et al. |
| 2005/0030314 A1 | 2/2005 | Dawson |
| 2005/0067852 A1 | 3/2005 | Jeong |
| 2005/0089241 A1 | 4/2005 | Kawanishi et al. |
| 2005/0068333 A1 | 5/2005 | Nakahashi et al. |
| 2005/0093890 A1 | 5/2005 | Baudisch |
| 2005/0110803 A1 | 5/2005 | Sugimura |
| 2005/0138569 A1 | 6/2005 | Baxter et al. |
| 2005/0169655 A1 | 8/2005 | Koyama et al. |
| 2005/0184993 A1 | 8/2005 | Ludwin et al. |
| 2005/0213813 A1 | 9/2005 | Lin et al. |
| 2005/0213853 A1 | 9/2005 | Maier et al. |
| 2005/0219249 A1 | 10/2005 | Xie et al. |
| 2005/0248912 A1 | 11/2005 | Kang et al. |
| 2005/0265688 A1 | 12/2005 | Kobayashi |
| 2005/0270784 A1 | 12/2005 | Hahn et al. |
| 2005/0277447 A1 | 12/2005 | Buil et al. |
| 2006/0039686 A1 | 2/2006 | Soh et al. |
| 2006/0060984 A1 | 3/2006 | Wakabayashi et al. |
| 2006/0077246 A1 | 4/2006 | Kawakami et al. |
| 2006/0097172 A1 | 5/2006 | Park |
| 2006/0120712 A1 | 6/2006 | Kim |
| 2006/0132642 A1 | 6/2006 | Hosaka et al. |
| 2006/0140501 A1 | 6/2006 | Tadas |
| 2006/0147191 A1 | 7/2006 | Kim |
| 2006/0154559 A1 | 7/2006 | Yoshida |
| 2006/0175549 A1* | 8/2006 | Miller ............... G08B 13/19643 250/334 |
| 2006/0210249 A1 | 9/2006 | Seto |
| 2006/0234744 A1 | 10/2006 | Sung et al. |
| 2006/0240867 A1 | 10/2006 | Wang et al. |
| 2006/0279758 A1 | 12/2006 | Myoki |
| 2006/0285907 A1 | 12/2006 | Kang et al. |
| 2007/0004449 A1 | 1/2007 | Sham |
| 2007/0019077 A1 | 1/2007 | Park |
| 2007/0019099 A1 | 1/2007 | Lieberman et al. |
| 2007/0019103 A1 | 1/2007 | Lieberman et al. |
| 2007/0033309 A1 | 2/2007 | Kuwabara et al. |
| 2007/0034800 A1 | 2/2007 | Huang |
| 2007/0052616 A1 | 3/2007 | Yoon |
| 2007/0057764 A1 | 3/2007 | Sato et al. |
| 2007/0103479 A1 | 5/2007 | Kim et al. |
| 2007/0120879 A1 | 5/2007 | Kanade et al. |
| 2007/0132858 A1 | 6/2007 | Chiba et al. |
| 2007/0139739 A1 | 6/2007 | Kim et al. |
| 2007/0159524 A1 | 7/2007 | Kim et al. |
| 2007/0189583 A1 | 8/2007 | Shimada et al. |
| 2007/0211965 A1 | 9/2007 | Heibing et al. |
| 2007/0222798 A1 | 9/2007 | Kuno |
| 2007/0248284 A1 | 10/2007 | Bernsen et al. |
| 2007/0274541 A1 | 11/2007 | Uetake et al. |
| 2007/0285439 A1 | 12/2007 | King et al. |
| 2007/0286517 A1 | 12/2007 | Paik et al. |
| 2007/0299226 A1 | 12/2007 | Park et al. |
| 2008/0038579 A1 | 2/2008 | Schuisky et al. |
| 2008/0056612 A1 | 3/2008 | Park et al. |
| 2008/0079834 A1 | 4/2008 | Chung et al. |
| 2008/0112012 A1 | 5/2008 | Yokoyama et al. |
| 2008/0151056 A1 | 6/2008 | Ahamefula |
| 2008/0165190 A1 | 7/2008 | Min et al. |
| 2008/0165257 A1* | 7/2008 | Boettiger .......... H01L 27/14603 348/222.1 |
| 2008/0165342 A1 | 7/2008 | Yoshida et al. |
| 2008/0170082 A1 | 7/2008 | Kim |
| 2008/0218474 A1 | 9/2008 | Ahn et al. |
| 2008/0248833 A1 | 10/2008 | Silverbrook et al. |
| 2008/0266079 A1 | 10/2008 | Lontka |
| 2008/0278772 A1 | 11/2008 | Silverbrook et al. |
| 2008/0284880 A1 | 11/2008 | Numata |
| 2008/0292144 A1 | 11/2008 | Kim |
| 2008/0297614 A1 | 12/2008 | Lieberman et al. |
| 2009/0023421 A1 | 1/2009 | Parkulo et al. |
| 2009/0027525 A1 | 1/2009 | Lin et al. |
| 2009/0040042 A1 | 2/2009 | Lontka |
| 2009/0040195 A1 | 2/2009 | Njolstad et al. |
| 2009/0052883 A1 | 2/2009 | Lee et al. |
| 2009/0129700 A1 | 5/2009 | Rother et al. |
| 2009/0131104 A1 | 5/2009 | Yoon |
| 2009/0148019 A1 | 6/2009 | Hamada et al. |
| 2009/0213110 A1 | 8/2009 | Kato et al. |
| 2009/0215479 A1 | 8/2009 | Karmarkar |
| 2009/0227287 A1 | 9/2009 | Kotidis |
| 2009/0238238 A1 | 9/2009 | Hollander et al. |
| 2009/0278048 A1 | 11/2009 | Choe et al. |
| 2009/0297062 A1 | 12/2009 | Molne et al. |
| 2010/0066866 A1 | 3/2010 | Lim |
| 2010/0090965 A1 | 4/2010 | Birkler |
| 2010/0090983 A1 | 4/2010 | Challener et al. |
| 2010/0097491 A1* | 4/2010 | Farina .................... H04N 9/045 348/223.1 |
| 2010/0103141 A1 | 4/2010 | Challener et al. |
| 2010/0113068 A1 | 5/2010 | Rothschild |
| 2010/0131268 A1 | 5/2010 | Moeller |
| 2010/0144387 A1 | 6/2010 | Chou |
| 2010/0163730 A1 | 7/2010 | Schmidt et al. |
| 2010/0234067 A1 | 9/2010 | Silverbrook et al. |
| 2010/0245582 A1 | 9/2010 | Harel |
| 2010/0245585 A1 | 9/2010 | Fisher et al. |
| 2010/0245826 A1 | 9/2010 | Lee |
| 2010/0314543 A1 | 12/2010 | Lee et al. |
| 2011/0043486 A1 | 2/2011 | Hagiwara et al. |
| 2011/0063446 A1 | 3/2011 | McMordie et al. |
| 2011/0102599 A1 | 5/2011 | Kwon et al. |
| 2011/0117532 A1 | 5/2011 | Relyea et al. |
| 2011/0121978 A1 | 5/2011 | Schwörer et al. |
| 2011/0122075 A1 | 5/2011 | Seo et al. |
| 2011/0128384 A1 | 6/2011 | Tiscareno et al. |
| 2011/0221599 A1 | 9/2011 | Högasten |
| 2012/0007979 A1* | 1/2012 | Schneider ................ G01J 3/36 348/116 |
| 2012/0007987 A1 | 1/2012 | Gaber |
| 2012/0083314 A1 | 4/2012 | Ng et al. |
| 2012/0184252 A1 | 7/2012 | Hirsch |
| 2012/0267512 A1* | 10/2012 | Ludwig ............. H01L 27/14625 250/208.1 |
| 2012/0273688 A1 | 11/2012 | Tsai et al. |
| 2012/0274814 A1 | 11/2012 | Wajs |
| 2012/0276954 A1 | 11/2012 | Kowalsky |
| 2012/0292518 A1 | 11/2012 | Goldstein |
| 2012/0320086 A1 | 12/2012 | Kasama et al. |
| 2013/0204570 A1 | 8/2013 | Mendelson et al. |
| 2013/0320220 A1 | 12/2013 | Donowsky |

FOREIGN PATENT DOCUMENTS

| | | |
|---|---|---|
| CN | 2899321 | 5/2007 |
| CN | 201203922 | 3/2009 |
| CN | 101635754 | 1/2010 |
| CN | 201481406 | 5/2010 |
| CN | 201550169 | 8/2010 |
| CN | 101859209 | 10/2010 |
| CN | 201628839 | 11/2010 |
| CN | 101945154 | 1/2011 |
| CN | 102045423 | 5/2011 |
| CN | 102045448 | 5/2011 |
| CN | 102055836 | 5/2011 |
| CN | 201869255 | 6/2011 |
| CN | 201897853 | 7/2011 |
| CN | 102178510 | 9/2011 |
| CN | 202261481 | 5/2012 |
| CN | 102880289 | 1/2013 |
| CN | 202998279 | 6/2013 |
| DE | 102006057431 | 6/2008 |
| EP | 2477391 | 7/2012 |
| JP | 1997275518 | 4/1999 |
| JP | 2004048571 | 2/2004 |
| JP | 2006098098 | 4/2006 |

(56) References Cited

FOREIGN PATENT DOCUMENTS

| | | |
|---|---|---|
| JP | 2006105655 | 4/2006 |
| JP | 2007006475 | 1/2007 |
| JP | 2007325842 | 12/2007 |
| JP | 2010181324 | 8/2010 |
| JP | 2012231309 | 11/2012 |
| KR | 20000026757 | 5/2000 |
| KR | 100227582 | 11/2000 |
| KR | 100272582 | 11/2000 |
| KR | 20000073381 | 12/2000 |
| KR | 100285817 | 1/2001 |
| KR | 20010001341 | 1/2001 |
| KR | 20010002462 | 1/2001 |
| KR | 20010010010 | 2/2001 |
| KR | 20010014992 | 2/2001 |
| KR | 20010044756 | 6/2001 |
| KR | 20010050263 | 6/2001 |
| KR | 20010060752 | 7/2001 |
| KR | 20010068202 | 7/2001 |
| KR | 20010070355 | 7/2001 |
| KR | 20010074565 | 8/2001 |
| KR | 20020006967 | 1/2002 |
| KR | 20020044339 | 6/2002 |
| KR | 20020049605 | 6/2002 |
| KR | 20060071220 | 6/2002 |
| KR | 20020061406 | 7/2002 |
| KR | 20020061920 | 7/2002 |
| KR | 20020069690 | 9/2002 |
| KR | 20020078469 | 10/2002 |
| KR | 20020083368 | 11/2002 |
| KR | 20020083961 | 11/2002 |
| KR | 20020085124 | 11/2002 |
| KR | 20020085490 | 11/2002 |
| KR | 20020095752 | 12/2002 |
| KR | 20030000332 | 1/2003 |
| KR | 20030007030 | 1/2003 |
| KR | 20030012444 | 2/2003 |
| KR | 20030016607 | 3/2003 |
| KR | 20030024545 | 3/2003 |
| KR | 20030037101 | 5/2003 |
| KR | 20030051140 | 6/2003 |
| KR | 20030055693 | 7/2003 |
| KR | 20030056667 | 7/2003 |
| KR | 20030067116 | 8/2003 |
| KR | 20030085742 | 11/2003 |
| KR | 20030088968 | 11/2003 |
| KR | 20040001684 | 1/2004 |
| KR | 20040001686 | 1/2004 |
| KR | 20040023826 | 3/2004 |
| KR | 20040027692 | 4/2004 |
| KR | 20040033223 | 4/2004 |
| KR | 20040033532 | 4/2004 |
| KR | 20040033986 | 4/2004 |
| KR | 20040033993 | 4/2004 |
| KR | 20040039868 | 5/2004 |
| KR | 20040040296 | 5/2004 |
| KR | 20040042475 | 5/2004 |
| KR | 20040044624 | 5/2004 |
| KR | 100437890 | 6/2004 |
| KR | 20040054416 | 6/2004 |
| KR | 20040058969 | 7/2004 |
| KR | 20040062802 | 7/2004 |
| KR | 20040064855 | 7/2004 |
| KR | 20040066724 | 7/2004 |
| KR | 20040068864 | 8/2004 |
| KR | 20040070840 | 8/2004 |
| KR | 20040076308 | 9/2004 |
| KR | 20040086994 | 10/2004 |
| KR | 20040102386 | 12/2004 |
| KR | 20050008245 | 1/2005 |
| KR | 20050011313 | 1/2005 |
| KR | 20050012505 | 2/2005 |
| KR | 20050014448 | 2/2005 |
| KR | 20050015293 | 2/2005 |
| KR | 20050015526 | 2/2005 |
| KR | 20050015745 | 2/2005 |
| KR | 20050018370 | 2/2005 |
| KR | 20050023950 | 3/2005 |
| KR | 20050028537 | 3/2005 |
| KR | 20050033308 | 4/2005 |
| KR | 101006660 | 9/2005 |
| KR | 1020050095463 | 9/2005 |
| KR | 100547739 | 1/2006 |
| KR | 20060023957 | 3/2006 |
| KR | 1020060019715 | 3/2006 |
| KR | 100645746 | 5/2006 |
| KR | 20060054877 | 5/2006 |
| KR | 100612890 | 8/2006 |
| KR | 100633792 | 10/2006 |
| KR | 100646966 | 11/2006 |
| KR | 20060119077 | 11/2006 |
| KR | 20060119236 | 11/2006 |
| KR | 20060120318 | 11/2006 |
| KR | 20060121595 | 11/2006 |
| KR | 100660125 | 12/2006 |
| KR | 100663528 | 1/2007 |
| KR | 100672377 | 1/2007 |
| KR | 20070002590 | 1/2007 |
| KR | 20070005263 | 1/2007 |
| KR | 20070005553 | 1/2007 |
| KR | 20070009380 | 1/2007 |
| KR | 100677913 | 2/2007 |
| KR | 100689465 | 3/2007 |
| KR | 20070028201 | 3/2007 |
| KR | 100722974 | 5/2007 |
| KR | 100729813 | 6/2007 |
| KR | 20070067650 | 6/2007 |
| KR | 100743171 | 7/2007 |
| KR | 100743254 | 7/2007 |
| KR | 20070068501 | 7/2007 |
| KR | 20070078477 | 8/2007 |
| KR | 20070082960 | 8/2007 |
| KR | 20070087513 | 8/2007 |
| KR | 20070091486 | 9/2007 |
| KR | 100766953 | 10/2007 |
| KR | 100771364 | 10/2007 |
| KR | 20070104957 | 10/2007 |
| KR | 100777428 | 11/2007 |
| KR | 20070115754 | 12/2007 |
| KR | 20070122344 | 12/2007 |
| KR | 20070122345 | 12/2007 |
| KR | 100802525 | 2/2008 |
| KR | 20080013314 | 2/2008 |
| KR | 20080015099 | 2/2008 |
| KR | 20080015100 | 2/2008 |
| KR | 20080015973 | 2/2008 |
| KR | 20080018407 | 2/2008 |
| KR | 100822053 | 4/2008 |
| KR | 20080045551 | 5/2008 |
| KR | 100841243 | 6/2008 |
| KR | 20080053057 | 6/2008 |
| KR | 20080054596 | 6/2008 |
| KR | 100846192 | 7/2008 |
| KR | 20080059882 | 7/2008 |
| KR | 20080069007 | 7/2008 |
| KR | 100854932 | 8/2008 |
| KR | 20080071070 | 8/2008 |
| KR | 20080078315 | 8/2008 |
| KR | 100866177 | 10/2008 |
| KR | 100866475 | 11/2008 |
| KR | 100866476 | 11/2008 |
| KR | 100866573 | 11/2008 |
| KR | 100870724 | 11/2008 |
| KR | 20080096918 | 11/2008 |
| KR | 20080098409 | 11/2008 |
| KR | 100871916 | 12/2008 |
| KR | 20080112331 | 12/2008 |
| KR | 20090003899 | 1/2009 |
| KR | 20090018486 | 2/2009 |
| KR | 20090020864 | 2/2009 |
| KR | 100888554 | 3/2009 |
| KR | 20090036734 | 4/2009 |
| KR | 100897170 | 5/2009 |
| KR | 20090052526 | 5/2009 |
| KR | 100901784 | 6/2009 |

(56) References Cited

FOREIGN PATENT DOCUMENTS

| | | |
|---|---|---|
| KR | 100903348 | 6/2009 |
| KR | 20090089931 | 8/2009 |
| KR | 100922497 | 10/2009 |
| KR | 20090105424 | 10/2009 |
| KR | 100932752 | 12/2009 |
| KR | 100935495 | 1/2010 |
| KR | 20100006652 | 1/2010 |
| KR | 2010022327 | 3/2010 |
| KR | 20100039170 | 4/2010 |
| KR | 100958030 | 5/2010 |
| KR | 20100059681 | 6/2010 |
| KR | 20100070116 | 6/2010 |
| KR | 20100070119 | 6/2010 |
| KR | 20100072994 | 7/2010 |
| KR | 100977516 | 8/2010 |
| KR | 2010091758 | 8/2010 |
| KR | 20100089125 | 8/2010 |
| KR | 20100090521 | 8/2010 |
| KR | 20100091758 | 8/2010 |
| KR | 20100098958 | 9/2010 |
| KR | 100985816 | 10/2010 |
| KR | 100990904 | 11/2010 |
| KR | 20100123021 | 11/2010 |
| KR | 1006660 | 1/2011 |
| KR | 20110006437 | 1/2011 |
| KR | 20110011264 | 2/2011 |
| KR | 2011019994 | 3/2011 |
| KR | 2011024290 | 3/2011 |
| KR | 101111167 | 4/2011 |
| KR | 1111167 | 2/2012 |
| KR | 1020130142810 | 12/2013 |
| TW | 201116030 | 5/2011 |
| WO | WO 03/093963 | 11/2003 |
| WO | WO 2005/002228 | 1/2005 |
| WO | WO 2005/088846 | 9/2005 |
| WO | WO 2006/112866 | 10/2006 |
| WO | WO 2007/006242 | 1/2007 |
| WO | WO 2009/122114 | 10/2009 |
| WO | WO 2010/005152 | 1/2010 |
| WO | WO 2010/033142 | 3/2010 |

OTHER PUBLICATIONS

Eminoğlu, Selim. Uncooled Infrared focal plane arrays with integrated readout circuitry using MEMS and standard CMOS technologies. Diss. Middle East Technical University, 2003.*

Darpa, "Broad Agency Announcement Low Cost Thermal Imager Manufacturing (LCTI-M)", Microsystems Technology Office, DARPA-BAA-11-27, Jan. 24, 2011. pp. 1-42, Arlington, VA.

* cited by examiner

IMAGER WITH ARRAY OF MULTIPLE INFRARED IMAGING MODULES

CROSS-REFERENCE TO RELATED APPLICATIONS

This application claims the benefit of U.S. Provisional Patent Application No. 61/745,193 filed Dec. 21, 2012 and entitled "IMAGER WITH ARRAY OF MULTIPLE INFRARED IMAGING MODULES" which is hereby incorporated by reference in its entirety.

This application is a continuation-in-part of U.S. patent application Ser. No. 13/043,123 filed Mar. 8, 2011 and entitled "IMAGER WITH MULTIPLE SENSOR ARRAYS", which claims the benefit of U.S. Provisional Patent Application No. 61/312,146 filed Mar. 9, 2010 and entitled "MULTI SPECTRAL MINIATURE SENSOR", all of which are hereby incorporated by reference in their entirety.

This application is a continuation-in-part of U.S. patent application Ser. No. 14/101,245 filed Dec. 9, 2013 and entitled "LOW POWER AND SMALL FORM FACTOR INFRARED IMAGING" which is hereby incorporated by reference in its entirety.

U.S. patent application Ser. No. 14/101,245 is a continuation of International Patent Application No. PCT/US2012/041744 filed Jun. 8, 2012 and entitled "LOW POWER AND SMALL FORM FACTOR INFRARED IMAGING" which is hereby incorporated by reference in its entirety.

International Patent Application No. PCT/US2012/041744 claims the benefit of U.S. Provisional Patent Application No. 61/656,889 filed Jun. 7, 2012 and entitled "LOW POWER AND SMALL FORM FACTOR INFRARED IMAGING" which is hereby incorporated by reference in its entirety.

International Patent Application No. PCT/US2012/041744 claims the benefit of U.S. Provisional Patent Application No. 61/545,056 filed Oct. 7, 2011 and entitled "NON-UNIFORMITY CORRECTION TECHNIQUES FOR INFRARED IMAGING DEVICES" which is hereby incorporated by reference in its entirety.

International Patent Application No. PCT/US2012/041744 claims the benefit of U.S. Provisional Patent Application No. 61/495,873 filed Jun. 10, 2011 and entitled "INFRARED CAMERA PACKAGING SYSTEMS AND METHODS" which is hereby incorporated by reference in its entirety.

International Patent Application No. PCT/US2012/041744 claims the benefit of U.S. Provisional Patent Application No. 61/495,879 filed Jun. 10, 2011 and entitled "INFRARED CAMERA SYSTEM ARCHITECTURES" which is hereby incorporated by reference in its entirety.

International Patent Application No. PCT/US2012/041744 claims the benefit of U.S. Provisional Patent Application No. 61/495,888 filed Jun. 10, 2011 and entitled "INFRARED CAMERA CALIBRATION TECHNIQUES" which is hereby incorporated by reference in its entirety.

This application is a continuation-in-part of U.S. patent application Ser. No. 14/099,818 filed Dec. 6, 2013 and entitled "NON-UNIFORMITY CORRECTION TECHNIQUES FOR INFRARED IMAGING DEVICES" which is hereby incorporated by reference in its entirety.

U.S. patent application Ser. No. 14/099,818 is a continuation of International Patent Application No. PCT/US2012/041749 filed Jun. 8, 2012 and entitled "NON-UNIFORMITY CORRECTION TECHNIQUES FOR INFRARED IMAGING DEVICES" which is hereby incorporated by reference in its entirety.

International Patent Application No. PCT/US2012/041749 claims the benefit of U.S. Provisional Patent Application No. 61/545,056 filed Oct. 7, 2011 and entitled "NON-UNIFORMITY CORRECTION TECHNIQUES FOR INFRARED IMAGING DEVICES" which is hereby incorporated by reference in its entirety.

International Patent Application No. PCT/US2012/041749 claims the benefit of U.S. Provisional Patent Application No. 61/495,873 filed Jun. 10, 2011 and entitled "INFRARED CAMERA PACKAGING SYSTEMS AND METHODS" which is hereby incorporated by reference in its entirety.

International Patent Application No. PCT/US2012/041749 claims the benefit of U.S. Provisional. Patent Application No. 61/495,879 filed Jun. 10, 2011 and entitled "INFRARED CAMERA SYSTEM ARCHITECTURES" which is hereby incorporated by reference in its entirety.

International Patent Application No. PCT/US2012/041749 claims the benefit of U.S. Provisional Patent Application No. 61/495,888 filed Jun. 10, 2011 and entitled "INFRARED CAMERA CALIBRATION TECHNIQUES" which is hereby incorporated by reference in its entirety.

This application is a continuation-in-part of U.S. patent application Ser. No. 14/101,258 filed Dec. 9, 2013 and entitled "INFRARED CAMERA SYSTEM ARCHITECTURES" which is hereby incorporated by reference in its entirety.

U.S. patent application Ser. No. 14/101,258 is a continuation of International Patent Application No. PCT/US2012/041739 filed Jun. 8, 2012 and entitled "INFRARED CAMERA SYSTEM ARCHITECTURES" which is hereby incorporated by reference in its entirety.

International Patent Application No. PCT/US2012/041739 claims the benefit of U.S. Provisional Patent Application No. 61/495,873 filed Jun. 10, 2011 and entitled "INFRARED CAMERA PACKAGING SYSTEMS AND METHODS" which is hereby incorporated by reference in its entirety.

International Patent Application No. PCT/US2012/041739 claims the benefit of U.S. Provisional Patent Application No. 61/495,879 filed Jun. 10, 2011 and entitled "INFRARED CAMERA SYSTEM ARCHITECTURES" which is hereby incorporated by reference in its entirety.

International Patent Application No. PCT/US2012/041739 claims the benefit of U.S. Provisional Patent Application No. 61/495,888 filed Jun. 10, 2011 and entitled "INFRARED CAMERA CALIBRATION TECHNIQUES" which is hereby incorporated by reference in its entirety.

This patent application is a continuation-in-part of U.S. patent application Ser. No. 13/437,645 filed Apr. 2, 2012 and entitled "INFRARED RESOLUTION AND CONTRAST ENHANCEMENT WITH FUSION" which is hereby incorporated by reference in its entirety.

U.S. patent application Ser. No. 13/437,645 is a continuation-in-part of U.S. patent application Ser. No. 13/105,765 filed May 11, 2011 and entitled "INFRARED RESOLUTION AND CONTRAST ENHANCEMENT WITH FUSION" which is hereby incorporated by reference in its entirety.

U.S. patent application Ser. No. 13/437,645 also claims the benefit of U.S. Provisional Patent Application No. 61/473,207 filed Apr. 8, 2011 and entitled "INFRARED RESOLUTION AND CONTRAST ENHANCEMENT WITH FUSION" which is hereby incorporated by reference in its entirety.

U.S. patent application Ser. No. 13/437,645 is also a continuation-in-part of U.S. patent application Ser. No. 12/766,739 filed Apr. 23, 2010 and entitled "INFRARED RESOLUTION AND CONTRAST ENHANCEMENT WITH FUSION" which is hereby incorporated by reference in its entirety.

U.S. patent application Ser. No. 13/105,765 is a continuation of International Patent Application No. PCT/EP2011/056432 filed Apr. 21, 2011 and entitled "INFRARED RESOLUTION AND CONTRAST ENHANCEMENT WITH FUSION" which is hereby incorporated by reference in its entirety.

U.S. patent application Ser. No. 13/105,765 is also a continuation-in-part of U.S. patent application Ser. No. 12/766,739 which is hereby incorporated by reference in its entirety.

International Patent Application No. PCT/EP2011/056432 is a continuation-in-part of U.S. patent application Ser. No. 12/766,739 which is hereby incorporated by reference in its entirety.

International Patent Application No. PCT/EP2011/056432 also claims the benefit of U.S. Provisional Patent Application No. 61/473,207 which is hereby incorporated by reference in its entirety.

This application claims the benefit of U.S. Provisional Patent Application No. 61/748,018 filed Dec. 31, 2012 and entitled "COMPACT MULTI-SPECTRUM IMAGING WITH FUSION" which is hereby incorporated by reference in its entirety.

This application is a continuation-in-part of U.S. patent application Ser. No. 12/477,828 filed Jun. 3, 2009 and entitled "INFRARED CAMERA SYSTEMS AND METHODS FOR DUAL SENSOR APPLICATIONS" which is hereby incorporated by reference in its entirety.

This application claims the benefit of U.S. Provisional Patent Application No. 61/792,582 filed Mar. 15, 2013 and entitled "TIME SPACED INFRARED IMAGE ENHANCEMENT" which is hereby incorporated by reference in its entirety.

This application claims the benefit of U.S. Provisional Patent Application No. 61/793,952 filed Mar. 15, 2013 and entitled "INFRARED IMAGING ENHANCEMENT WITH FUSION" which is hereby incorporated by reference in its entirety.

This application claims the benefit of U.S. Provisional Patent Application No. 61/746,069 filed Dec. 26, 2012 and entitled "TIME SPACED INFRARED IMAGE ENHANCEMENT" which is hereby incorporated by reference in its entirety.

This application claims the benefit of U.S. Provisional Patent Application No. 61/746,074 filed Dec. 26, 2012 and entitled "INFRARED IMAGING ENHANCEMENT WITH FUSION" which is hereby incorporated by reference in its entirety.

TECHNICAL FIELD

One or more embodiments of the invention relate generally to image sensors and more particularly, for example, to devices with multiple sets of image sensors, infrared sensors, and associated optics.

BACKGROUND

There are a wide variety of image detectors, such as visible light image detectors, infrared image detectors, or other types of image detectors that may be used to capture images for storage and display. Recent advances in process technology for focal plane arrays (FPAs) and image processing have led to increased capabilities and sophistication of resulting imaging systems. While these developments may provide improved features and image quality, they often negatively impact the size, weight, and power of associated systems. In particular, single aperture optical systems supporting multispectral imaging are typically complex, heavy, and expensive. In addition, conventional high resolution sensors in the long wave infrared band may require very large apertures.

As an example, thermal cameras are used frequently in military and commercial applications. However, in many circumstances, size and weight limitations may render such thermal cameras unpractical. Cost is also an obstacle for market penetration in many applications. In particular, infrared camera optics often contribute significantly to the total cost and size of such devices. As a result, there is a need for improved image detector implementations that provide high capability without undue impact on size, weight, and power of image detectors or their associated devices.

SUMMARY

In accordance with various embodiments of the present disclosure, an imager array may be provided as part of an imaging system. The imager array may include a plurality of infrared imaging modules. Each infrared imaging module may include a plurality of infrared sensors associated with an optical element. The infrared imaging modules may be oriented, for example, substantially in a plane facing the same direction and configured to detect multiple images from the same scene using the imager array. Such images may be processed in accordance with various techniques to provide images of infrared radiation. In some embodiments, the infrared imaging modules may include filters or lens coatings to selectively detect desired ranges of infrared radiation. Such arrangements of infrared imaging modules in an imager array may be used to advantageous effect in a variety of different applications as described herein.

In accordance with an embodiment of the disclosure, an imaging system includes a system housing and an imager array disposed in the system housing and adapted to image a scene. The imager array may include a plurality of infrared imaging modules. Each infrared imaging module may include a module housing, an optical element fixed relative to the module housing and adapted to receive infrared radiation from the scene, and a plurality of infrared sensors in a focal plane array (FPA) adapted to capture an image of the scene based on the infrared radiation received through the optical element.

In accordance with another embodiment of the disclosure, a method of imaging includes receiving infrared radiation from a scene at an imager array disposed in a system housing of an imaging system. The imager array may include a plurality of infrared imaging modules. Each infrared imaging module may include a module housing, an optical element fixed relative to the module housing and adapted to receive the infrared radiation from the scene, and a plurality of infrared sensors in an FPA adapted to capture an image of the scene based on the infrared radiation received through the optical element. The method may further include capturing a plurality of images of the scene substantially simultaneously using the infrared sensors of the infrared imaging modules.

In accordance with another embodiment of the disclosure, a gas detection system includes an imager array adapted to image a scene, where the imager array may include a plurality of infrared imaging modules. Each infrared imaging module may include a module housing, an optical element fixed relative to the module housing and adapted to receive the infrared radiation from the scene, and a plurality of infrared sensors in an FPA adapted to capture an image of the scene based on the infrared radiation received through the optical element. A first one of the infrared imaging modules may be adapted to capture a first image of a first wavelength range of the infrared radiation, a second one of the infrared imaging module may be adapted to capture a second image of a second wavelength range of the infrared radiation, and the second wavelength range may be a subset of the first wavelength range and substantially correspond to an absorption band of a gas.

In accordance with another embodiment of the disclosure, a method of detecting gas includes receiving infrared radiation from a scene at an imager array, wherein the imager array includes a plurality of infrared imaging modules. Each infrared imaging module may include a module housing, an optical element fixed relative to the module housing and adapted to receive the infrared radiation from the scene, and a plurality of infrared sensors in an FPA adapted to capture an image of the scene based on the infrared radiation received through the optical element. The method may further include capturing a first image of a first wavelength range of the infrared radiation using a first one of the infrared imaging modules, and capturing a second image of a second wavelength range of the infrared radiation using a second one of the infrared imaging modules, where the second wavelength range may be a subset of the first wavelength range and substantially corresponds to an absorption band of a gas.

In accordance with another embodiment of the disclosure, an imager calibration system includes an imager array adapted to image a scene, wherein the imager array includes a plurality of infrared imaging modules. Each infrared imaging modules may include a module housing, an optical element fixed relative to the module housing and adapted to receive the infrared radiation from the scene, a plurality of infrared sensors in an FPA adapted to capture an image of the scene based on the infrared radiation received through the optical element, and a processor. The processor may be adapted to receive a plurality of pixel values associated with the images captured by the infrared sensors of the infrared imaging modules, to map the sensors to a coordinate space, where at least one infrared sensor of each infrared imaging modules is mapped to each coordinate of the coordinate space, and to calculate an offset correction term for each infrared sensor based on the pixel values of all infrared sensors mapped to the same coordinate.

In accordance with another embodiment of the disclosure, a method of calibrating an imaging system includes receiving infrared radiation from a scene at an imager array, where the imager array includes a plurality of infrared imaging modules. Each infrared imaging module may include a module housing, an optical element fixed relative to the module housing and adapted to receive the infrared radiation from the scene, and a plurality of infrared sensors in an FPA adapted to capture an image of the scene based on the infrared radiation received through the optical element. The method may further include receiving a plurality of pixel values associated with the images captured by the infrared sensors of the infrared imaging modules, mapping the infrared sensors to a coordinate space, where at least one infrared sensor of each infrared imaging module is mapped to each coordinate of the coordinate space, and calculating an offset correction term for each infrared sensor based on the pixel values of all infrared sensors mapped to the same coordinate.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

Figure 1:
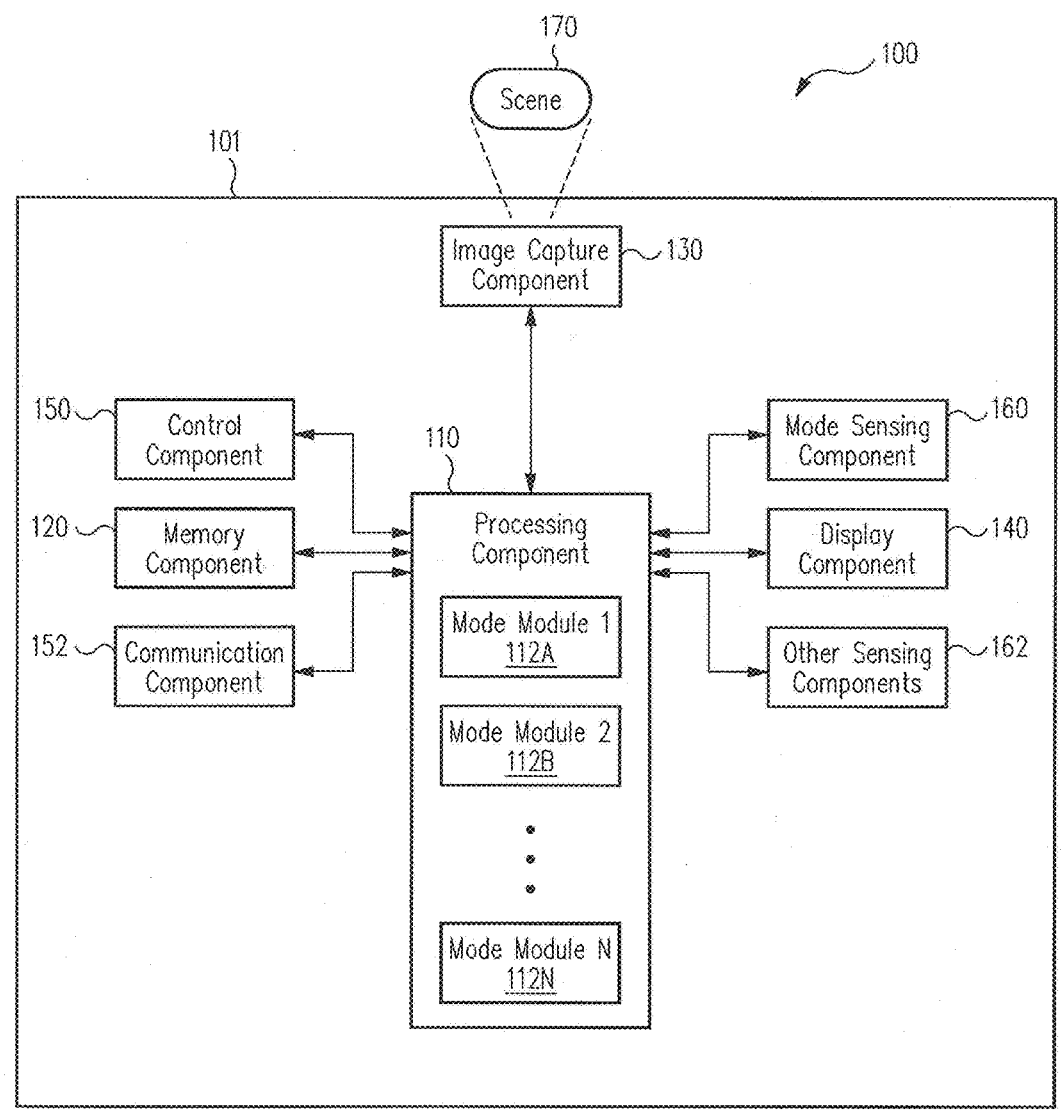
FIG. 1 illustrates a block diagram of an imaging system in accordance with an embodiment of the disclosure.

FIG. 1 illustrates a block diagram of an imaging system 100 in accordance with an embodiment of the disclosure. Imaging system 100 may be used to capture and process images in accordance with various techniques described herein. As shown, various components of imaging system 100 may be provided in a housing 101, such as a housing of a camera or other system. In one embodiment, imaging system 100 includes a processing component 110, a memory component 120, an image capture component 130 (e.g., an imager array including a plurality of sensor arrays), a display component 140, a control component 150, and a mode sensing component 160. In another embodiment, imaging system 100 may also include a communication component 152 and one or more other sensing components 162.

In various embodiments, imaging system 100 may represent an imaging device, such as a camera, to capture images, for example, of a scene 170. Imaging system 100 may represent any type of camera system which, for example, detects electromagnetic radiation and provides representative data (e.g., one or more still images or video images). For example, imaging system 100 may represent a camera that is directed to detect one or more ranges of electromagnetic radiation and provide associated image data. Imaging system 100 may include a portable device and may be implemented, for example, as a handheld device and/or coupled, in other examples, to various types of vehicles (e.g., a land-based vehicle, a watercraft, an aircraft, a spacecraft, or other vehicle) or to various types of fixed locations (e.g., a home security mount, a campsite or outdoors mount, or other location) via one or more types of mounts. In still another example, imaging system 100 may be integrated as part of a non-mobile installation to provide images to be stored and/or displayed.

Processing component 110 includes, in one embodiment, a microprocessor, a single-core processor, a multi-core processor, a microcontroller, a logic device (e.g., a programmable logic device configured to perform processing functions), a digital signal processing (DSP) device, or any other type of generally known processor. Processing component 110 is adapted to interface and communicate with components 120, 130, 140, 150, 160, and 162 to perform method and processing steps as described herein. Processing component 110 may include one or more mode modules 112A-112N for operating in one or more modes of operation (e.g., to operate in accordance with any of the various embodiments disclosed herein). In one aspect, mode modules 112A-112N are adapted to define preset processing and/or display functions that may be embedded in processing component 110 or stored on memory component 120 for access and execution by processing component 110. In another aspect, processing component 110 may be adapted to perform various types of image processing algorithms as described herein.

In various embodiments, it should be appreciated that each mode module 112A-112N may be integrated in software and/or hardware as part of processing component 110, or code (e.g., software or configuration data) for each mode of operation associated with each mode module 112A-112N, which may be stored in memory component 120. Embodiments of mode modules 112A-112N (i.e., modes of operation) disclosed herein may be stored by a separate machine readable medium (e.g., a memory, such as a hard drive, a compact disk, a digital video disk, or a flash memory) to be executed by a computer (e.g., logic or processor-based system) to perform various methods disclosed herein.

In one example, the machine readable medium may be portable and/or located separate from imaging system 100, with stored mode modules 112A-112N provided to imaging system 100 by coupling the machine readable medium to imaging system 100 and/or by imaging system 100 downloading (e.g., via a wired or wireless link) the mode modules 112A-112N from the machine readable medium (e.g., containing the non-transitory information). In various embodiments, as described herein, mode modules 112A-112N provide for improved camera processing techniques for real time applications, wherein a user or operator may change the mode of operation depending on a particular application, such as a off-road application, a maritime application, an aircraft application, a space application, or other application.

Memory component 120 includes, in one embodiment, one or more memory devices to store data and information. The one or more memory devices may include various types of memory including volatile and non-volatile memory devices, such as RAM (Random Access Memory), ROM (Read-Only Memory), EEPROM (Electrically-Erasable Read-Only Memory), flash memory, or other types of memory. In one embodiment, processing component 110 is adapted to execute software stored in memory component 120 to perform various methods, processes, and modes of operations in manner as described herein.

Image capture component 130 includes, in one embodiment, one or more sensors (e.g., any type of detector, such as a focal plane array) for capturing image signals representative of an image, of scene 170. In one embodiment, the sensors of image capture component 130 provide for representing (e.g., converting) a captured image signal of scene 170 as digital data (e.g., via an analog-to-digital converter included as part of the sensor or separate from the sensor as part of imaging system 100). Processing component 110 may be adapted to receive image signals from image capture component 130, process image signals (e.g., to provide processed image data), store image signals or image data in memory component 120, and/or retrieve stored image signals from memory component 120. Processing component 110 may be adapted to process image signals stored in memory component 120 to provide image data (e.g., captured and/or processed image data) to display component 140 for viewing by a user.

Display component 140 includes, in one embodiment, an image display device (e.g., a liquid crystal display (LCD)) or various other types of generally known video displays or monitors. Processing component 110 may be adapted to display image data and information on display component 140. Processing component 110 may be adapted to retrieve image data and information from memory component 120 and display any retrieved image data and information on display component 140. Display component 140 may include display electronics, which may be utilized by processing component 110 to display image data and information. Display component 140 may receive image data and information directly from image capture component 130 via processing component 110, or the image data and information may be transferred from memory component 120 via processing component 110.

In one embodiment, processing component 110 may initially process a captured image and present a processed image in one mode, corresponding to mode modules 112A-112N, and then upon user input to control component 150, processing component 110 may switch the current mode to a different mode for viewing the processed image on display component 140 in the different mode. This switching may be referred to as applying the camera processing techniques of mode modules 112A-112N for real time applications, wherein a user or operator may change the mode while viewing an image on display component 140 based on user input to control component 150. In various aspects, display component 140 may be remotely positioned, and processing component 110 may be adapted to remotely display image data and information on display component 140 via wired or wireless communication with display component 140, as described herein.

Control component 150 includes, in one embodiment, a user input and/or interface device having one or more user actuated components, such as one or more push buttons, slide bars, rotatable knobs or a keyboard, that are adapted to generate one or more user actuated input control signals. Control component 150 may be adapted to be integrated as part of display component 140 to function as both a user input device and a display device, such as, for example, a touch screen device adapted to receive input signals from a user touching different parts of the display screen. Processing component 110 may be adapted to sense control input signals from control component 150 and respond to any sensed control input signals received therefrom.

Control component 150 may include, in one embodiment, a control panel unit (e.g., a wired or wireless handheld control unit) having one or more user-activated mechanisms (e.g., buttons, knobs, sliders, or others) adapted to interface with a user and receive user input control signals. In various embodiments, the one or more user-activated mechanisms of the control panel unit may be utilized to select between the various modes of operation, as described herein in reference to mode modules 112A-112N. In other embodiments, it should be appreciated that the control panel unit may be adapted to include one or more other user-activated mechanisms to provide various other control functions of imaging system 100, such as auto-focus, menu enable and selection, field of view (FoV), brightness, contrast, gain, offset, spatial, temporal, and/or various other features and/or parameters. In still other embodiments, a variable gain signal may be adjusted by the user or operator based on a selected mode of operation.

In another embodiment, control component 150 may include a graphical user interface (GUI), which may be integrated as part of display component 140 (e.g., a user actuated touch screen), having one or more images of the user-activated mechanisms (e.g., buttons, knobs, sliders, or others), which are adapted to interface with a user and receive user input control signals via the display component 140. As an example for one or more embodiments as discussed further herein, display component 140 and control component 150 may represent a smart phone, a tablet, a personal digital assistant (e.g., a wireless, mobile device), a laptop computer, a desktop computer, or other type of device.

Mode sensing component 160 includes, in one embodiment, an application sensor adapted to automatically sense a mode of operation, depending on the sensed application (e.g., intended use or implementation), and provide related information to processing component 110. In various embodiments, the application sensor may include a mechanical triggering mechanism (e.g., a clamp, clip, hook, switch, push-button, or others), an electronic triggering mechanism (e.g., an electronic switch, push-button, electrical signal, electrical connection, or others), an electro-mechanical triggering mechanism, an electro-magnetic triggering mechanism, or some combination thereof. For example for one or more embodiments, mode sensing component 160 senses a mode of operation corresponding to the imaging system's 100 intended application based on the type of mount (e.g., accessory or fixture) to which a user has coupled the imaging system 100 (e.g., image capture component 130). Alternatively, the mode of operation may be provided via control component 150 by a user of imaging system 100 (e.g., wirelessly via display component 140 having a touch screen or other user input representing control component 150).

Furthermore in accordance with one or more embodiments, a default mode of operation may be provided, such as for example when mode sensing component 160 does not sense a particular mode of operation (e.g., no mount sensed or user selection provided). For example, imaging system 100 may be used in a freeform mode (e.g., handheld with no mount) and the default mode of operation may be set to handheld operation, with the images provided wirelessly to a wireless display (e.g., another handheld device with a display, such as a smart phone, or to a vehicle's display).

Mode sensing component 160, in one embodiment, may include a mechanical locking mechanism adapted to secure the imaging system 100 to a vehicle or part thereof and may include a sensor adapted to provide a sensing signal to processing component 110 when the imaging system 100 is mounted and/or secured to the vehicle. Mode sensing component 160, in one embodiment, may be adapted to receive an electrical signal and/or sense an electrical connection type and/or mechanical mount type and provide a sensing signal to processing component 110. Alternatively or in addition, as discussed herein for one or more embodiments, a user may provide a user input via control component 150 (e.g., a wireless touch screen of display component 140) to designate the desired mode (e.g., application) of imaging system 100.

Processing component 110 may be adapted to communicate with mode sensing component 160 (e.g., by receiving sensor information from mode sensing component 160) and image capture component 130 (e.g., by receiving data and information from image capture component 130 and providing and/or receiving command, control, and/or other information to and/or from other components of imaging system 100).

In various embodiments, mode sensing component 160 may be adapted to provide data and information relating to system applications including a handheld implementation and/or coupling implementation associated with various types of vehicles (e.g., a land-based vehicle, a watercraft, an aircraft, a spacecraft, or other vehicle) or stationary applications (e.g., a fixed location, such as on a structure). In one embodiment, mode sensing component 160 may include communication devices that relay information to processing component 110 via wireless communication. For example, mode sensing component 160 may be adapted to receive and/or provide information through a satellite, through a local broadcast transmission (e.g., radio frequency), through a mobile or cellular network and/or through information beacons in an infrastructure (e.g., a transportation or highway information beacon infrastructure) or various other wired or wireless techniques (e.g., using various local area or wide area wireless standards).

In another embodiment, image capturing system 100 may include one or more other types of sensing components 162, including environmental and/or operational sensors, depending on the sensed application or implementation, which provide information to processing component 110 (e.g., by receiving sensor information from each sensing component 162). In various embodiments, other sensing components 162 may be adapted to provide data and information related to environmental conditions, such as internal and/or external temperature conditions, lighting conditions (e.g., day, night, dusk, and/or dawn), humidity levels, specific weather conditions (e.g., sun, rain, and/or snow), distance (e.g., laser rangefinder), and/or whether a tunnel, a covered parking garage, or that some type of enclosure has been entered or exited. Accordingly, other sensing components 160 may include one or more conventional sensors as would be known by those skilled in the art for monitoring various conditions (e.g., environmental conditions) that may have an affect (e.g., on the image appearance) on the data provided by image capture component 130.

In some embodiments, other sensing components 162 may include devices that relay information to processing component 110 via wireless communication. For example, each sensing component 162 may be adapted to receive information from a satellite, through a local broadcast (e.g., radio frequency) transmission, through a mobile or cellular network and/or through information beacons in an infrastructure (e.g., a transportation or highway information beacon infrastructure) or various other wired or wireless techniques.

In various embodiments, components of image capturing system 100 may be combined and/or implemented or not, as desired or depending on application requirements, with image capturing system 100 representing various functional blocks of a system. For example, processing component 110 may be combined with memory component 120, image capture component 130, display component 140, and/or mode sensing component 160. In another example, processing component 110 may be combined with image capture component 130 with only certain functions of processing component 110 performed by circuitry (e.g., a processor, a microprocessor, a microcontroller, a logic device, or other circuitry) within image capture component 130. In still another example, control component 150 may be combined with one or more other components or be remotely connected to at least one other component, such as processing component 110, via a wired or wireless control device so as to provide control signals thereto.

In one embodiment, image capturing system 100, may include a communication component 152, such as a network interface component (NIC) adapted for communication with a network including other devices in the network. In various embodiments, communication component 152 may include a wireless communication component, such as a wireless local area network (WLAN) component based on the IEEE 802.11 standards, a wireless broadband component, mobile cellular component, a wireless satellite component, or various other types of wireless communication components including radio frequency (RF), microwave frequency (MWF), and/or infrared frequency (IRF) components adapted for communication with a network. As such, communication component 152 may include an antenna coupled thereto for wireless communication purposes. In other embodiments, the communication component 152 may be adapted to interface with a DSL (e.g., Digital Subscriber Line) modem, a PSTN (Public Switched Telephone Network) modem, an Ethernet device, and/or various other types of wired and/or wireless network communication devices adapted for communication with a network.

In various embodiments, a network may be implemented as a single network or a combination of multiple networks. For example, in various embodiments, the network may include the Internet and/or one or more intranets, landline networks, wireless networks, and/or other appropriate types of communication networks. In another example, the network may include a wireless telecommunications network (e.g., cellular phone network) adapted to communicate with other communication networks, such as the Internet. As such, in various embodiments, the imaging system 100 may be associated with a particular network link such as for example a URL (Uniform Resource Locator), an IP (Internet Protocol) address, and/or a mobile phone number.

Figure 2A:
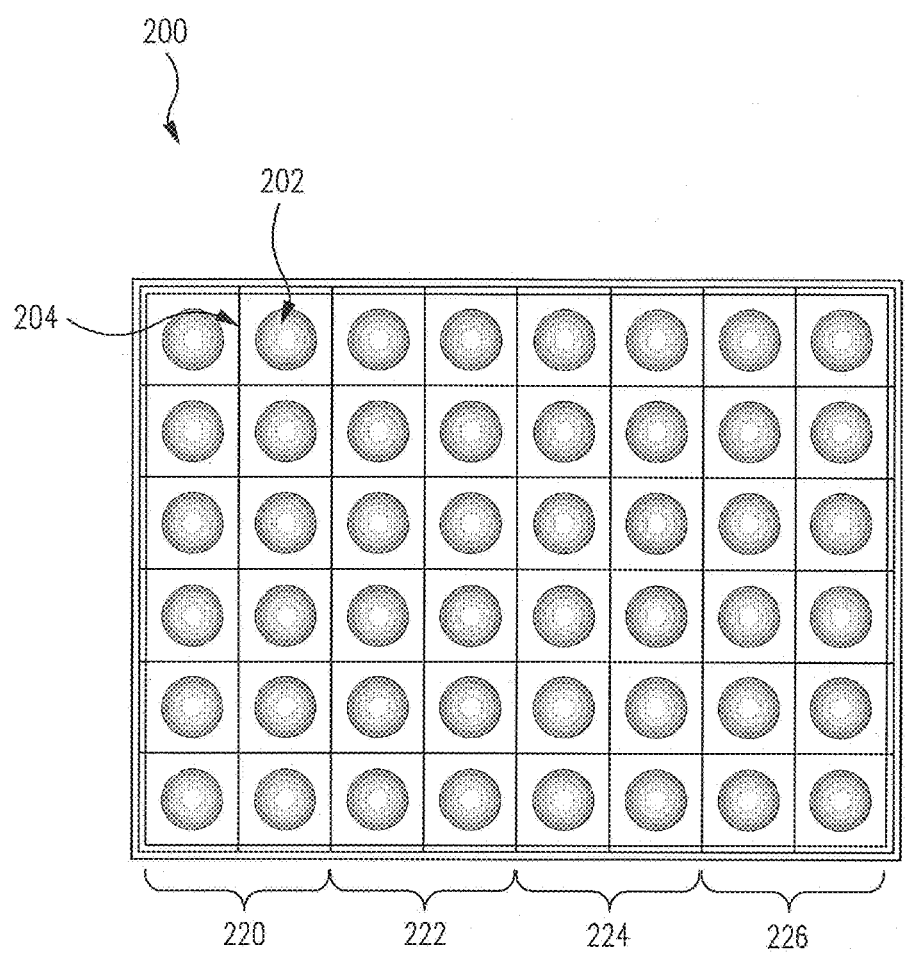
FIGS. 2A-B illustrate several views of an imager array having a plurality of sensor arrays of substantially equal size in accordance with embodiments of the disclosure.
Figure 2B:
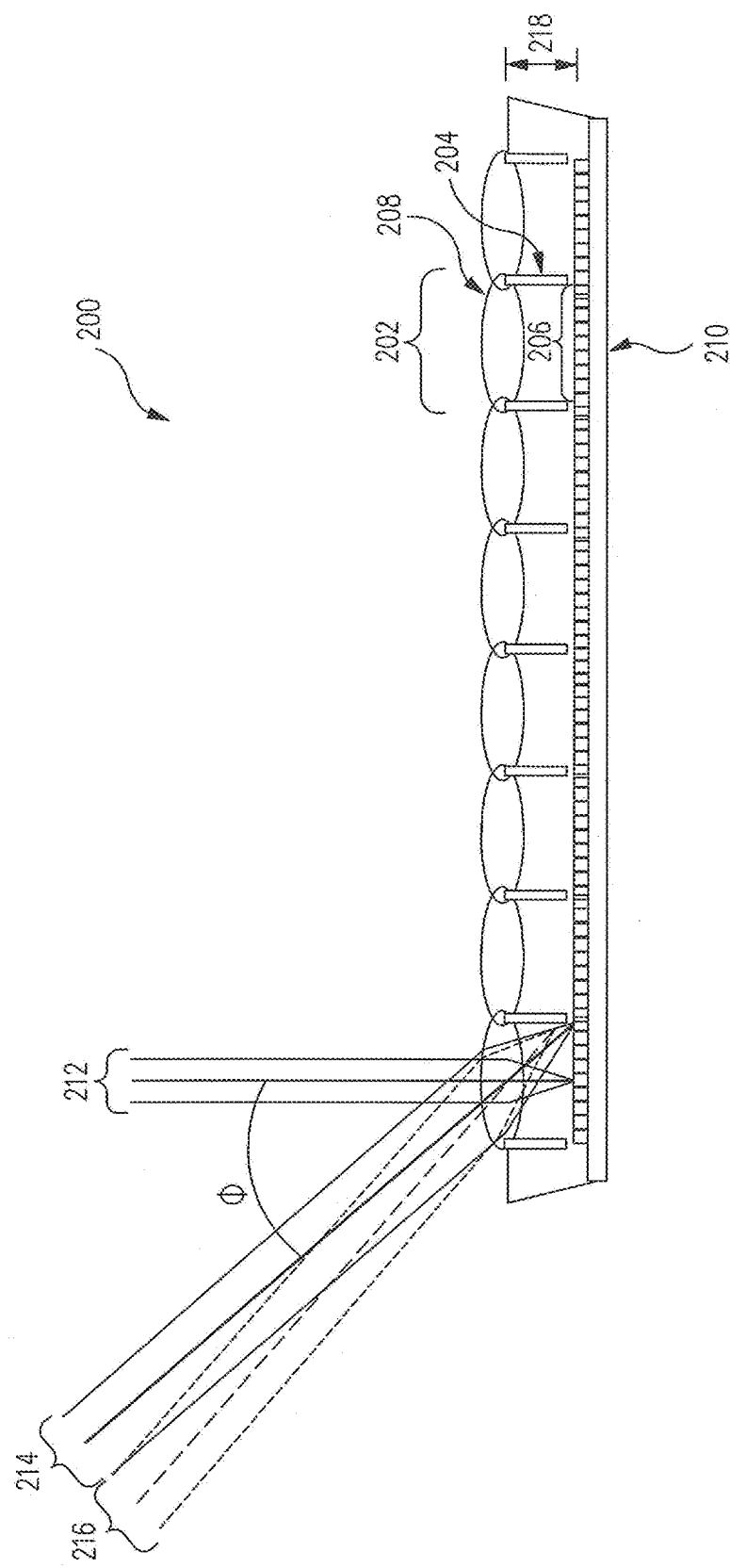

FIGS. 2A-B illustrate several views of an imager array 200 in accordance with embodiments of the disclosure. Imager array 200 may be used, for example, to implement image capture component 130 of imaging system 100.

As shown in the top view of FIG. 2A, imager array 200 may include an array (e.g., 8 by 6 in one embodiment) of sensor arrays 202 (e.g., also referred to as lenslets or optical elements). Although 48 sensor arrays 202 are shown in FIG. 2A, any desired number of sensor arrays 202 may be used in other embodiments. When implemented in imager array 200, sensor arrays 202 may be of substantially equal size.

As shown in the profile view of FIG. 2B, each sensor array 202 may include a plurality of sensors 206 (e.g., also referred to as pixels, elements, and sensor elements) and an associated lens 208. In one embodiment, sensors 206 may be implemented as uncooled microbolometer sensors, InGaAs sensors, or other types of sensors. In one embodiment, different sensor arrays 202 may share a common aperture through the use of a beam splitter. Sensors 206 may be provided, for example, on a base 210. In one embodiment, each sensor array 202 may include an array (e.g., 80 by 80 in one embodiment) of sensors 206. Any desired number of sensors 206 may be used in other embodiments. In one embodiment, all sensors 206 of imager array 200 may collectively provide 640 columns and 480 rows of pixels. In one embodiment, imager array 200 may include one or more read out integrated circuits (ROICs) to provide detected signals for processing and display.

Lenses 208 may be positioned in front of sensors 206 and separated by a distance 218. Lenses 208 may be transmissive with an appropriate refractive index for wavebands (e.g., wavelength ranges) of electromagnetic radiation (e.g., irradiation) to be captured by sensors 206. In one embodiment, lenses 208 may be implemented with optics of F#1. Advantageously, by using a plurality of lenses 208 with imager array 200 (e.g., rather than a single lens for all of imager array 200), the focal length, associated volume of imager array 200, and optics size may permit a camera or other imaging system 100 to be reduced in size (e.g., by an order of magnitude in one embodiment). As a result, imager array 200 may be implemented as a compact, lightweight device in comparison with larger heavier conventional imagers. The small size of imager array 200 may also permit multiple imager arrays 200 to be placed in close proximity to each other if desired.

Sensor arrays 202 may be oriented, for example, substantially in a plane facing the same direction. For distant objects (e.g., greater than 50 m in one embodiment), each sensor array 202 may image the same cone in space, and thus may capture images of the same scene 170 with negligible parallax. Such images may be processed by appropriate components of imaging system 100 in accordance with various techniques to provide images of electromagnetic radiation. In one embodiment, sensor arrays 202 may be placed in close proximity to each other by, for example, side-by-side placement or arranged for per-pixel filtering with associated RGB patterns, or other patterns.

In one embodiment, a high resolution (e.g., super resolved) image may be provided by processing images captured by multiple sensor arrays 202. In this regard, there may be some known phase shift (e.g., a local or global phase shift, by a non-integer number of pixels in some embodiments) between the various sensor arrays 202. In one embodiment, the optical resolution provided by lenses at the chosen aperture (e.g., the diffraction limit) 208 may be higher than the sampling resolution of sensor arrays 202.

In one embodiment, a manufacturing process for sensor arrays 202 may result in random pointing differences for the image cones of sensor arrays 202. In another embodiment, a high precision manufacturing process for sensor arrays 202 may permit exact relative pointing differences to be realized. In either embodiment, the final per pixel phase shift between images (e.g., also referred to as framelets) captured by sensor arrays 202 may be measured by imaging system 100 using appropriate techniques.

By applying different high, low, or bandpass wavelength filters to sensor arrays 202, for example with different coating techniques and/or filters, an effect similar to a Bayer pattern can be achieved. The majority of sensor arrays 202 may be manufactured such that they allow transmission of irradiance over a wide spectral band so that when combined to a single image they achieve the highest spatial resolution for the most irradiance sensitive sensor arrays 202. Bandpass filtered sensor arrays 202 may also be read out at a lower frame rate allowing for longer integration times for narrow wavebands and low irradiance pixels, thus providing high resolution and high sensitivity multispectral imaging (e.g., for mid wave infrared imaging or other wavebands).

Sensors 206 may be separated from each other by a plurality of partitions 204 provided, for example, in grid form. In one embodiment, partitions 204 may be opaque for the effective wavebands of sensors 206. As such, partitions 204 may block electromagnetic radiation outside a desired FoV of sensors 206. In this regard, as shown in FIG. 2B, electromagnetic radiation 212 and 214 passing through an angle Φ (e.g., the half angle of the FoV) may be received by sensors 206, but electromagnetic radiation 216 is blocked by partitions 204 and is not received by sensors 206. The implementation of partitions 204 in this manner may prevent out of field objects from being imaged on adjacent sensor arrays 202. In another embodiment, custom sensors may allow for spatial separation of sensor arrays 202 such that out of field irradiance does not affect the neighboring sensor arrays 202.

Partitions 204 may also provide structural support for lenses 208, especially in embodiments where imager array 200 is implemented as a vacuum package while lenses 208 provide the window for the vacuum package and receive stress associated therewith. In one embodiment, each associated group of sensors 206 and lens 208 in combination with its associated partitions 204 may effectively form a cube-like structure having dimensions of approximately 2 mm by 2 mm by 2 mm.

In one embodiment, imager array 200 may be implemented as a vacuum package with lenses 208 effectively providing both the window for the vacuum package as well as the optics for the entire imaging system 100. As a result, a complete camera or other type of imaging system may be manufactured with fewer production steps and conventional cameras with separate optics. Moreover, the close proximity of lenses 208 to sensors 206 may permit the overall vacuum volume to be kept comparable to conventional uncooled sensors with no need for additional optics.

In various embodiments, sensor arrays 202 may perform multi spectral imaging to selectively detect desired ranges of electromagnetic radiation (e.g., wavebands), such as thermal radiation, long wave infrared (LWIR) radiation, mid wave infrared (MWIR) radiation, short wave infrared (SWIR) radiation, near infrared (NIR) radiation, visible light (VIS), and/or other ranges. In this regard, lenses 208 may include appropriate coatings, or sensor arrays 202 may be provided with appropriate filters, to filter the electromagnetic radiation received by sensors 206. As a result, different sensor arrays 202 may detect different broad or narrow bands of electromagnetic radiation. In one embodiment, at least five spectral bands may be detected (e.g., ranging from visible light to LWIR, or other ranges).

For example, in one embodiment, a group 220 of sensor arrays 202 may include filters to detect red visible light, a group 222 of sensor arrays 202 may include filters to detect green visible light, a group 224 of sensor arrays 202 may include filters to detect blue visible light (e.g., groups 220, 222, and 224 may provide RGB patterns), and a group 226 of sensor arrays 202 may include filters to detect NIR/SWIR radiation (e.g., approximately 700-1700 nm). Other configurations, groupings, and detection ranges may be provided in other embodiments. For example, different sensor arrays 202 may use different types of sensors 206 to detect different wavebands (e.g., InGAs sensors may be used to detect VIS-SWIR wavebands, and bolometer sensors may be used to detect MWIR-LWIR wavebands).

Multi spectral imaging may have dramatic advantages over single waveband imaging, and may be used in a variety of different applications such as geo sensing, target detection, target, classification, and target tracking using multiple sensor arrays 202 for improved capabilities and performance. By processing images from different combinations of wavebands and different phase shifted sensor arrays 202, images may be created that provide reasonable spatial resolution, excellent low light performance, and multi-spectral information about scene 170.

Wavebands from NIR to LWIR may show very different properties and are more or less suited for a specific imaging applications under specific environmental conditions. Factors such as vapor content in atmosphere, particle sizes in dust or aerosols, and scene dynamic range might render a MWIR sensor array useless but have no or only very limited effect on a NIR or LWIR sensor array. In addition, specific materials may have specific spectral signatures. By capturing a scene using multiple wavebands, the response profile can be compared to a database of normalized known spectral responses. As a result, imaging system 100 may attempt to classify the material.

Table 1 identifies various parameters of imaging array 200 in an embodiment configured to operate in the LWIR waveband.

TABLE 1

| Property | Value |
|---|---|
| Imaging array | 48 sensor arrays arranged in 8 by 6 matrix |
| Imaging array size | 16 mm by 12 mm |
| Sensor array | 6400 sensors in 80 by 80 matrix |
| Sensor array size | 2 mm by 2 mm |
| Sensor pitch | 25 μm |
| Focal length | 2.5 mm |
| F-number | 1.25 |
| Normalized wave length | 10 μm |
| Effective FoV | 44° |
| Airy disc diameter | 1.22 pixels (first minima) |

Table 2 identifies various parameters of imaging array 200 in an embodiment configured to operate in the VIS-NIR waveband (e.g., using InGaAs sensors capable of performing extended detection into the visible waveband down to, for example, 350 nm).

TABLE 2

| Property | Value |
|---|---|
| Imaging array | 48 sensor arrays arranged in 8 by 6 matrix |
| Imaging array size | 16 mm by 12 mm |
| Sensor array | 6400 sensors in 80 by 80 matrix |
| Sensor array size | 2 mm by 2 mm |
| Sensor pitch | 25 μm |
| Focal length | 4 mm |
| F-number | 2 |
| Normalized wave length | 1300 nm |
| Effective FoV | 28° |
| Airy disc diameter | 0.25 pixels (first minima) |

In one embodiment, sensor arrays 202 may exhibit reduced size in comparison to many existing imaging devices. For example, the use of filters or lens coatings at each sensor array 202 may permit desired wavebands spectra to be detected without requiring the use of large external optics or filter wheels, thus reducing size.

In one embodiment, individual sensor arrays 202 may be smaller than conventional image sensors. For example, in one example, an array of sensor arrays 202 may exhibit approximately the same surface area as a single conventional sensor array. By providing a lens 208 in each sensor array 202, such a configuration need not be diffraction limited in the manner of conventional high resolution sensors (e.g., greater than 640 by 480 pixel resolution) having small pitch sensor elements (e.g., less than 20 microns) where the spatial resolution of the optics may set the absolute diffraction limit for conventional sensors. In one embodiment, the diffraction limit may be set by the size of aperture.

The various features of imager array 200 may be used in a variety of applications to great advantage. For example, in one embodiment, imager array 200 may be modified to support foveal imaging.

Figure 2C:
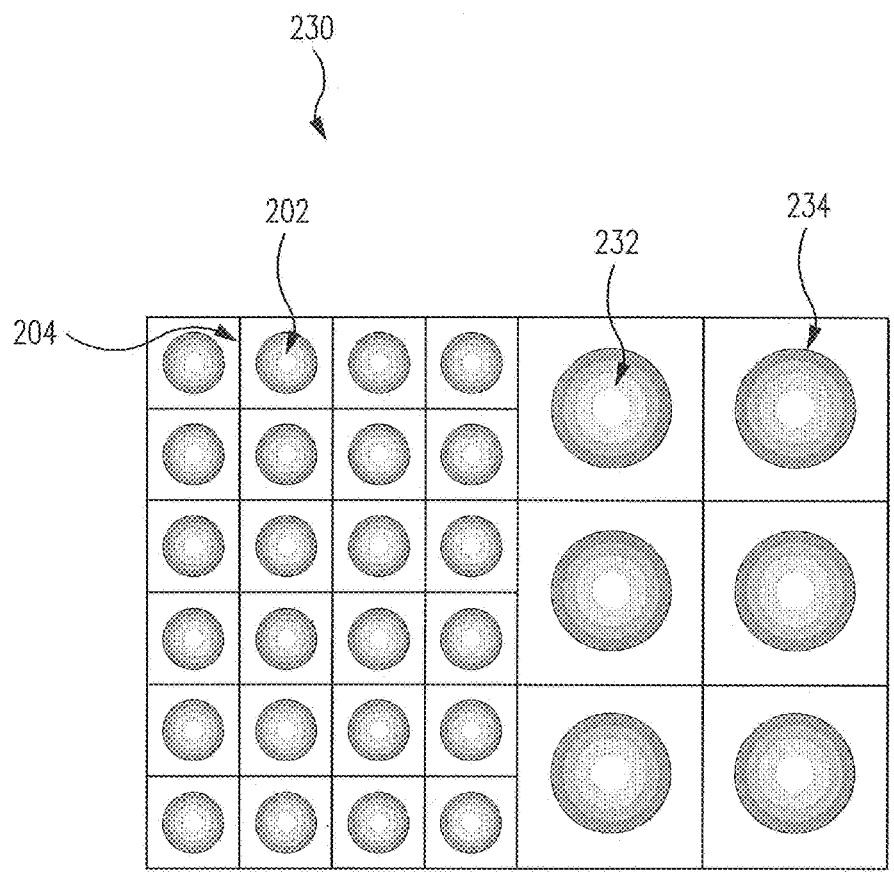
FIGS. 2C-D illustrate several views of an imager array having a plurality of sensor arrays of different sizes in accordance with embodiments of the disclosure.
Figure 2D:
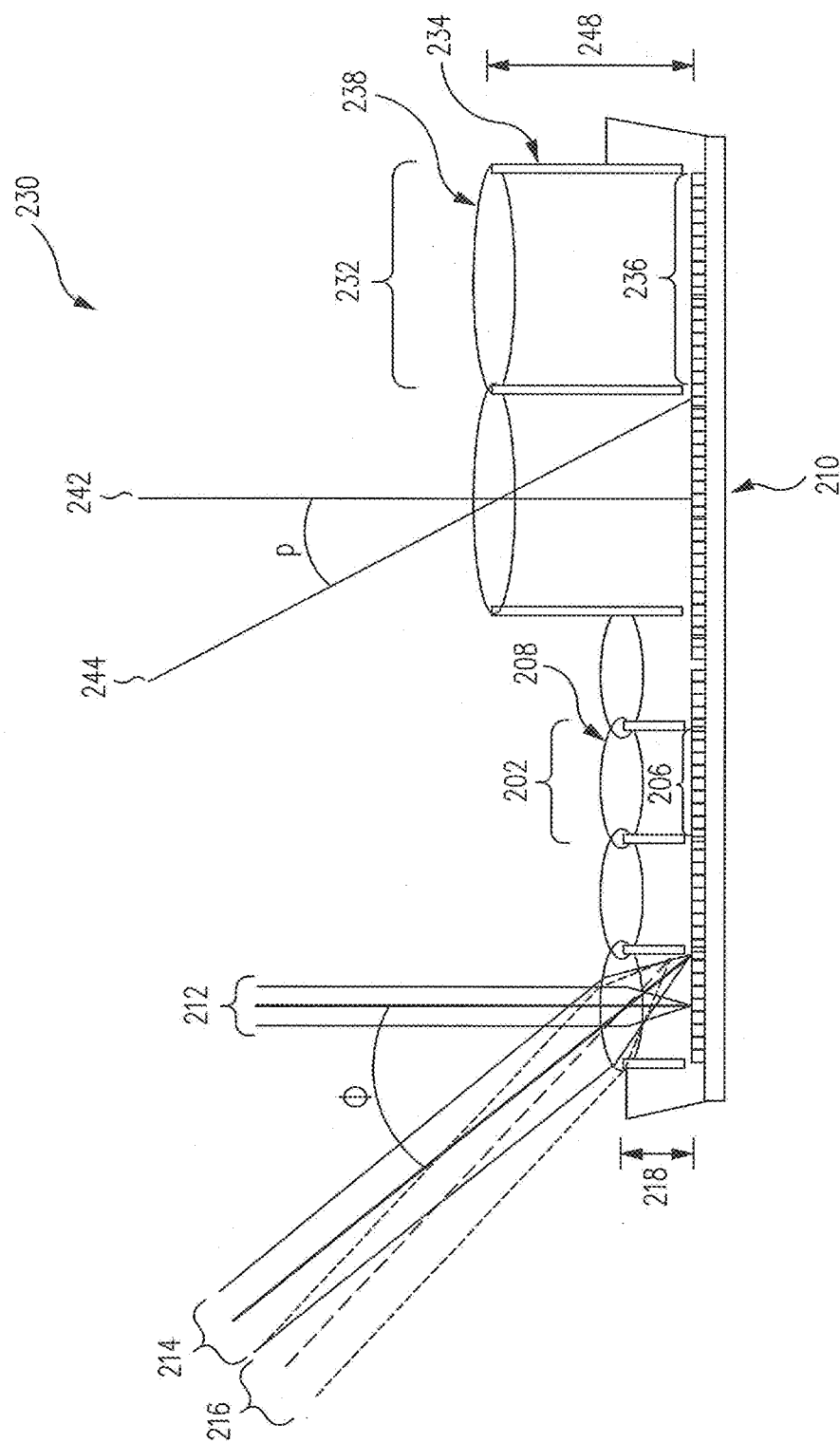

In this regard, FIGS. 2C-D illustrate several views of an imager array 230 in accordance with embodiments of the disclosure. Imager array 230 may be used, for example, to implement image capture component 130 of imaging system 100. Imager array 230 includes a plurality of sensor arrays 202 and 232 of different sizes and having different focal lengths. In this regard, in the higher frequency wavebands (e.g., VIS-SWIR), longer focal lengths may be used without the risk of being distortion limited by optics.

As shown in the top view of FIG. 2C, imager array 230 may include an array (e.g., 4 by 6 in one embodiment) of sensor arrays 202. Although 24 sensor arrays 202 are shown in FIG. 2C, any desired number of sensor arrays 202 may be used in other embodiments.

Imager array 230 may also include an array (e.g., 2 by 3 in one embodiment) of sensor arrays 232. Although 6 sensor arrays 232 are shown in FIG. 2C, any desired number of sensor arrays 232 may be used in other embodiments.

As shown in the profile view of FIG. 2D, each sensor array 232 may include a plurality of sensors 236 (e.g., also referred to as pixels) and an associated lens 238. In one embodiment, each sensor array 232 may include an array of sensors 236. Any desired number of sensors 236 may be used in various embodiments. Lenses 238 may be positioned in front of sensors 236 and separated by a distance 248.

As shown in FIG. 2D, distance 248 may be greater than distance 218. In this regard, sensor arrays 232 may exhibit a greater focal length than sensor arrays 202.

Sensor arrays 202 and 232 may be oriented, for example, substantially in a plane facing the same direction and configured to detect images from scene 170. Such images may be processed by appropriate components of imaging system 100 in accordance with various techniques to provide images of electromagnetic radiation.

Sensors 232 may be separated from each other by a plurality of partitions 234 provided, for example, in grid form. In one embodiment, partitions 234 may block electromagnetic radiation outside a desired FoV of sensors 234. In this regard, as shown in FIG. 2D, electromagnetic radiation 242 and 244 passing through an angle ρ (e.g., the half angle of the FoV) may be received by sensors 236, but electromagnetic radiation outside the FoV is blocked by partitions 234 and is not received by sensors 236.

In various embodiments, sensor arrays 202 and 232 may detect the same or different ranges of electromagnetic radiation. In this regard, lenses 208 and 238 may include the same or different coatings, or sensor arrays 202 and 232 may be provided with the same or different filters, to filter the electromagnetic radiation received by sensors 206 and 236.

As shown in FIG. 2D, sensor arrays 202 may exhibit a wider FoV (e.g., twice as large in one embodiment) than sensor arrays 232. Also, sensor arrays 232 may include a larger number of sensors 236 (e.g., four times as many in one embodiment) than the sensors 206 of sensor arrays 202.

As a result, sensor arrays 202 may capture images having a relatively wide FoV and relatively low resolution (e.g., to capture a low spatial frequency image). Such low resolution images may be provided, for example, to a remote observer as video images over a low bandwidth connection that may not be able to support the bandwidth associated with very high resolution images. In comparison, sensor arrays 232 may capture images having a relatively narrow FoV and relatively high resolution (e.g., to capture a high spatial frequency image). In some embodiments, such configurations permit sensor arrays 232 to receive more irradiance samples for a given FoV than sensor arrays 202. In this regard, sensor arrays 202 and 232 may be used to provide foveal imaging (e.g., to permit a human or machine observer to monitor a wide FoV image of scene 170 and also view a detailed, higher spatial resolution, narrow FoV image within scene 170).

For example, sensor arrays 202 and 232 may be implemented such that their optical centers approximately match each other. Thus, the narrow FoV images provided by sensor arrays 232 may provide a high spatial resolution sampling in the center of wide FoV images provided by sensor arrays 202 having a lower spatial resolution. Such an embodiment may permit foveal imaging in which a wide FoV image is captured (e.g., using sensor arrays 202) while a narrow Fov image is also captured (e.g., using sensor arrays 232) to permit fine spatial details of scene 170 to be resolved if desired.

In one embodiment, multiple sensor arrays 232 may be combined and mapped to provide an even higher spatial resolution grid in the center of the FoV. For example, four sensor arrays 232 may be combined into a single narrow FoV image with a sampling ratio four times higher than one of sensor arrays 232 alone.

Advantageously, the use of imaging array 230 to perform foveal imaging may avoid various limitations associated with conventional foveal imaging techniques including, for example, large aperture optics, high cost of manufacture, complexity (e.g., of multi FoV optics), parallax, or other limitations.

Although various references are made to imager array 200 and sensor arrays 202 in this disclosure with regard to various features, such features may be similarly provided by imager array 230 and sensor arrays 232 where appropriate.

In one embodiment, to minimize size, complexity, power consumption, and cost, sensors 206 may be implemented as uncooled microbolometer sensors for the LWIR waveband. Highpass filtering may be applied to signals provided by such sensors 206 to permit detection in the MWIR waveband for stable targets in scene 170 if used with lenses 208. In one embodiment, a large aperture (e.g., a low F#) may be used to receive sufficient MWIR radiation to perform imaging.

Figure 2E:
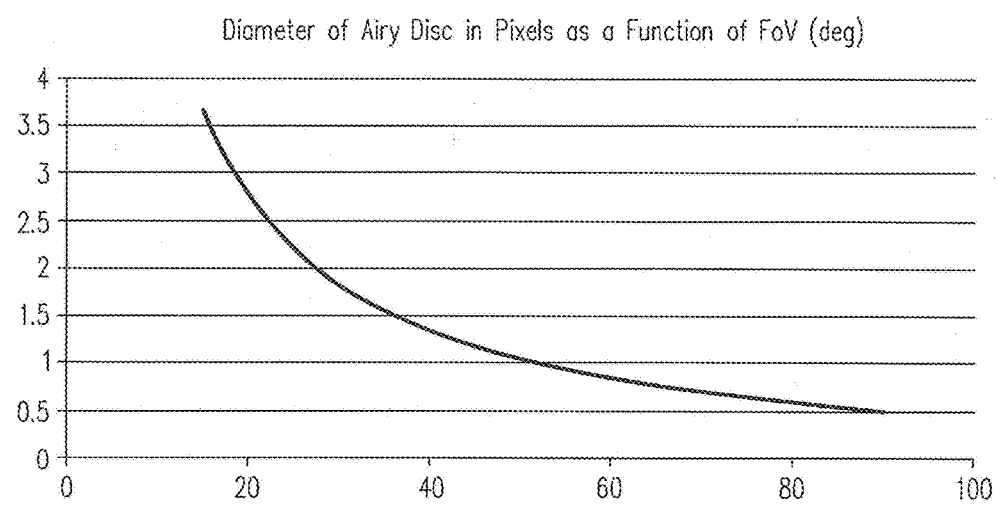
FIGS. 2E-F identify diameters of airy discs as a function of wavelength in accordance with embodiments of the disclosure.

When sensors 206 are implemented as LWIR sensors, the optical design and configuration of sensor arrays 202 may be diffraction limited. For example, FIG. 2E identifies diffraction limits for different fields of view in accordance with an embodiment of the disclosure. In FIG. 2E, sensor array 202 is implemented with an array of 80 by 80 sensors 206 with 25μ pitch as suggested by the diameter of the airy disc first minima. As shown, approximately 50 percent of the energy is contained within a circle half the size of the airy disc. In one embodiment, larger sensors 206 (e.g., pixels) may be desirable for improved sensitivity and may permit sensor arrays 202 exhibit optical resolution higher than sensor resolution (e.g., individual sensors 206 may undersample scene 170).

Figure 2F:
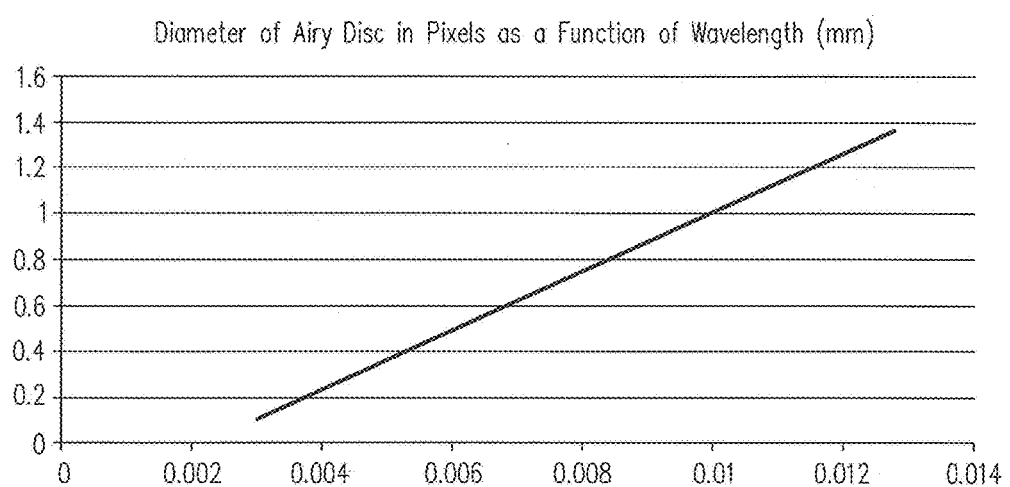

FIG. 2F identifies the size of an airy disc as a function of wavelength in accordance with an embodiment of the disclosure. In FIG. 2F, the size of the airy disc increases linearly with wave length (e.g., for optics with F# approximately equal to 1 and sensors 206 with 25μ pitch).

In another embodiment, imager array 200 may be used to provide images with a high signal to noise ratio (SNR). In this regard, conventional thermal imagers (e.g., particularly uncooled systems using microbolometers) often suffer from high spatial and temporal noise. Such noise may limit an imager's ability to detect small changes in irradiation.

Unfortunately, many conventional approaches to increasing the signal to noise ratio are impractical or overly complex. For example, one parameter that directly affects SNR is the amount of irradiance (e.g., the power of electromagnetic radiation per unit area at a surface) that can be absorbed per time unit. In a conventional microbolometer based imager, the surface area of the sensors may at least partly determine how much irradiance may be collected. However, increasing the size of individual sensors may result in fewer sensors being provided in the same size imager. Such an approach may result in drastically reduced spatial resolution (e.g., due to fewer sensors), reduced reliability (e.g., due to fewer sensors remaining in case of sensor failure), and higher costs (e.g., due to larger optics and the complexity of special sensor geometries).

As another example, larger aperture optics may be used to collect more irradiance per time unit to improve the SNR. However, such an approach may require larger optical elements that add weight and bulk material cost, and may require complicated manufacturing techniques.

As a further example, higher gain signal amplifiers may be used in the analog domain to improve the SNR. However, high gain may be difficult to achieve while still maintaining linearity. In addition, a high gain stage may limit the dynamic range of an imaging system because the limit of the analog to digital (A/D) converters may be reached at lower irradiance levels.

As yet another example, post processing of image data (e.g., the digitized signal) may improve the SNR. However, such processing may introduce unwanted artifacts such as blur, and may not always be able to separate noise from actual scene irradiance.

In contrast to such approaches, imager array 200 may provide improved SNR through the use of multiple sensor arrays 202 imaging approximately the same scene 170. In this regard, signals from multiple sensor arrays 202 may be combined to provide a virtual sensor image with a higher SNR than exhibited by the images provided by individual sensor arrays 202.

Figure 3:
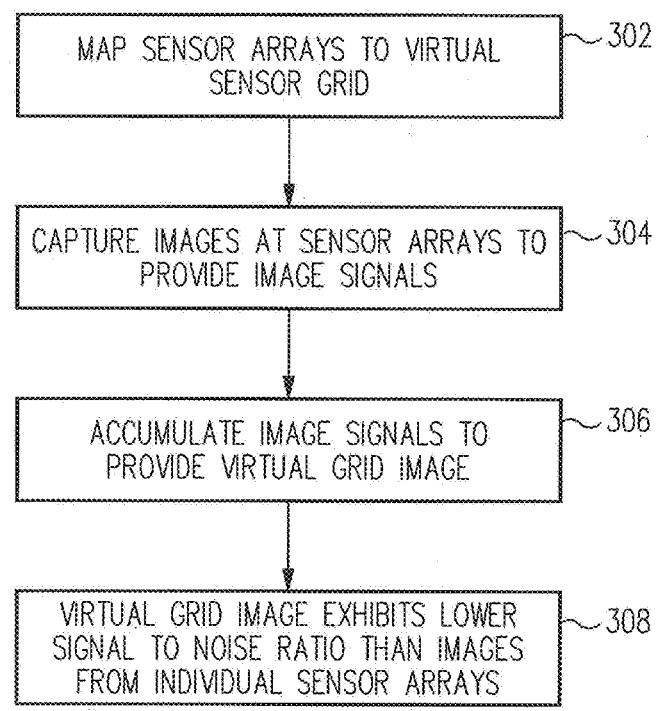
FIG. 3 illustrates a process of obtaining an image having a desirable signal to noise ratio in accordance with an embodiment of the disclosure.

For example, FIG. 3 illustrates a process of obtaining an image having a desirable signal to noise ratio in accordance with an embodiment of the disclosure. In block 302, sensors 206 of multiple sensor arrays 202 may be mapped to a virtual sensor grid (e.g., a set of pixels). Sensor arrays 202 may capture images of scene 170 (block 304).

By lowering the resolution of the virtual sensor grid, an improved SNR may be achieved that is approximately proportional to the amount of cumulative signal mapped to each location in the virtual sensor grid. For example, if the resolution of the virtual sensor grid is one quarter (¼) of the resolution of the entire imager array 200 in both the vertical and horizontal dimensions (e.g., the number of all sensors 206 in all sensor arrays 202 combined), then each pixel of the virtual sensor grid may accumulate signals from multiple sensor elements (block 306). For example, in one embodiment, each virtual sensor grid may accumulate signals from 16 sensor arrays 202). The resulting image (e.g., a result image) associated with the virtual sensor grid may exhibit a higher SNR than images from individual sensor arrays 202 (block 308). In this regard, if random noise has a zero mean, then the noise of the virtual sensor grid (e.g., having a lower resolution) may be one quarter of that of the actual signals from sensor arrays 202 (e.g., noise may be reduced as the square root of the number of samples).

By lowering the spatial and temporal noise in accordance with the process of FIG. 3, the detection range of imager array 200 may be improved. Such improvement may be particularly useful, for example, for surveillance cameras used in applications such as perimeter protection.

Figure 4:
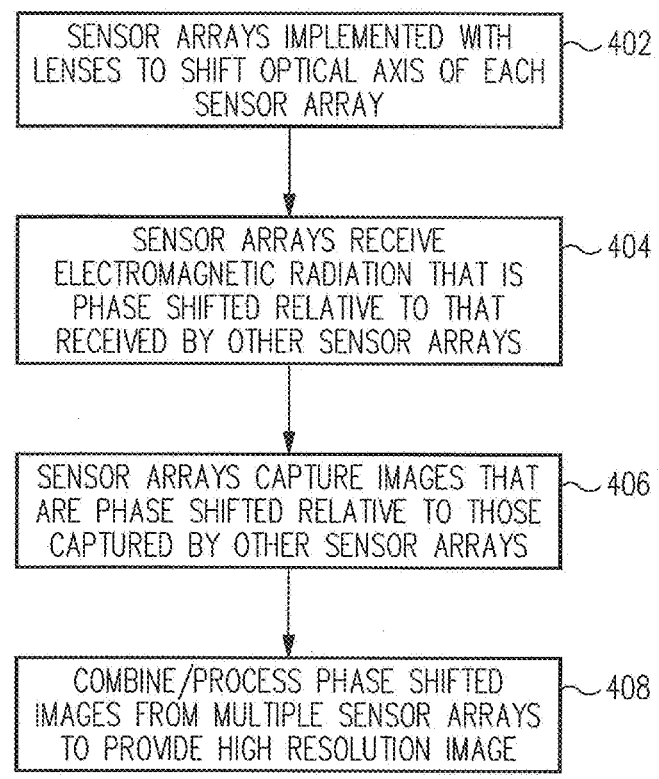
FIG. 4 illustrates a process of obtaining a high resolution image using phase shifts between sensor arrays in accordance with an embodiment of the disclosure.

In another embodiment, imager array 200 may be used to provide high resolution images by taking advantage of predetermined phase shifts between different sensor arrays 202. For example, FIG. 4 illustrates a process of obtaining a high resolution image using phase shifts between sensor arrays 202 in accordance with an embodiment of the disclosure. In one embodiment, the process of FIG. 4 may be implemented using super resolution processing techniques.

Intentional or unintentional production variations of the relative positions of sensors 206 and/or lenses 208 may cause different sensor arrays 202 to capture images from slightly different scenes 170 (e.g., non-identical locations resulting in phase shifts between images from different sensor arrays 202). Super resolution processing techniques may be used to combine phase shifted images from the different sensor arrays 202 into a single, super resolved, image. For example, in one embodiment, such super resolution processing may be used to combine and convert low resolution images of approximately 80 by 80 pixels up to high resolution images of approximately 320 by 240 pixels or close to the diffraction limit of the optics.

For example, in block 402 of FIG. 4, lenses 208 of different sensor arrays 202 may be slightly shifted relative to each other such that the center of the optical axis for each sensor array 202 slightly differs from other sensor arrays 202. In one embodiment, these differences in the optical axis (e.g., horizontal and vertical offsets) may be calibrated, measured, and determined for each sensor array 202 relative to a reference sensor array 200. Such operations may be performed, for example, at the time sensor arrays 202 are manufactured (e.g., thus eliminating the need for complex and error prone real time optical flow calculations). As a result, although sensor arrays 202 may be positioned to face the same scene 170, the electromagnetic radiation received by each sensor array 202 may be phase shifted (e.g., exhibiting a sub pixel phase shift) by a known amount relative to that received by other sensor arrays 202 (block 404). As a result, images captured by each sensor array 202 may be phase shifted relative to the images captured by other sensor arrays 202 (block 406).

Thus, by varying the alignment of the center of the optical axis for each sensor array 202, captured images may exhibit arbitrary sub pixel phase shifts. For distant scenes 170, parallax effects associated with the spatial separation in the image plane may be negligible.

The phase shifted images captured by multiple sensor arrays 202 may be combined and/or otherwise processed to provide a higher resolution image (e.g., a result image) than would otherwise be provided by the images captured by individual sensor arrays 202 (block 408).

Advantageously, by combining phase shifted images (e.g., on a per pixel level in one embodiment), a higher scene sampling rate may be achieved. In one embodiment, the optical resolution provided by lenses 208 may be higher than the sampling resolution of sensors 206. In this case, by combining phase shifted images from multiple sensor arrays 202 and applying an appropriate Wiener filter or other deconvolution method, the resulting image may exhibit a higher resolution (e.g., approximately two to three times higher in one embodiment) than that of images provided by individual sensor arrays 202. In one embodiment, the process of FIG. 4 may be performed automatically.

In one embodiment, the processes of FIGS. 3 and 4 may be combined to permit imaging system 100 to run in several different modes. For example, in one mode, a low resolution image with a low SNR may be provided in accordance with the process of FIG. 3. In another mode, a higher resolution image may be provided in accordance with the process of FIG. 4. In yet another mode, the processes of FIGS. 3 and 4 may be performed simultaneously (e.g., to provide different result images using different processes). Other processes provided in this disclosure may be combined where appropriate as may be desired in particular applications.

In another embodiment, imager array 200 may be used to provide stereo imaging (e.g., stereo vision). For example, FIG. 5 illustrates imager array 200 configured to provide stereo imaging in accordance with an embodiment of the disclosure.

As discussed, in certain embodiments (e.g., for objects at a distance greater than 50 m in one embodiment), parallax caused by the relative spacing between sensor arrays 202 may be negligible. However, in other embodiments, such parallax may be used to provide stereo (e.g., three dimensional and/or depth imaging from a single pair of images captured by any two sensor arrays 202) images of scene 170.

Figure 5:
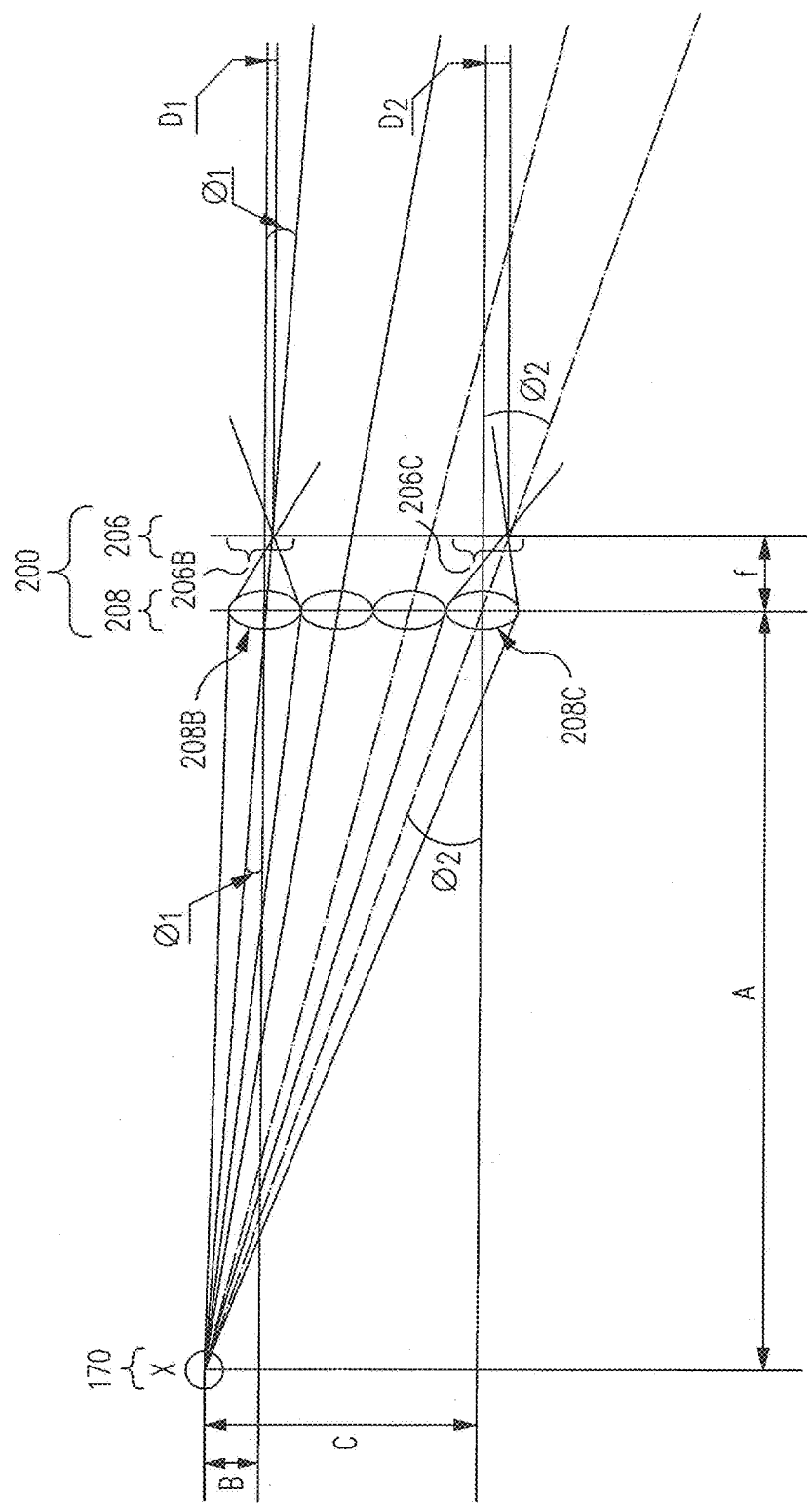
FIG. 5 illustrates an imager array configured to provide stereo imaging in accordance with an embodiment of the disclosure.

For example, in FIG. 5, an object X may be positioned in scene 170 at a short distance A (e.g., less than approximately 5 m in one embodiment) from imager array 200. Object X may be shifted relative to the optical axis of a lens 208B by a distance B, and shifted relative to the optical axis of a lens 208C by a distance C. In the embodiment shown in FIG. 5, lenses 208B and 208C may have a focal length of approximately 2 mm.

As shown in FIG. 5, electromagnetic radiation from object X may be received by lens 208B at an angle Ø1 relative to the optical axis of lens 208B, and received by lens 208C at a different angle Ø2 relative to the optical axis of lens 208C. As a result, when sensors 206B associated with lens 208B capture an image of scene 170, object X may be offset from the center of the image by a distance D1. However, when sensors 206C associated with lens 208C capture an image of scene 170, object X may be offset from the center of the image by a different distance D2.

In one embodiment, the different images provided by sensors 206B and 206C may be used to provide stereo vision, for example, in the form of realtime stereo video images or static stereo images. Such images provide a user with a three dimensional view of object X in scene 170.

Such stereo images may be used in a variety of applications. For example, imager array 200 may be provided in a thermal imaging cube for use in hazardous environments, such as by firefighters or other emergency personnel to provide three dimensional images of a hazardous environment. Such images may be transmitted wirelessly or by wire from the hazardous environment to safe locations for viewing.

In another embodiment, a plurality of sensor arrays 202 may be configured to detect images from electromagnetic radiation received through a plurality of apertures distributed over the outside surface of a device to provide a robust detector that may be thrown or otherwise introduced to a hazardous environment, such a smoke filled space. Such a device may be configured to wirelessly transmit images (e.g., infrared, multi-spectral, or other images) to a non-hazardous location to permit users to safely view the hazardous environment (e.g., in a 360 degree field of view).

In another embodiment, imager array 200 may be used to provide redundant sensor arrays 202 that permit imager array 200 to provide high quality images despite the presence of possible defects in one or more sensors 206. In this regard, modern high spatial resolution imaging devices are expensive, complex devices and may be subject to stringent manufacturing tolerances. Indeed, for many imaging devices, the imager (e.g., detector) may be the single most expensive component. Microbolometer thermal imaging micro-electromechanical systems (MEMS) devices with small dimensions (e.g., small pixel pitch) may have production parameters that are particularly difficult to meet consistently. Such production parameters may include, for example, clean room specifications, production equipment, process repeatability, raw material purity, manual handling of the completed parts, and other parameters. Variations on any of the production parameters may lead to decreased yields (e.g., due to defective devices) which increase the overall cost for each specification-compliant device.

For thermal imaging devices in particular, imperfections in production may result in any number of non operating sensors. For high resolution devices, for example devices with 640 by 480 sensors or more, it may be difficult to produce devices with 100 percent operability (e.g., wherein every pixel operates within specification under all operating conditions).

As a result, producers (e.g., manufacturers) of imaging devices may specify some maximum number of non operating pixels. For example, producers may set the permissible number of defective pixels to 0.1 percent of all pixels, or may limit the number of defective pixels in the center of the images to a small number, but permit larger numbers of defective pixels to be present in peripheral parts of the images. As another example, producers may limit the number of permissible serious defects, such as entirely defective rows or columns. In particular, it may be difficult to replace values from two or more neighboring rows or columns. It is therefore typical for producers to reject or discard devices that include adjacent defective rows or columns or clusters of defective pixels.

Conventional corrective techniques are often ineffective for large clusters of defective pixels. Moreover, it is often impractical to reuse devices with defective pixels in other lower resolution products.

Figure 6A:
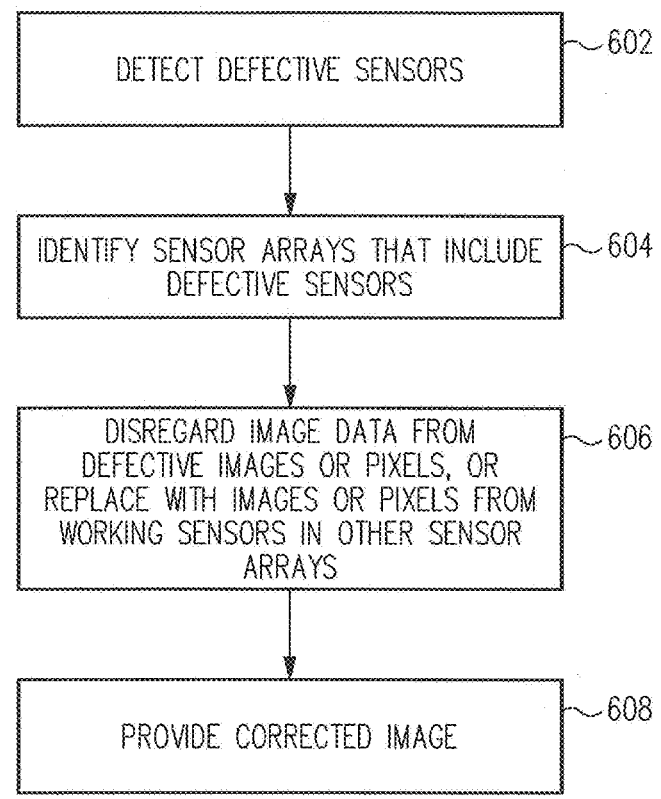
FIG. 6A illustrates a process of correcting defective pixels in an imager array in accordance with an embodiment of the disclosure.

FIG. 6A illustrates a process of correcting defective pixels (e.g., sensors 206) in imager array 200 in accordance with an embodiment of the disclosure. One or more defective sensors 206 may be detected (block 602), and the corresponding sensor arrays 202 of imager array 200 including the defective sensors 206 may be identified (block 604). In various embodiments, such detection and identification may be performed during the manufacture and testing of imager array 200, or during the subsequent operation of imager array 200 in the field.

Figure 6B:
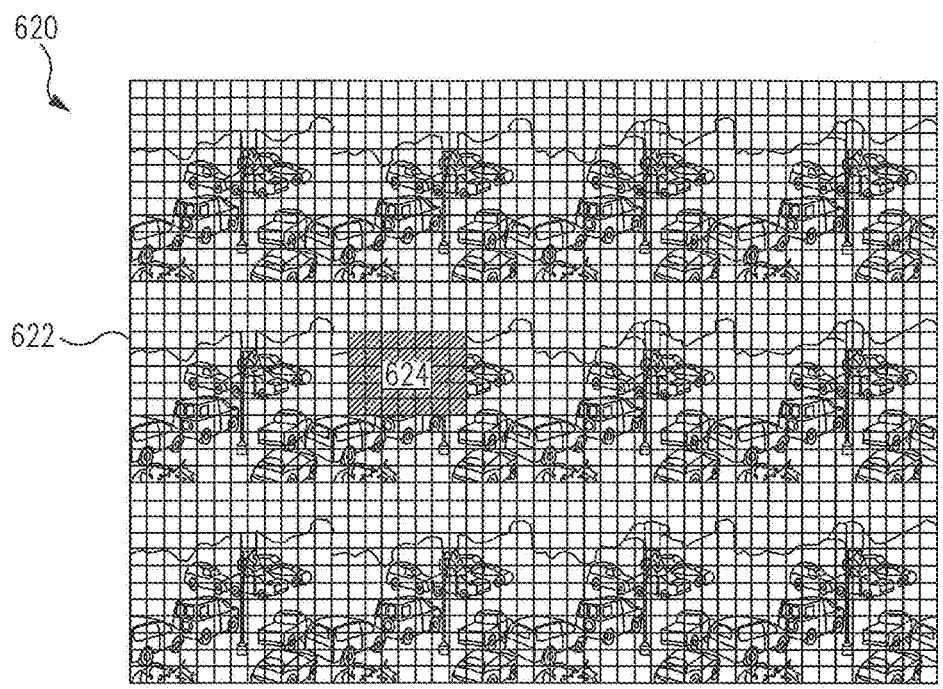
FIGS. 6B-C illustrate images with defective pixels in accordance with embodiments of the disclosure.
Figure 6C:
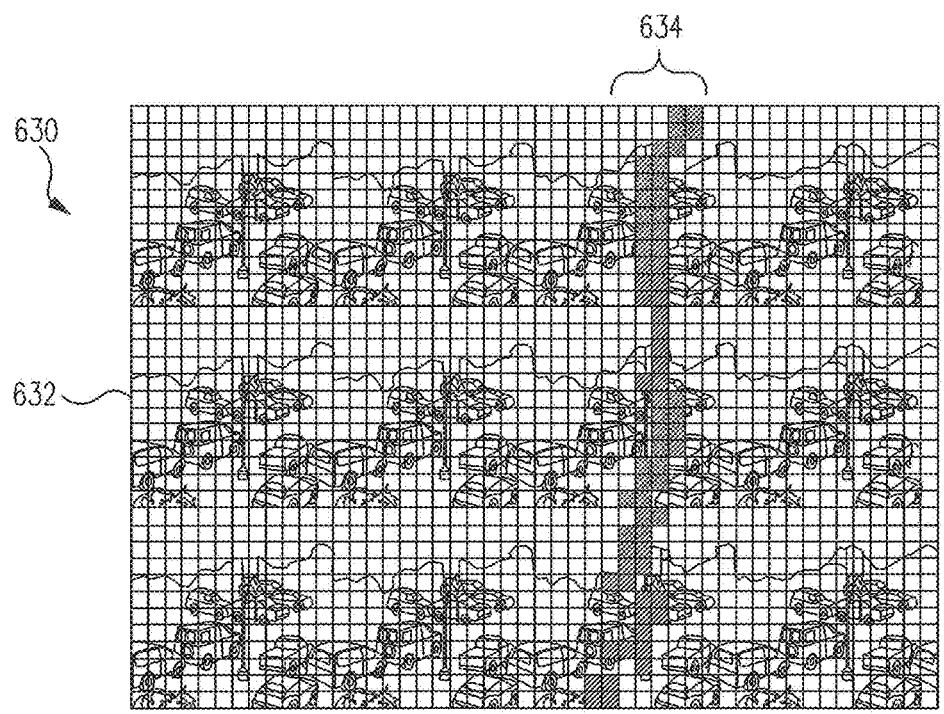

For example, FIGS. 6B and 6C illustrate sets 620 and 630 of various images 622 and 632, respectively, captured by 12 sensor arrays 202 (e.g., a subset of sensor arrays 202). As shown in FIG. 6B, one of images 622 includes a cluster of defective pixels 624 which largely obscure the information shown by the defective image. In this regard, a cluster of sensors 206 in one of sensor arrays 202 are defective and fail to provide useable image data of the captured scene. As also shown in FIG. 6B, the remaining eleven images 622 do not include defective pixels and are provided by sensor arrays 202 with working sensors 206.

In FIG. 6C, three of images 632 include various clusters of defective pixels 634 which span multiple rows and columns, and largely obscure the information shown by the three defective images. As also shown in FIG. 6C, the remaining nine images 632 do not include defective pixels and are provided by sensor arrays 202 with working sensors 206.

Advantageously, sensor arrays 202 may capture at least partially redundant images of the same scene 170. As a result, imaging system 100 may disregard the defective images provided by sensor arrays 202 with defective sensors 206, or correct the defective images or pixels with appropriate image data from working sensors 206 in other sensor arrays 202 (block 606). As a result, imaging system 100 may provide a corrected image (e.g., a result image) that includes all defective pixels filled in with appropriate image data (block 608).

Moreover, in embodiments where different sensor arrays 202 exhibit slightly different optical alignment and local distortion, images provided by different sensor arrays 202 may not be entirely identical. Such differences may permit interpolation techniques to be used to correct the defective image data.

In another embodiment, imager array 200 may be calibrated without the use of a shutter. Infrared cameras in the MWIR and LWIR wavebands are sensitive to thermal radiation. Unlike a visible spectrum camera that may be built such that visible light may only enter through the optics, a thermal camera may generate infrared radiation from sources inside the thermal camera. For example, electronics may generate significant amounts of infrared radiation (e.g., irradiance). Unfortunately, these sources of irradiation that are not from the scene to be imaged may nevertheless be measured by infrared camera sensors (e.g., infrared radiation from a heat source inside the thermal camera may reflect off surfaces inside the imager and end up detected by the infrared camera sensors.

One conventional approach to compensate for such internal infrared radiation in cooled and uncooled thermal imagers is to perform flat field correction (FFC). In this regard, detection of the scene may be temporarily blocked by inserting an opaque object (e.g., a shutter) in the optical path (e.g., assuming that signals measured by the sensors while the optical path is blocked stay constant or nearly constant). By measuring signals detected by the sensors while the optical path is blocked (e.g., fixed pattern noise (FPN)), and subtracting such signals from signals detected while the optical path is not blocked, images may be provided that include only scene information.

Unfortunately, such a conventional approach typically involves the use of a moving shutter which may add complexity and cost to an imaging system, and may compromise reliability. Moreover, calibration performed with a shutter may temporarily render an imaging system blind to the scene. In addition, a single shutter with a constant, uniform temperature does not allow for gain calibration (e.g., offset correction only) which may result in image artifacts, especially for high dynamic range scenes.

Another approach to compensate for such internal infrared radiation is to perform signal processing, such as scene based non uniformity correction (SBNUC) processing that relies on comparisons between two or more video frames. If there is some frame to frame motion, either due to the imager moving relative to the scene or some object in the scene moving, the measured irradiance at one sensor element location may be compared to another sensor element location in another video frame. Under the assumption that the scene irradiance stays constant, it is expected that all sensor elements should measure the same irradiance level for a given point in the scene. If different levels of irradiance are measured, this may be interpreted to be the result of out of field irradiance (e.g., FPN) corrupting the image.

Unfortunately, such SBNUC approaches generally require some frame to frame motion that is known to some degree of accuracy. For example, motion may be image based (e.g., calculated based on the scene information) or non image based (e.g., calculated based on an external motion sensor such as a MEMS gyroscope). Unfortunately, image based motion estimation approaches tend to fail when the scene dynamic range is small and/or the amount of FPN is large (e.g., where the SNR is poor). Non image based motion estimation approaches tend to fail when there is scene deformation or intra scene motion (e.g., a person or car moving relative to the scene).

Imager array 200 may be calibrated using several alternatives to the above approaches. For example, sensor arrays 202 may capture multiple images of the same scene 170 simultaneously, or substantially simultaneously depending on the exact properties of sensors 206 and their associated ROICs.

For example, in an embodiment with 48 sensor arrays 202, 48 images of scene 170 may be captured substantially simultaneously. During optics characterization, it can be exactly determined which sensors 206 in each sensor array 202 correspond to sensors 206 in other sensor arrays 202. The mean or median value of independent signals (e.g., data) detected by the corresponding sensors 206 (e.g., corresponding to a single point in the scene) may be used to correct all the corresponding sensors 206. Such an approach may be used in arbitrarily poor SNR conditions, does not require imager or scene motion, does not require moving parts, and is immune to frame to frame scene deformation. Accordingly, such an approach has clear benefits to conventional approaches for reducing FPN.

Figure 7A:
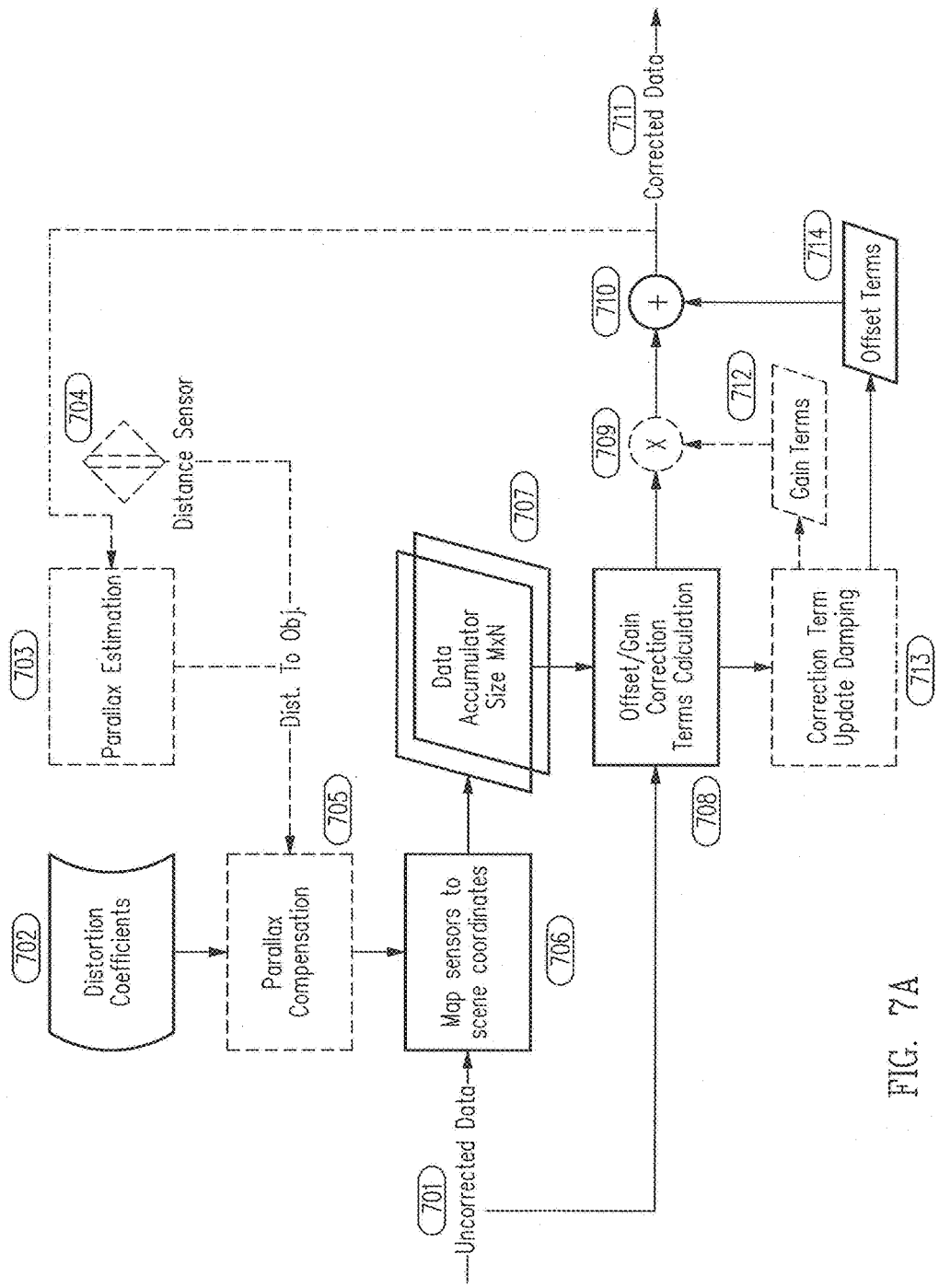
FIGS. 7A-B illustrate processes of calibrating sensors of an imager array in accordance with embodiments of the disclosure.

FIG. 7A illustrates a process of calibrating sensors 206 of imager array 200 in accordance with an embodiment of the disclosure. Advantageously, the process of FIG. 7A may be performed without a moving shutter and without obscuring scene 170 from view by imager array 200. In one embodiment, depending on the repeatability and accuracy of the design, manufacture, and assembly of sensor arrays 202, it may be possible to determine which sensor 206 in one sensor array 202 corresponds to other sensors 206 in other sensor arrays 202 (e.g., corresponding to the same coordinate or pixel of scene 170). However, if some production variation exists, then each sensor array 202 may be tested to determine such correspondence.

In this regard, sensor arrays 202 may be used to image a target (e.g., scene 170) having a known pattern and placed sufficiently far enough away to render any parallax negligible. For example, a collimator may be used to produce a target at infinity.

Individual sensor array 202 distortion coefficients 702 may identify offsets between individual sensors 206 and a global scene coordinate space. In one embodiment, the global scene coordinate space may be divided into discrete scene coordinates (e.g., scene pixels) at a resolution identical to that of individual sensor arrays 202. In one embodiment, the global scene coordinate space may correspond to a master sensor array 202.

Thus, distortion coefficients may be expressed relative to an ideal scene mapping provided by the global scene coordinate space. For example, the distortion coefficients may be expressed as vertical and horizontal offset values relative to the global scene coordinate space. Distortion coefficients 702 may be stored, for example, in a non volatile memory provided on imager array 200 or imaging system 100.

If imager array 200 is intended to be used at sufficiently small object distances such that parallax effects may render distortion coefficients 702 invalid, then uncorrected data 701 or distortion coefficients 702 may be optionally offset by appropriate parallax compensation values in accordance with a parallax compensation process in block 705. In this regard, because the distance between the optical centers of each sensor array 202 may be known, parallax effects may be readily determined in accordance with conventional techniques. Because parallax effects are stronger for closer objects, the parallax compensation process in block 705 may receive measurements or estimates of the distance between imager array 200 and scene 170 from a parallax estimation process in block 703, or from a distance sensor 704 (e.g., a laser range finder).

Alternatively, the parallax estimation process in block 703 may analyze images captured by each sensor array 202 and match common features. For example, conventional corner detection feature extraction processes may be used. As another example, block matching may be used to measure the amount of parallax. If the focal lengths of lenses 208 are known, and the distance between their optical centers is known, then the distance from each sensor array 202 to scene 170 becomes proportional to the parallax.

If multiple features (e.g., corners) are matched, multiple local parallax estimates may be calculated. These estimates may be averaged to provide a more accurate average scene distance, or they may be locally interpolated to provide a local distance map with spatially varying parallax. Observed object shifts due to parallax may be used to modify the distortion coefficients in the parallax compensation process of block 705.

In one embodiment, the parallax compensation process of block 705 may be performed (e.g., using appropriate processing or optics) by mapping images from sensor arrays 202 to locations on a super resolved grid. For example, the amount of parallax associated with a given sensor array 202 may be estimated by measuring the positions of visible non-occluded objects in scene 170 in all sensor arrays 202, or by using an appropriate external distance measuring device.

In block 706, uncorrected data 701 (e.g., signals, samples, or data values, such as pixel values) captured by each sensor 206 of sensor arrays 202 may be mapped, for example using a forward transform, to the global scene coordinate space by applying distortion coefficients 702 (e.g., optionally further offset for parallax compensation). In one embodiment, each sensor 206 (e.g., and its corresponding pixel) of each sensor array 202 may be mapped to a corresponding coordinate of the scene coordinate space, for example, by selecting a scene coordinate having a center that closest matches the center of the corresponding sensor 206. Appropriate interpolation techniques (e.g., using nearest neighbor approximations or other techniques) may also be used to map each sensor 206 to a corresponding scene coordinate (e.g., if a precise integer match is not available).

For each scene coordinate, sampled values (e.g., detected data) may be accumulated from one corresponding sensor 206 of each sensor array 202 to provide an accumulated value for each scene coordinate (block 707). For example, in one embodiment, 48 sensor arrays 202 may be provided. Accordingly, 48 sampled values (e.g., each value being provided by a corresponding sensor 206 in each of sensor arrays 202) may be accumulated for each scene coordinate.

In one embodiment, some sensors 206 of some sensor arrays 202 may not be mapped to scene coordinates because local distortion may be such that a particular sensor 206 images a location that is not part of a common FoV for the collective set of sensor arrays 202.

In one embodiment, a reference (e.g., "correct") scene irradiance (e.g., data value) may be determined for each scene coordinate and may be the mean of the sampled values (e.g., sampled irradiance levels) detected by the corresponding sensors 206 of sensor arrays 202. For example, the mean may be calculated for a scene coordinate by dividing the accumulated value for the scene coordinate by the number of sensors 206 mapped to the scene coordinate. To prevent overwriting the accumulated values when sampled values for the next image frame is available, two accumulators may be used in block 707, with one accumulator being written while the other accumulator is used to calculate offset correction terms (e.g., values) in block 708 as will be described.

In block 708, offset correction terms (e.g., values) may be calculated for all sensors 206. For example, if there are M×N sensor arrays 202, and each sensor array 202 has R×C sensors 206, then there may be a total of M×N×R×C offset correction terms.

In one embodiment, the offset correction term for a particular sensor 206 may be calculated by taking the difference between: the mean of the sampled values for the scene coordinate corresponding to the particular sensor 206; and the actual sampled value detected by the particular sensor 206. The offset correction terms may be stored in an offset correction term map (block 714).

Also in block 708, a set of gain correction terms may be determined. For example, one set (e.g., an image frame) of uncorrected data values captured at a time T0 may be stored and compared to another set captured at a time T1.

For any sensor 206, if the difference in the data values captured at times T0 and T1 is significantly larger than the expected noise, then it may be determined that the irradiance has increased or decreased. This difference may be independent of any offset error.

By comparing these differences for all sensors 206 measuring irradiance from the same location in scene 170 (e.g., all sensors corresponding to the same scene coordinate), a gain term may be determined for each sensor 206 to cause the relative responsivity of sensors 206 to be normalized (e.g., made equal) to each other (e.g., assuming that the FPN has not changed significantly between times T0 and T1). The gain terms may be stored in block 712.

For example, a mean V0 of sampled sensor values for a scene coordinate at time T0 may be calculated and stored in a memory. At later time T1, a mean V1 may be calculated and stored for the same scene coordinate exhibiting a change in irradiance. The scene coordinate may be mapped to a corresponding sensor 206 of each sensor array 202 (e.g., using inverse distortion coefficients further described herein). If a precise mapping is not available, a nearest neighbor sensor 206 may be chosen, or appropriate interpolation techniques may be used.

A difference D between the mean values (D=V1−V0) may represent the mean response to the change in irradiance in scene 170. If v0 and v1 represent the irradiance measured by a particular sensor 206 in a particular sensor array 202, then a difference d may represent the response of the particular sensor 206 (d=v0−v1) to the change in irradiance in scene 170. Accordingly, the gain correction term for the particular sensor may be D/d. For example, if D=10 and d=20, then the individual sensor 206 may be twice as responsive as the mean of all corresponding sensors 206, and the gain of the individual sensor 206 may therefore be adjusted by a gain term of 0.5 to normalize its response.

In one embodiment, the process of FIG. 7A may be performed iteratively such that offset correction terms 714 may be repeatedly updated. In this regard, an optional damping process (block 713) may be used to damp the rate of change of the offset correction terms by calculating a damped offset term using a weighted average of a previously stored offset correction term and a newly calculated offset correction term. In this regard, offset correction terms and gain correction terms may be damped using the process of block 713, thus reducing the effects of dramatic sample value differences in scene 170 with very strong gradients due to, for example, imperfectly modeled distortion effects on a coarse-grained sensor array 202.

As shown in FIG. 7A, gain terms 712 may be applied to uncorrected data 701 in block 709. Offset correction terms 714 may be applied to the gain-adjusted uncorrected data 701 (block 710) to provide corrected data 711. Corrected data 711 may also be used by the parallax estimation process in block 703.

Figure 7B:
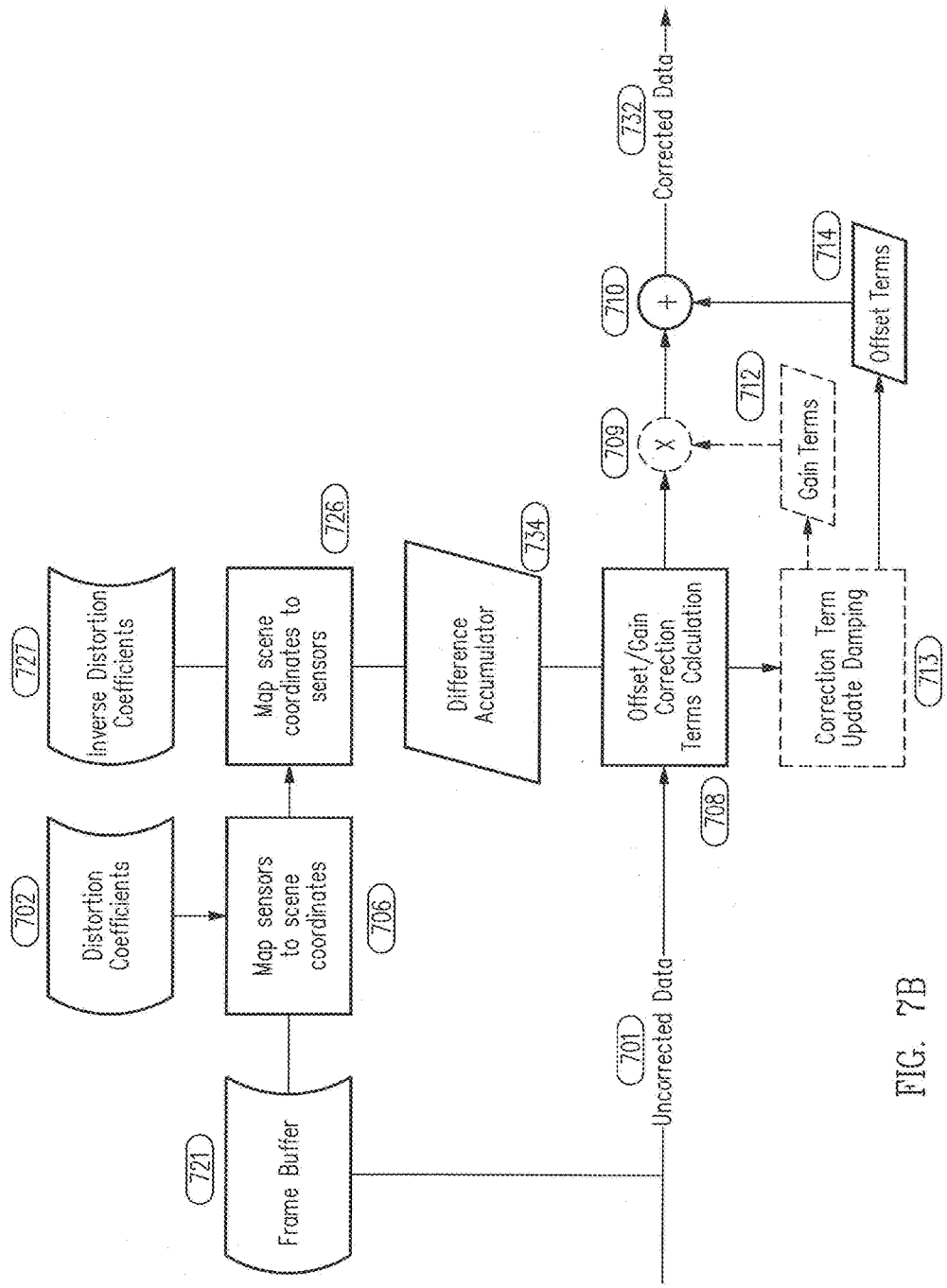

In one embodiment, the process of FIG. 7A may be a nearest neighbor approximation of a more general process identified in FIG. 7B. In this regard, FIG. 7B illustrates another process of calibrating sensors 206 of imager array 200 in accordance with an embodiment of the disclosure. Similar to FIG. 7A, the process of FIG. 7B may also be performed without a moving shutter and without obscuring scene 170 from view of imager array 200.

In the process of FIG. 7B, data values detected by sensors 206 of each sensor array 202 may be compared to one or more data values detected by sensors 206 of other sensor arrays 202 corresponding to the same location in scene 170. Differences between the data values may be accumulated to provide offset correction terms. In one embodiment, the data values of the sensors 206 of other sensor arrays 202 may be determined by performing an interpolation between some number of closest neighbor sensors 206.

Uncorrected data 701 may be provided to a frame buffer (block 721) and passed to block 706 where uncorrected data 701 may be mapped using distortion coefficients 702 in the manner previously described with regard to FIG. 7A. As such, each sensor 206 of each sensor array 202 may be mapped to a corresponding scene coordinate using distortion coefficients 702.

In addition, each scene coordinate may be mapped (e.g., also referred to as a reverse transform) to a corresponding sensor 206 in each of the sensor arrays 202 using inverse distortion coefficients 727 (e.g., also referred to as reverse distortion coefficients). For example, in one embodiment, each scene coordinate may be mapped to 48 different individual sensors 206 in 48 respective sensor arrays 202. Therefore, in this embodiment, 48 sets of inverse distortion coefficients 727 may be provided for each scene coordinate (e.g., with each set including a horizontal coefficient and a vertical coefficient) to map each scene coordinate to corresponding sensors 206 (block 726).

Appropriate interpolation techniques (e.g., using a linear combination of multiple nearest neighbors or other techniques) may also be used to map a scene coordinate to a corresponding sensor 206 in each sensor array 202 (e.g., if a precise integer match is not available) and to determine the sample value associated with the corresponding sensor 206. For example, each sensor 206 of a given sensor array 202 may be mapped to locations (e.g., corresponding sensors 206) of other sensor arrays 202 by, for example, bilinear interpolation of the four nearest inverse distortion coefficients 727.

Because the distortion (e.g., offsets) between sensors 206 relative to other sensors 206 of other sensor arrays 202 is constant, the mapping from a first sensor 206 in a first sensor array 202 to other corresponding sensors 206 in other sensor arrays 202 (e.g., using distortion coefficients 702 to map the first sensor 206 to a scene coordinate, and using inverse distortion coefficients 727 to map the scene coordinate the corresponding sensors 206 of other sensor arrays 202) may be pre calculated and stored, for example, in a table for each sensor 206. Thus, using the mapping determined in block 726, each sensor 206 of each sensor array 202 may be mapped to corresponding sensors 206 of the other sensor arrays 202.

In block 734, the sampled value of each sensor 206 may be compared with the sampled values of all other mapped corresponding sensors 206. Differences between the sampled value of each sensor 206 and the sampled values of its corresponding mapped sensors 206 may be accumulated (block 734). The accumulated differences may be used to calculate offset correction terms in block 708 in the manner described in FIG. 7A.

As shown in FIG. 7B, additional processing may be performed in blocks 708, 709, 710, 712, 713, and 714 as described in FIG. 7A to provide corrected data 732. In various embodiments, the processing of FIGS. 7A and 7B may be performed automatically.

In another embodiment, imager array 200 may be used to perform gas detection. Many gases are transparent in visible light. Some of these transparent gases may be directly harmful to humans or may have short or long term negative impacts on the environment. It is therefore important to detect emissions of such gases.

However, conventional multispectral systems used for gas detection are often complex and expensive. They often require multiple detectors arranged in complex systems with mirrors and filters that may be large in size, heavy, and sensitive to shock and vibration. Moreover, human-portable multispectral systems are also usually limited in the number of simultaneously detectable wavebands.

Various conventional gas emission detection techniques exist. For example, in one approach, the pressure of a system containing gas can be measured, and gas leakage may be detected by a decrease in pressure. However, such an approach may only work well if the pressure is kept constant and the gas leakage is significant, as it may be difficult to determine whether pressure changes are due to gas leaks, normal operation, or environmental changes such as temperature increases. Moreover, if the system containing the gas is large (e.g., a long pipe), it may also be difficult to locate the exact position of the leak.

For some gases, sensors may be used to detect the presence of the gas, such as conventional "sniffers" used to detect propane or natural gas leaks. However, such sensors are generally unsuitable for remote monitoring, as they typically must be in direct contact with the detected gas.

Figure 8A:
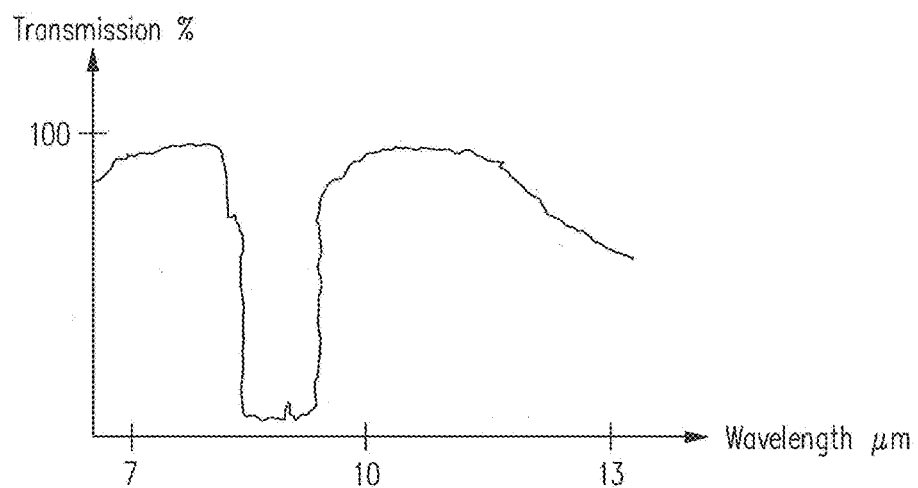
FIG. 8A illustrates transmission as a function of wavelength for a gas that may be detected by an imager array in accordance with an embodiment of the disclosure.
Figure 8B:
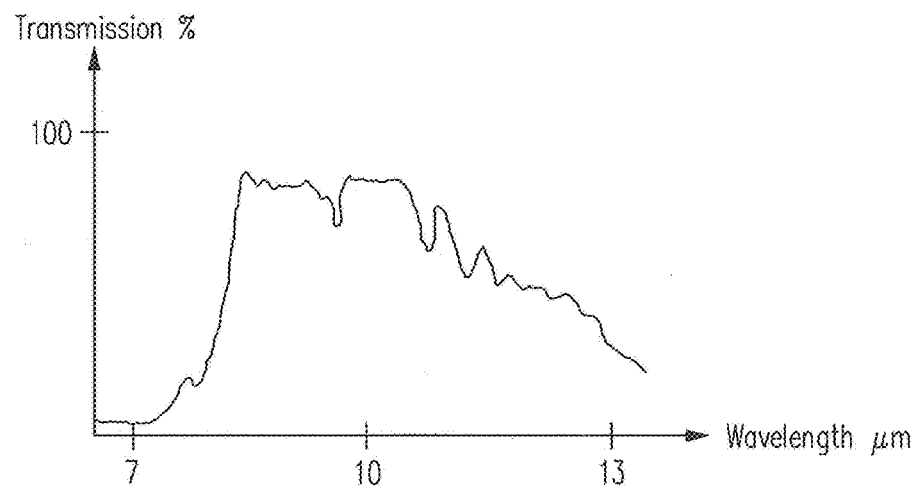
FIG. 8B illustrates transmission through the atmosphere as a function of wavelength for an atmospheric condition that may be detected by an imager array in accordance with an embodiment of the disclosure.

In another approach, a gas may be remotely sensed using a sensor that detects irradiation in or more of the absorption bands (e.g., spectral bands) of the gas. For example, FIG. 8A illustrates transmission as a function of wavelength for a gas, and FIG. 8B illustrates transmission through the atmosphere as a function of wavelength for an atmospheric condition.

For gases with absorption bands in the LWIR wavebands, a bandpass filter may be used. For example, the filter may be tuned such that it closely matches the absorption band of the gas. The bandpass filter may reduce the amount of irradiance that may be measured by the sensor to a few percent of what would be measured if the bandpass filter was not present. If the gas is present, it may absorb a significant amount of the total irradiance and an operator viewing an image provided by the sensor may be able detect the gas when it occludes the background of the image (e.g., causing a loss of signal of the background).

However, for such an approach to be effective, the one or more narrow wavebands absorbed by the gas must make up a significant amount of the total irradiance being measured by the sensor. For example, for an infrared sensor sensitive to electromagnetic radiation wavelengths in the range of 7-13 µm, the absorption band of the detected gas may represent only a fraction of a percent of the total irradiance detected by the sensor under typical imaging conditions. As a result, the gas may appear transparent to the sensor because most of the available signal from other objects in the background behind the gas may not be absorbed by the gas.

To improve the sensitivity of such sensors, a narrow bandpass filter may be provided that includes the gas absorption band. In this case, the gas may absorb a large percentage of electromagnetic radiation in the narrow band which makes the gas easier to detect (e.g., there may be a greater relative difference between an image captured when gas is present and an image captured when gas is not present). However, such an approach may require the sensor to be highly responsive. For example, if 95 percent of the signal is lost due to the bandpass filter, then the sensor may need to be 20 times more sensitive to preserve scene fidelity. Such highly sensitive sensors may require very high performance imaging systems (e.g., in the infrared waveband, such systems may use cryogenically cooled sensors with large aperture optics). As a result, such systems may be two orders of magnitude more expensive than uncooled infrared systems, may have significant power requirements which make them unsuitable for battery operation, and may be larger and heavier than uncooled systems.

Moreover, some materials (e.g., other than gas) may have spectral properties that match that of the gas being detected such that the irradiance from such materials mostly fall within the absorption band of the gas. This may cause false alarms. For example, some surfaces such as painted surfaces or metals may emit very little signal in a band matching that of one of the gas absorption bands. One way to reduce such false alarms is to measure irradiance in multiple spectral bands that match multiple absorption bands of the gas. This can be accomplished by designing a spectral filter that has significant transmission in more than one spectral band. However, this may complicate the design of the filter and may limit its efficiency (e.g., as measured by the percent of irradiance transmitted to the sensor). Another way to reduce such false alarms is to time multiplex multiple filters having different spectral bands (e.g., by using a rotating filter wheel and a single detector).

However, such an approach may require registering images to compensate for imager or scene motion (e.g., misalignment may be introduced when imaging non static scenes or when the imager is hand held or otherwise moving). In addition, such an approach may only allow for short integration or exposure times that are set by the period of the filter wheel rotations.

Figure 8C:
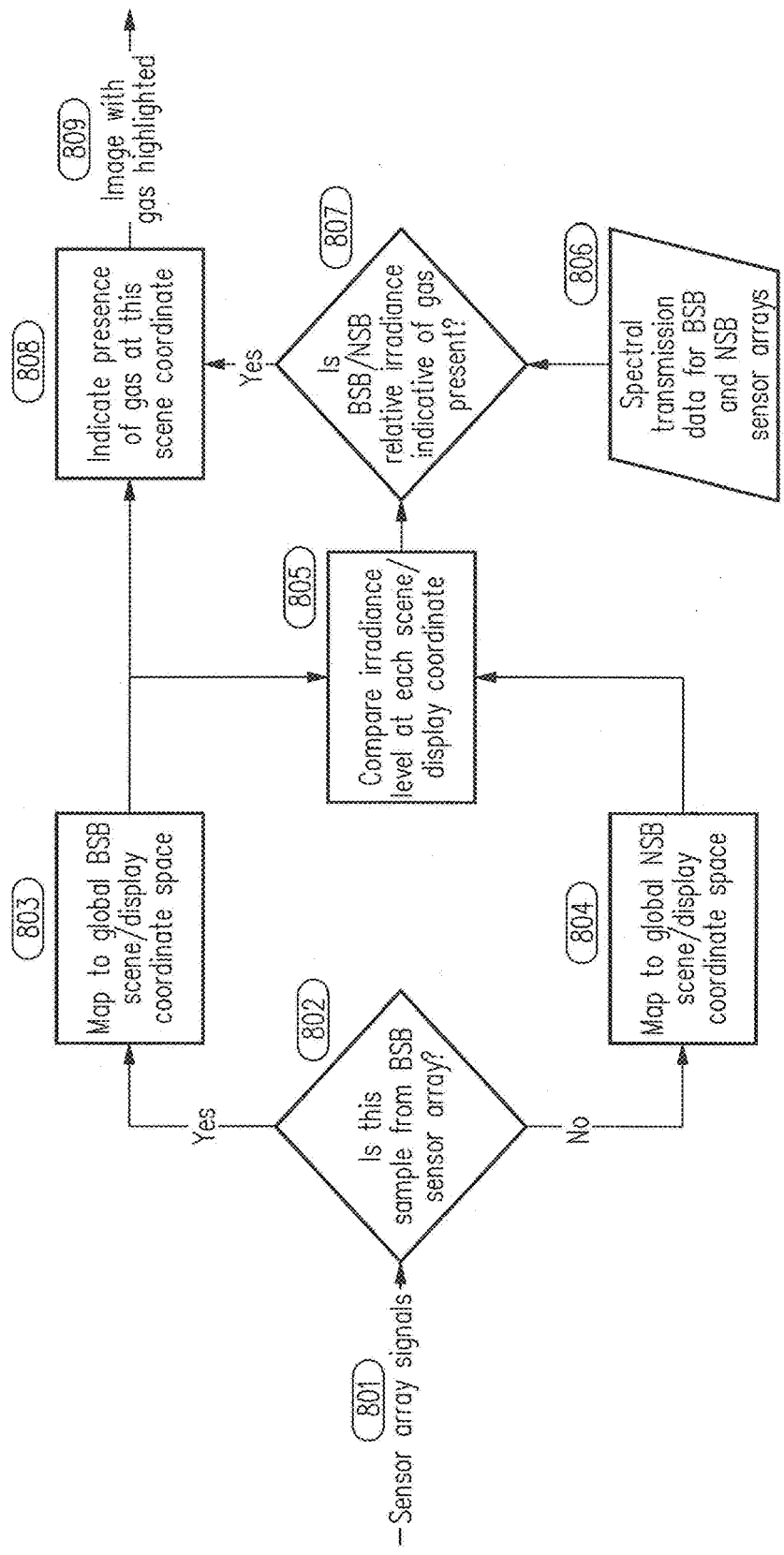
FIG. 8C illustrates a process of performing gas detection in accordance with an embodiment, of the disclosure.

FIG. 8C illustrates a process of performing gas detection in accordance with an embodiment of the disclosure. As discussed, different sensor arrays 202 may detect different broad or narrow bands (e.g., wavelength ranges) of electromagnetic radiation. Accordingly, sensor array signals 801 (e.g., signals, samples, or data values, such as pixel values, provided by various sensor arrays 202 in response to detected electromagnetic radiation) may be provided that correspond to different bands. In one embodiment, some sensor arrays 202 may be configured to detect broad spectral bands (BSB) of electromagnetic radiation, and other sensor arrays 202 may be configured to detect narrow spectral bands (NSB) of electromagnetic radiation. For example, the NSB may approximately match one of the absorption bands (e.g., wavelength ranges) of a known gas (e.g., as shown in FIG. 8A). In one embodiment, NSBs may include all or portions of various wavebands, such as thermal radiation, LWIR radiation, MWIR radiation, SWIR radiation, NIR radiation, visible light (VIS), and/or other ranges. In one embodiment, BSBs may include wavebands greater than that of such NSBs.

Lenses 208 associated with the BSB or NSB sensor arrays 202 may be coated or otherwise filtered to reflect most electromagnetic radiation outside of their respective bands. Therefore, sensor array signals 801 may include some signals corresponding to BSB electromagnetic radiation and some signals corresponding to NSB electromagnetic radiation.

In block 802, sensor array signals 801 are processed to determine whether they correspond to a BSB sensor array or an NSB sensor array. In this regard, samples corresponding to BSB sensor array signals are passed to block 803 where the samples are mapped to a global BSB scene coordinate space. In this regard, each sensor 206 and its corresponding pixel of each BSB sensor array 202 may be mapped to a corresponding coordinate of the BSB scene coordinate space, for example, by selecting a scene coordinate (e.g., pixel) having a center that closest matches the center of the corresponding sensor 206. Samples corresponding to NSB sensor array signals are passed to block 804 where the samples are mapped to a global NSB scene coordinate space. In this regard, each sensor 206 and its corresponding pixel of each NSB sensor array 202 may be mapped to a corresponding coordinate of the NSB scene coordinate space, for example, by selecting a scene coordinate having a center that closest matches the center of the corresponding sensor 206.

At block 805, the mapped samples (e.g., pixel values) provided by the BSB sensor arrays 202 for particular scene coordinates are compared with the mapped samples (e.g., pixel values) provided by the NSB sensor arrays 202 for the same scene coordinates. For example, in one embodiment, the NSB may be a subset of the BSB. In this case, if approximately 5 percent of the irradiance measured by the BSB sensor arrays 202 is attributable to NSB electromagnetic radiation, then it may be expected that the signal provided by an NSB sensor array 202 for a particular scene coordinate may correspond to approximately 5 percent of the signal provided by a BSB sensor array 202 for the same scene coordinate.

Therefore, if mapped sample value provided by the NSB sensor array 202 is close to zero or at least much lower than 5 percent of the mapped sample value provided by the BSB sensor array 202 for the same scene coordinate, then such values may indicate that a gas is present at the scene coordinate (block 807) (e.g., a gas is absorbing NSB electromagnetic radiation at the scene coordinate). The presence of the gas may be indicated at the scene coordinate by processing the mapped samples (block 808) using spectral transmission data for BSB and NSB sensor arrays (block 806) to provide an image 809 (e.g., a result image) that is, for example, highlighted or color coded at the scene coordinates corresponding to the identified gas.

In another embodiment, different NSB sensor arrays 202 may detect NSB electromagnetic radiation in different narrow bands. For example, a first group of one or more NSB sensor arrays 202 may detect NSB electromagnetic radiation in a first narrow band, and a second group of one or more NSB sensor arrays 202 may detect NSB electromagnetic radiation in a second narrow band that differs from the first narrow band. Additional groups of NSB sensor arrays 202 associated with other narrow bands may also be provided.

Gases may be detected with high accuracy using different NSB sensor arrays 202 directed toward different NSBs. For example, the different NSBs may be associated with different absorption bands of the same gas. Thus, by using such different NSB sensor arrays 202 in the process of FIG. 8C, sample values (e.g., signal strength) provided by BSB sensor arrays 202 may be compared with sample values provided by different NSB sensor arrays 202 for different NSBs. Thus, if a gas has multiple absorption bands, then the detection of such bands using the different NSBs may increase the accuracy of gas detection and reduce the likelihood of false detections (e.g., due to multiple gases or materials sharing an identical or similar absorption band).

In another embodiment, one or more NSB sensor arrays 202 may detect NSB electromagnetic radiation in multiple narrow bands that match the absorption bands of multiple gases. In this case, multiple gases with different spectral properties may be detected.

Moreover, any of the described approaches using NSB sensor arrays 202 may be combined as desired. For example, one or more multiple NSB sensor arrays 202 may be used to detect multiple NSBs for a single gas or different gases. Advantageously, the use of NSB sensor arrays 202 may permit multiple types of gases to be detected by a single imager array 200.

Figure 9A:
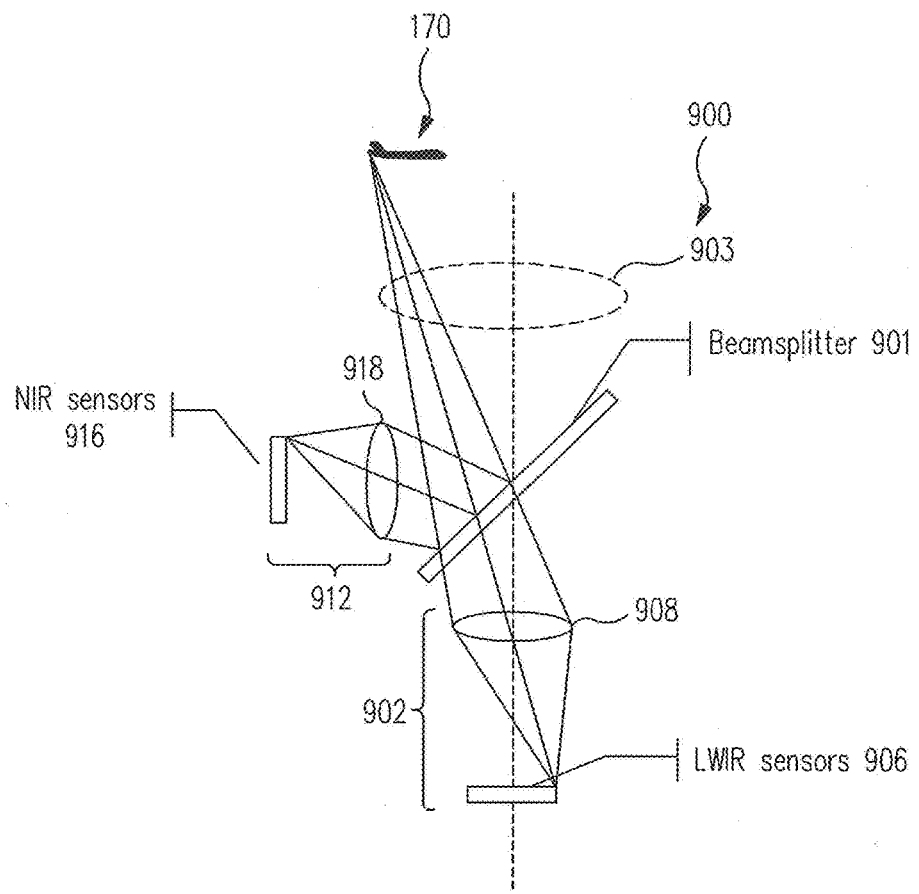
FIG. 9A illustrates an imager array including a plurality of sensor arrays and a beamsplitter in accordance with an embodiment of the disclosure.

In various embodiments, the features of imager array 200 may be applied to other implementations. For example, FIG. 9A illustrates an imager array 900 including a plurality of sensor arrays 902/912 and a beamsplitter 901 in accordance with an embodiment of the disclosure. For example, in one embodiment, sensor array 902 may include sensors 906 (e.g., InGaAs sensors) and a lens 908 provided by a LWIR camera, and sensor array 912 may include sensors 916 (e.g., InGaAs sensors) and a lens 918 be provided by a VIS/NIR camera. In this regard, two cameras may be used in the illustrated embodiment if, for example, no suitable detector material is available that is sensitive to all wavebands of interest. Advantageously, LWIR and VIS/NIR cameras may be implemented without requiring the extra weight and size of associated cooling equipment.

As shown in FIG. 9A, electromagnetic radiation from scene 170 may pass through a common shared aperture 903 to beamsplitter 901 which passes or reflects the electromagnetic radiation to sensor arrays 902 and 912. The use of beamsplitter 901 and shared aperture 903 may minimize parallax between the two cameras. Although only two sensor arrays 902/912 are identified in FIG. 9A, it will be appreciated that any desired number of sensor arrays 902/912 or cameras may be used.

Because phase shift between sensor arrays 902 and 916 may be used to provide various features (e.g., in accordance with embodiments described in this disclosure), sensor arrays 902 and 916 need not be precisely aligned with each other. This reduces the need for a complex boresighting process and mechanism in this embodiment.

Figure 9B:
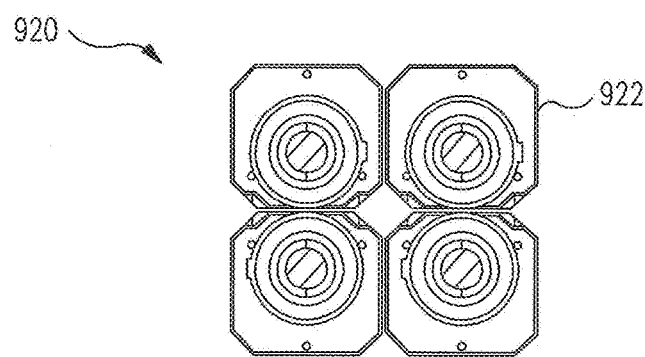
FIG. 9B illustrates an imager array including a plurality of cameras in accordance with an embodiment of the disclosure.

FIG. 9B illustrates an imager array 920 including a plurality of cameras 922 in accordance with an embodiment of the disclosure. In this embodiment, individual cameras 922 may be used in place of individual sensor arrays 202. Although only two cameras 922 are identified in FIG. 9B, it will be appreciated that any desired number of cameras 922 may be used.

Imagers sensitive to radiation in the infrared waveband usually have only a small number of sensors compared to imagers sensitive to radiation in the visible wave band. This is due to various reasons such as, for example, the larger aperture optics and larger sensor elements typically used for infrared radiation, as well as the cost of materials (e.g., germanium and silicon) used for infrared optics.

In one embodiment, an artificial neural network (ANN) may be used to estimate high resolution images from low resolution images provided by sensor arrays 202. Such high resolution images may be used, for example, for target tracking or other applications.

An ANN may be used to implement a nonlinear classification process in which nonlinear, scene-dependent, and wavelength-dependent relationships are mapped between low spatial frequency signals (e.g., low resolution pixel values captured of a scene) to corresponding high spatial frequency signals (e.g., high resolution pixel values stored in a database for scenes previously imaged at high resolution). For example, one or more such ANNs may be implemented to perform radial basis function (RBF) processing techniques which may be suitable for hardware (e.g., using digital circuitry, analog ROIC circuitry, or other circuitry) or software implementations.

In one embodiment, the ANN may include individual artificial neurons (e.g., modeled on a brain) that are implemented by individual processors in a completely parallel architecture. In this case, all such processors may be configured to access data simultaneously and provide output data within several clock cycles.

Figure 10:
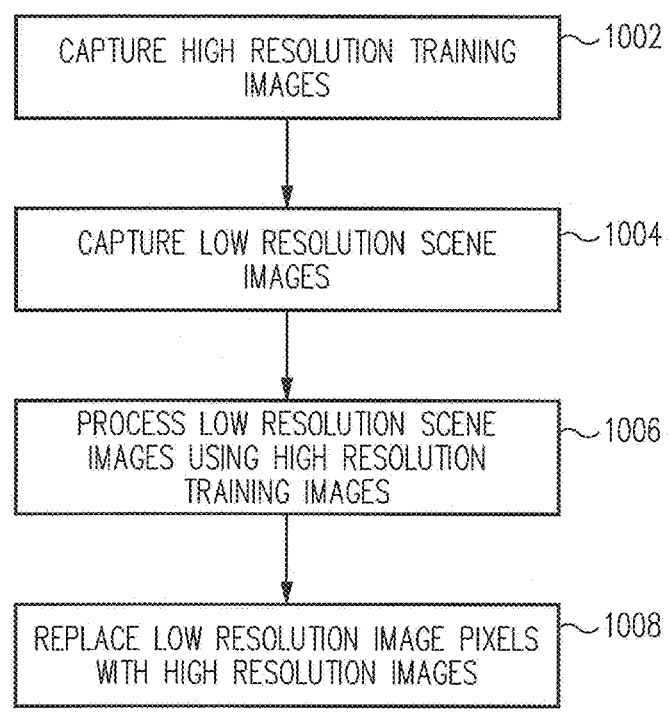
FIG. 10 illustrates a process of providing a high resolution image using an artificial neural network in accordance with an embodiment of the disclosure.

FIG. 10 illustrates a process of providing a high resolution image using an ANN in accordance with an embodiment of the disclosure. For example, in one embodiment, the ANN may be provided by appropriate processors, memories, and machine readable instructions of imaging system 100.

In block 1002, imaging system 100 captures high resolution training images of a desired type of scene 170. For example, imaging system 1002 may use a separate high resolution imager array, or may configure imager array 200 for high resolution operation (e.g., by using all of sensor arrays 202 as a single sensor array). In one embodiment, the training performed in block 1002 may be performed non-iteratively may greatly improve the real time possibilities for online performance enhancements (e.g., continuous scene learning).

The high resolution training images may be stored, for example, in an appropriate memory of imaging system 100, a local or remote database, or any other desired location. Thus, imaging system 100 may have access to a set of high resolution training images (e.g., a learned "dictionary") of a particular type of scene 170 which may be subsequently imaged by low resolution sensor arrays 202 of imager array 200.

In block 1004, imaging system 100 captures one or more low resolution images of a particular scene 170 using low resolution sensor arrays 202. In block 1006, imaging system 100 processes individual pixels (e.g., using an ANN in accordance with RBF techniques) of the low resolution image to determine a mapping from each pixel to at least a portion of one or more of the high resolution training images.

In one embodiment, the scene imaged in block 1004 should be at least similar to the scene imaged in block 1002 in order to increase the likelihood of accurate pixel mappings in block 1006. For example, if the scenes are significantly different, then imaging system 100 may flag the low resolution scene images as invalid.

In block 1008, imaging system 100 replaces the pixels of the low resolution image with the mapped high resolution training images to provide a resulting high resolution image (e.g., a result image).

In one embodiment, the process of FIG. 10 may permit low resolution images to be converted into high resolution images on par or better than would be available with a conventional single aperture imager. For example, in one embodiment, the process of FIG. 10 may convert low resolution images of approximately 80 by 80 pixels up to high resolution images.

Moreover, because the process of FIG. 10 does not require the calculation of a per pixel optical flow, the computational burden may be kept reasonable and well within the processing available in a custom system on a chip (SoC) device.

In another embodiment, the process of FIG. 10 may be modified in accordance with various alternate process steps. For example, in block 1002, low resolution training images (e.g., low resolution versions of the high resolution training images) may also be provided. In one embodiment, the high resolution training images may be captured by a high resolution sensor array (e.g., sensor array 232) and the low resolution training images may be captured by a low resolution sensor array (e.g., sensor array 202).

Such high and low resolution training images may be captured substantially simultaneously using different sensor arrays 232 and 202, where a high resolution training image may have a narrow FoV contained within the imaging cone of a wide FoV of a low resolution training image. For example, if the image cone identified by twice the angle ρ is within the image cone identified by twice the angle Φ (see FIG. 2D), and the images provided by sensor arrays 202 and 232 are accurately mapped to a common scene coordinate space, the low resolution training image may be provided directly from the image captured by sensor array 202 (e.g., if the low resolution is half the high resolution, then 8 by 8 pixels from imager array 232 may be represented as 4 by 4 pixels from imager array 202).

In another embodiment, the high and low resolution training images may be captured using identical sensor arrays with different optics to provide different narrow and wide FoVs. In another embodiment, the high and low resolution training images may be captured at different times using a single optic capable of using at least two different magnification settings (e.g., different zoom positions). In another embodiment, a low resolution training image may be created by blurring a high resolution training image and resampling at a lower resolution density.

The high and low resolution training images provided in block 1002 may be separated into a plurality of sub images before being stored in a database. For example, in one embodiment, each low resolution training sub image may provide 8 by 8 pixels. Also in block 1002, the low resolution training sub images may be mapped to their corresponding high resolution sub images.

In block 1006, low resolution images (e.g., non-training images captured in block 1004) may be separated into a plurality of sub images, and the sub images may be mapped to previously stored low resolution training sub images. For example, in one embodiment, such mapping may be based on a Euclidian distance calculated between a vector defined by pixel values of the non-training low resolution sub images and a vector defined by pixel values of the training low resolution sub images.

Also in block 1006, the low resolution training sub images that have been mapped to the non-training low resolution sub images may be used to identify high resolution sub images (e.g., previously mapped to the low resolution training sub images in block 1002). As a result, the identified high resolution sub images may be used to replace the non-training low resolution sub images in block 1008 to provide a high resolution image (e.g., a result image).

In other embodiments, motion free, sample based, or single image super resolution processing techniques may be used with imager array 200. For example, such techniques may rely upon a learned database (e.g., dictionary) of high resolution images (e.g., samples), and the quality (e.g., measured by a peak signal to noise ratio (PSNR)) of a super resolved result image may depend significantly on the similarity between images in the database and the imaged scene 170. Therefore, the quality of result images obtained using such techniques may be improved if the high resolution images in the database are images of the actual imaged scene 170.

In accordance with various embodiments, imager array 200 may be used and/or modified for use in a variety of other applications. For example, in one embodiment, imaging system 100 may process images provided by various sensor arrays 202 to simultaneously provide the images to a user as well as perform signature correlation to perform, for example, laser targeting, automated target detection and tracking, or other operations.

In other embodiments, imager array 200 may be used in various applications such as, for example, night vision goggles, ballistic mounted detection and tracking, autonomous vehicle payloads, and others. In one embodiment, imager array 200 may be implemented with a relatively small size and a substantially flat profile that permits convenient integration into clothing, helmets, or other installations. For example, a cube implemented with six imager arrays 200 (e.g., one imager array 200 per plane of the cube) may be used to provide full spherical imaging.

In other embodiments, imager array 200 may be used in various consumer-oriented applications where low cost, multispectral, infrared, or other types of imaging systems may be useful. In another embodiment, imager array 200 may be used to perform automatic calibration in radiometric applications by taking into account emissivity in different wavebands.

FIGS. 11A-F illustrate several views of types of imager arrays having a plurality of infrared imaging modules 1102 in accordance with embodiments of the disclosure. Imager arrays 1100*a-e* of FIGS. 11A-F may be used, for example, to implement image capture component 130 of imaging system 100. In particular, embodiments of infrared imaging module 2100 discussed in connection with FIGS. 12-24, below, may be used to provide imaging modules 1102, for example, in place of (e.g., may be individually interchanged with) any one or all of the sensor arrays discussed in connection with FIGS. 1-10. In some embodiments, any one of the infrared imaging modules 1102 in imager arrays 1100*a-e* of FIGS. 11A-F may be individually interchanged with one or more of the sensor arrays discussed in connection with FIGS. 1-10.

In various embodiments, infrared imaging modules 1102 may each include a module housing 1120 (e.g., housing 2120 in FIG. 14), an optical element 1108 (e.g., optical element 2180 in FIG. 14) fixed relative to the module housing 1120, and a plurality of infrared sensors in a focal plane array adapted to capture an image based on infrared radiation received through optical element 1108. In some embodiments, optical element 1108 may be at least partially enclosed by a lens barrel 1109 (e.g., lens barrel 2110 in FIG. 14 which may integrated with or formed separately from housing 2120). In some embodiments, infrared imaging modules 1102 may include other elements or different elements, such as those described in connection with FIGS. 12-24.

In various embodiments, infrared imaging modules 1102 may perform multi spectral imaging to selectively detect desired ranges of infrared radiation, such as thermal radiation, long wave infrared (LWIR) radiation, mid wave infrared (MWIR) radiation, short wave infrared (SWIR) radiation, near infrared (NIR) radiation, and/or other ranges. In this regard, optical elements 1108 may include appropriate coatings, or infrared imaging modules 1102 may be provided with appropriate filters, to filter the infrared radiation received by infrared sensors (e.g., infrared sensors 2132 of FIG. 14) of infrared imaging modules 1102. As a result, different infrared imaging modules 1102 may detect different broad or narrow bands of electromagnetic (e.g., in particular, infrared) radiation.

In various embodiments, one or more infrared imaging modules 1102 may be implemented with substantially equal sizes and/or different sizes in the same or similar fashion as sensor arrays to provide the features and advantages of such sizing as described herein.

Infrared imaging modules 1102 may be arranged in various configurations within imager arrays. Such configurations may include, for example, a square lattice, a rectangular lattice, an oblique lattice, a rhombic lattice, a hexagonal lattice, or any other configuration or combination of configurations, for example. In some embodiments, module housings 1120 of infrared imaging modules 1102 may be configured to complement a particular configuration, such as being predominantly triangular or rectangular, for example.

In related embodiments, particular configurations may be chosen based on a type of image processing to be performed on image data captured by imager arrays, for example, or based on a desired ratio of a number of infrared imaging modules 1102 to a two dimensional area of an imager array (e.g., a packing ratio). In further embodiments, increasing a packing ratio of an imager array may effectively shorten and/or homogenize a distance between optical axes of adjoining ones of infrared imaging modules 1102. In such embodiments, an effective resolution of imager array 1100*a* may be increased. In some embodiments, a packing ratio of an imager array may be adjusted by staggering infrared imaging modules 1102 in a multi-level staggered configuration, for example.

Although various components of infrared imaging modules 1102, such as optical elements 1108, lens barrels 1109, and module housings 1120 are generally shown as being substantially similar in FIGS. 11A-F, these and/or other components may be implemented differently in various configurations, such as in different configurations of imager arrays.

Figure 11A:
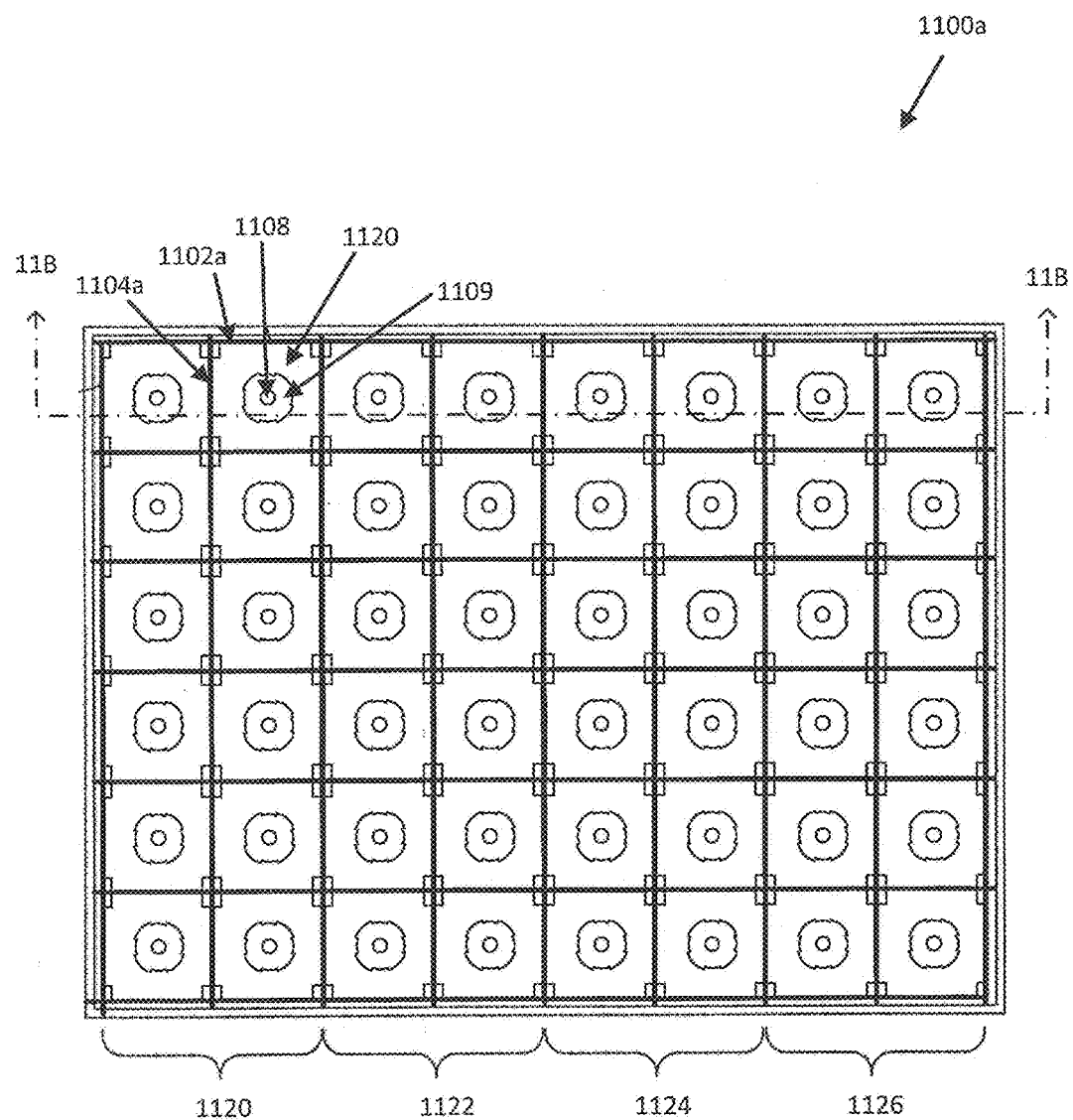
FIGS. 11A-F illustrate several views and types of imager arrays having a plurality of infrared imaging modules in accordance with embodiments of the disclosure.

As shown in the top view provided by FIG. 11A, imager array 1100*a* may include an array (e.g., 8 by 6 in one embodiment) of infrared imaging modules 1102*a* arranged in a square lattice configuration. Also shown are optional partitions 1104a, which may provide structural support for imager array 1100a, for example, and/or may be used to limit a field of view of one or more infrared imaging modules 1102a. In some embodiments, infrared imaging modules 1102a may be used to perform multi spectral imaging as described herein. For example, in one embodiment, at least four spectral bands may be detected, depicted in FIG. 11A as groups 1120, 1122, 1124, and 1126 of infrared imaging modules 1102a.

Figure 11B:
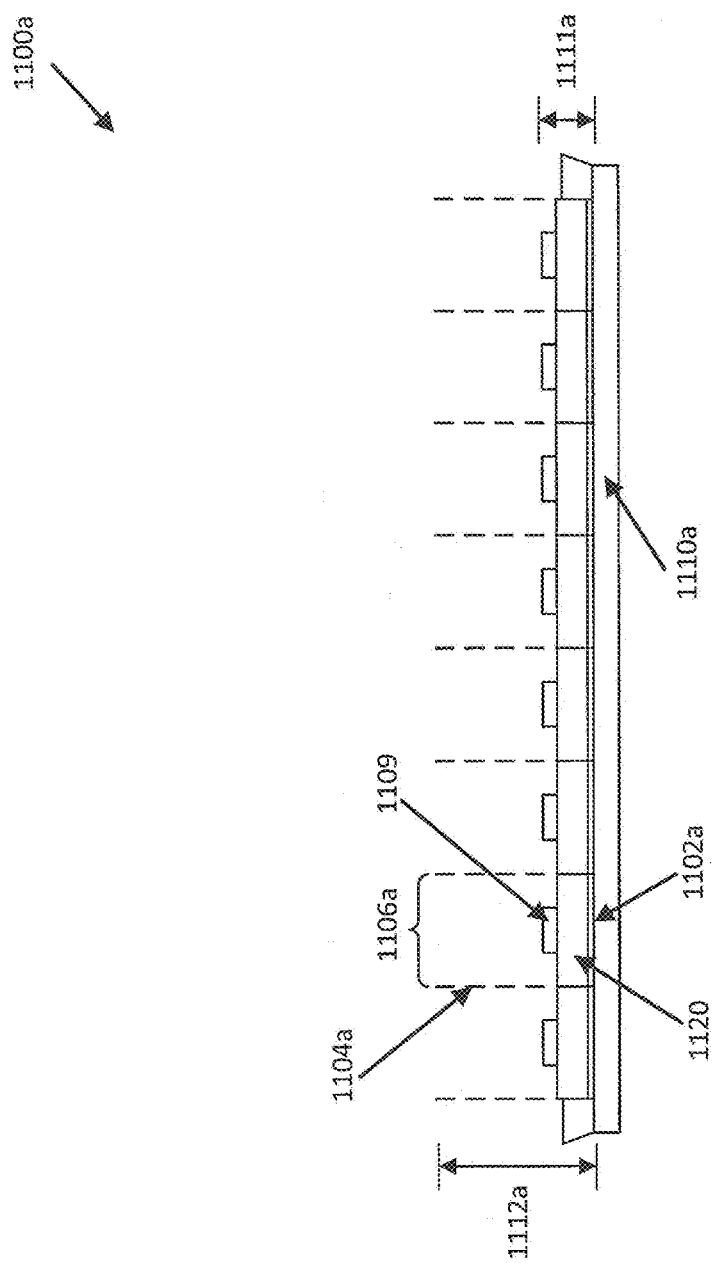

FIG. 11B shows imager array 1100a viewed along section lines 11B-11B in FIG. 11A. In some embodiments, imager array 1100a may include a base 1110a for structural support and/or electrical routing, for example. Distance 1111a indicates a height of infrared imaging modules 1102a from base 1110a, and distance 1112a indicates a height of partitions 1104a from base 1110a. Distances 1111a and 1112a may be selected to produce a desired field of view 1106a (e.g., an optical width) for each of infrared imaging modules 1102a, for example. In some embodiments, imager array 1100a may not include optional partitions 1104a, and instead may rely on dimensions and configurations of infrared imaging modules 1102a to produce a desired field of view, including a selectable field of view, for example, for each of infrared imaging modules 1102a.

Figure 11C:
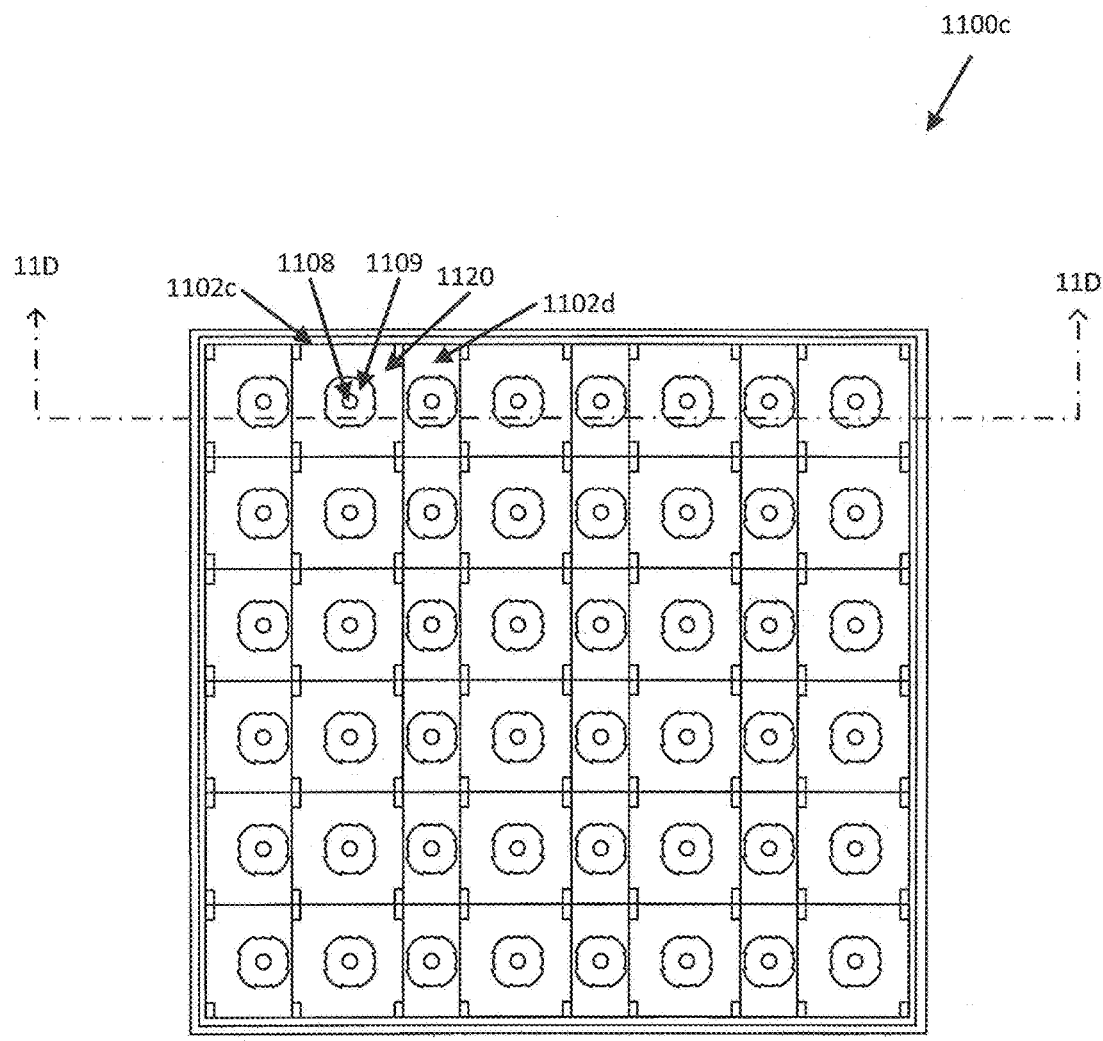
Figure 11D:
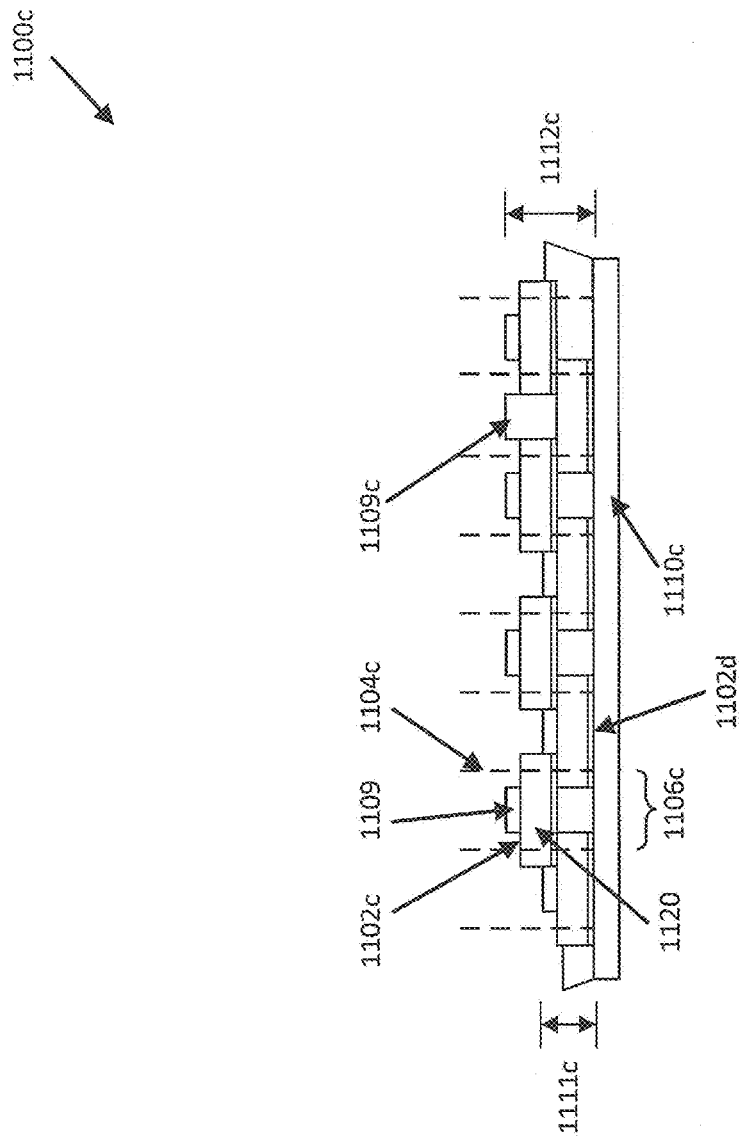

FIGS. 11C-D illustrate an embodiment where imager array 1100c includes infrared imaging modules 1102 arranged in a two-level staggered configuration with infrared imaging modules 1102c arranged in an upper level of imager array 1100c and infrared imaging modules 1102d arranged in a lower level of imager array 1100c. In embodiments where infrared imaging modules 1102c and 1102d are similar in size to infrared imaging modules 1102a of FIGS. 11A-B, imager array 1100c has a larger packing ratio than imager array 1100a. Infrared imaging modules 1102c-d may include optical elements 1108, lens barrels 1109, housings 1120, and/or other features as discussed.

FIG. 11D illustrates imager array 1100c viewed along section lines 11D-11D in FIG. 11C. FIG. 11D shows base 1110c, optional partitions 1104c (e.g., not shown in FIG. 11C for clarity purposes) with optical width 1106c, and distances 1111c-1112c. Distance 1111c indicates a height of lower infrared imaging modules 1103c from base 1110c, and distance 1112c indicates a height of upper infrared imaging modules 1102c from base 1110c. As shown in FIG. 11D, in some embodiments, one or more of lower infrared imaging modules 1103c may include an extended lens barrel 1109c and/or an extended optical element (e.g., within extended lens barrel 1109c), for example, which may be adapted to approximate a height of upper infrared imaging modules 1102c and, in some embodiments, adjust a field of view of lower infrared imaging modules 1103c to match that of upper infrared imaging modules 1102c.

As can be seen from FIGS. 11C-D, imager array 1100c may be implemented in a multi-level staggered configuration with two layers of infrared imaging modules 1102c and 1102d, where either columns or rows of imager array 1100c may be alternatingly staggered in height in order to increase an overall packing ratio of imager array 1100c. Although FIG. 11C shows imager array 1100c with infrared imaging modules 1102c and 1102d arranged in a square lattice configuration, in other embodiments, imager array 1100c may include a plurality of infrared imaging modules 1102c and 1102d arranged in a different lattice configuration, for example, and rows, columns, or other groupings of the infrared imaging modules may be arranged in a two-level staggered configuration adapted to increase a packing ratio of imager array 1100c. In some embodiments, housings 1120 and/or other appropriate components of infrared imaging modules 1102c and 1102d may be configured to complement a particular lattice configuration and/or multi-level staggered configuration, such as being predominantly triangular or rectangular, for example, and/or being notched or sloped to interlock with adjacent upper imaging modules 1102c and/or lower infrared imaging modules 1102d.

Figure 11E:
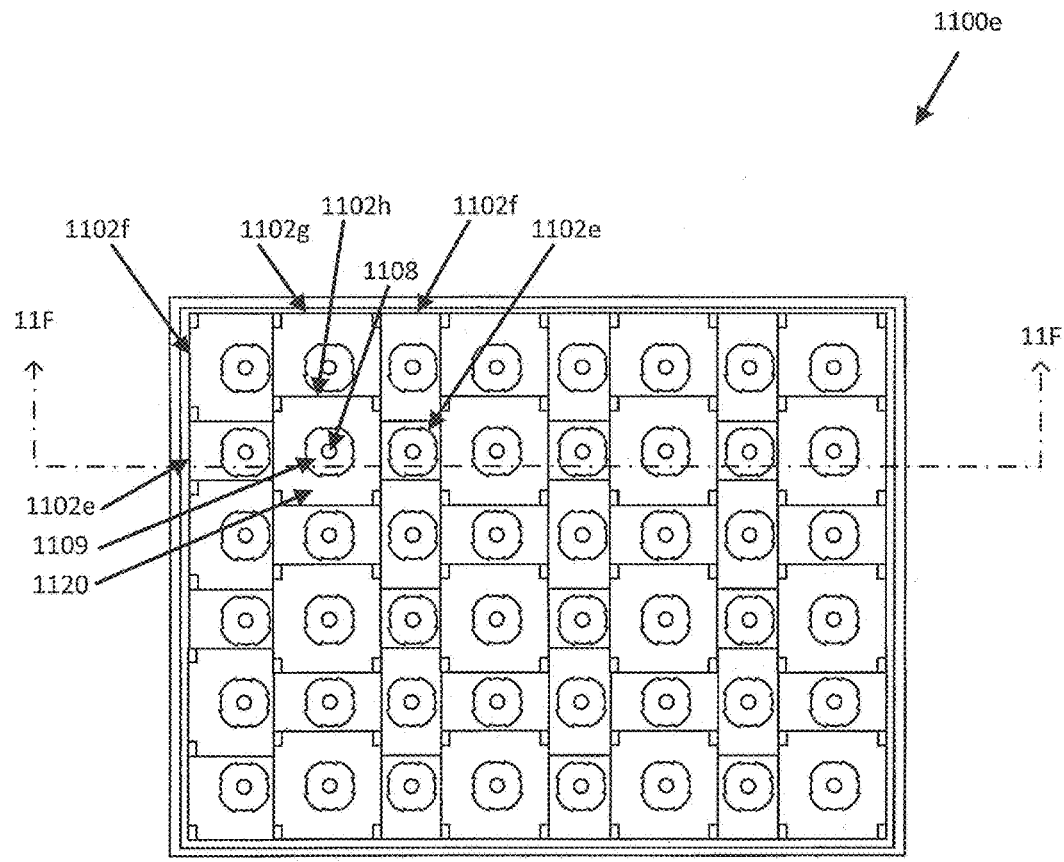
Figure 11F:
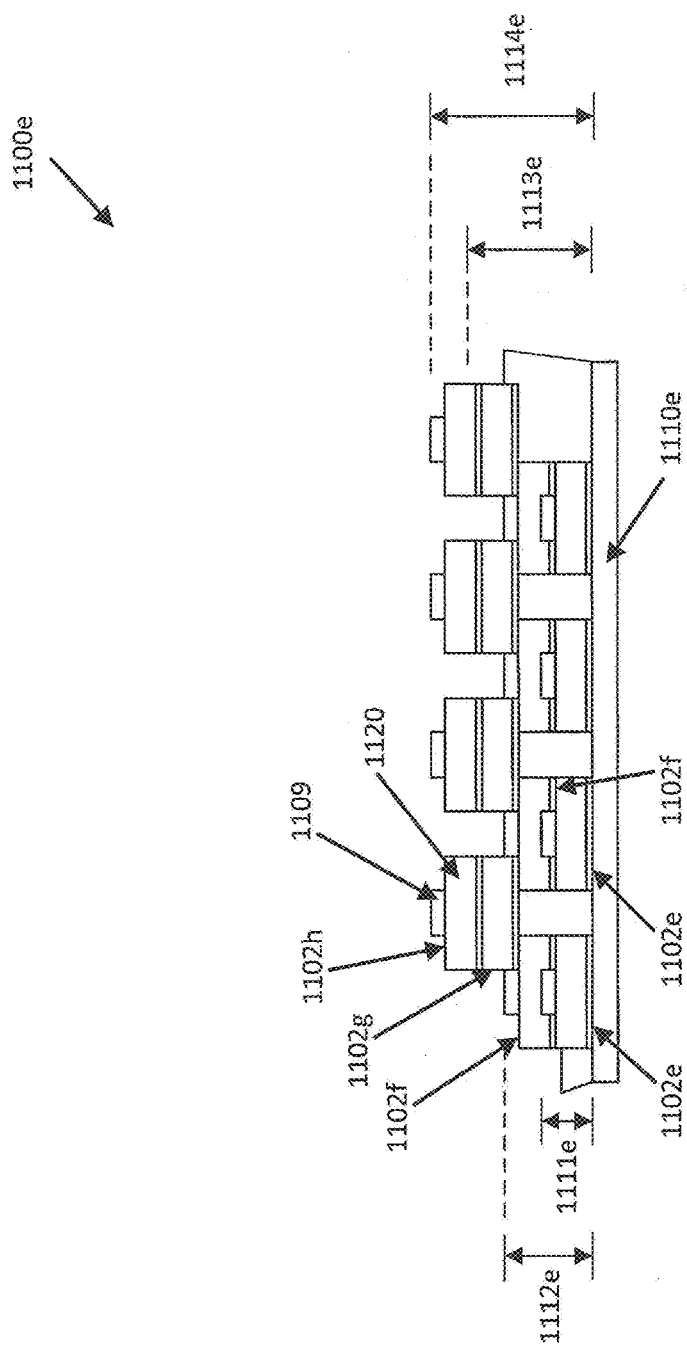

FIGS. 11E-F illustrate an embodiment where imager array 1100e includes infrared imaging modules 1102e-1102h arranged in a four-level staggered configuration. In embodiments where infrared imaging modules 1102e-1102h are similar in size to infrared imaging modules 1102c and 1102d, imager array 1100e has a larger packing ratio than imager array 1100c. More generally, imager arrays may include infrared imaging modules arranged in a plurality of levels that are staggered in order to increase a packing ratio of the imager array, for example, or to facilitate a particular image processing technique. Such image processing techniques may include types and/or methods of Fourier transforms, interpolation methods, and color (e.g., pseudo-color, or infrared spectrum) distribution methods, for example. In some embodiments, imager array 1100e may be implemented with optional partitions (e.g., not shown in FIGS. 11E-F for clarity purposes) as similarly described herein.

FIGS. 11E-F illustrate an embodiment where imager array 1100e includes infrared imaging modules 1102e arranged in an first level of imager array 1100e, infrared imaging modules 1102f arranged in a second level of imager array 1100e, infrared imaging modules 1102g arranged in a third level of imager array 1100e, and infrared imaging modules 1102h arranged in a fourth level of imager array 1100e Infrared imaging modules 1102e-h may include optical elements 1108, lens barrels 1109, extended lens barrels 1109e (e.g., as discussed in relation to FIG. 11D), extended optical elements (e.g., within extended lens barrels 1109e), housings 1120, and/or other features as discussed. FIG. 11F shows imager array 1100e viewed along section lines 11F-11F in FIG. 11E and includes base 1110e and distances 1111e-1114e. Distance 1111e indicates a height of first level infrared imaging modules 1102e from base 1110e, distance 1112e indicates a height of second level infrared imaging modules 1102f from base 1110e, distance 1111e indicates a height of third level infrared imaging modules 1102g from base 1110e, and distance 1114e indicates a height of fourth level infrared imaging modules 1102h from base 1110e. In some embodiments, one or more of the lower level infrared imaging modules 1102e-g may include extended optical elements and/or extended lens barrels as similarly discussed with regard to FIG. 11D to approximate a height of fourth level (e.g., top level) infrared imaging modules 1102h.

As can be seen from FIGS. 11E-F, imager array 1100e may be implemented in a multi-level staggered configuration with four layers of infrared imaging modules 1102e-h, where infrared imaging modules of imager array 1100e may be staggered across four levels in height in order to increase an overall packing ratio of imager array 1100e. Although FIG. 11E shows imager array 1100e with infrared imaging modules 1102e-h arranged in a square lattice configuration, in other embodiments, imager array 1100e may include a plurality of infrared imaging modules 1102e-h arranged in a different lattice configuration, for example, and other groupings of the infrared imaging modules may be arranged in a four-level staggered configuration adapted to increase a packing ratio of imager array 1100e. More generally, infrared imaging modules of an imager array may be arranged in a multi-level staggered configuration adapted to increase a packing ratio of the imager array. In various embodiments, module housings 1120 of infrared imaging modules 1102e-h may be configured to complement a particular lattice configuration and/or multi-level staggered configuration.

Figure 12:
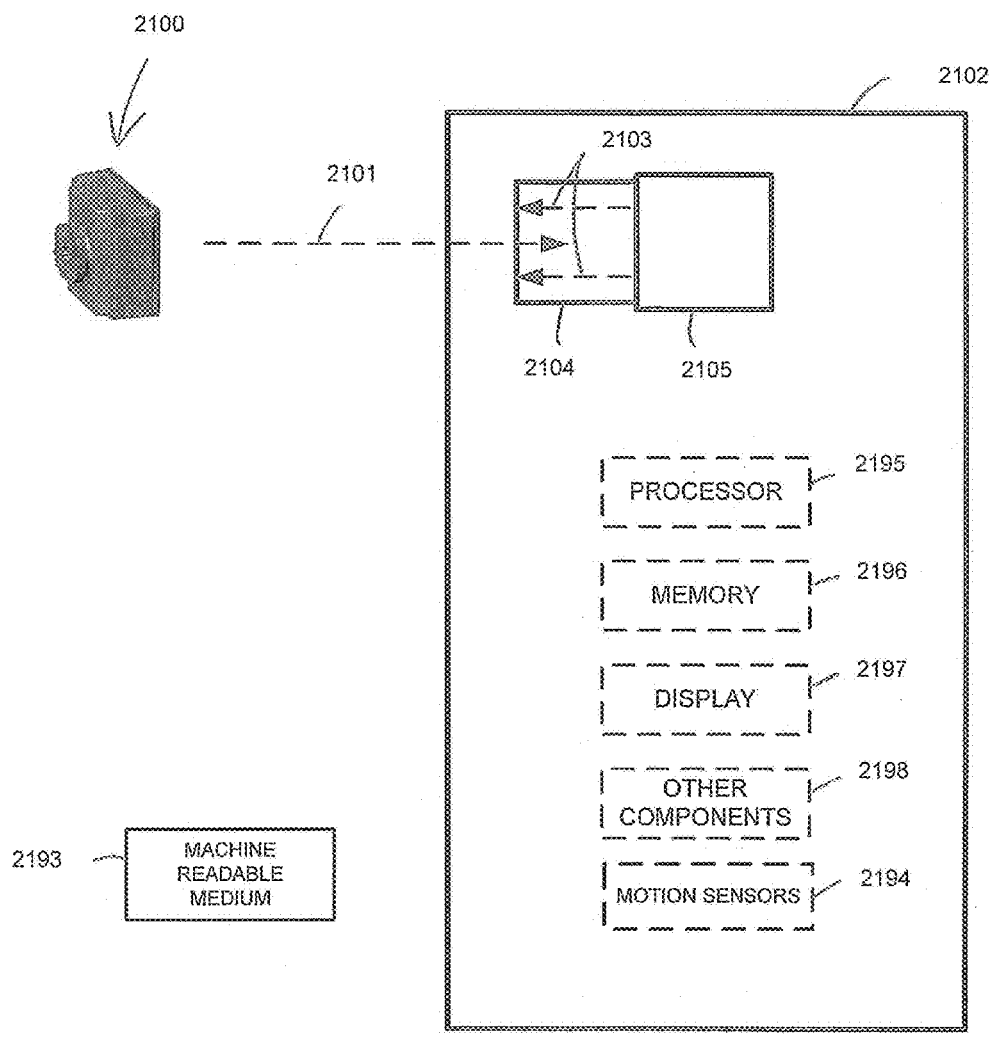
FIG. 12 illustrates an infrared imaging module configured to be implemented in a host device in accordance with an embodiment of the disclosure.

FIG. 12 illustrates an infrared imaging module 2100 (e.g., an infrared camera or an infrared imaging device) configured to be implemented in a host device 2102 in accordance with an embodiment of the disclosure Infrared imaging module 2100 may be implemented, for one or more embodiments, with a small form factor and in accordance with wafer level packaging techniques or other packaging techniques.

In one embodiment, infrared imaging module 2100 may be configured to be implemented in a small portable host device 2102, such as a mobile telephone, a tablet computing device, a laptop computing device, a personal digital assistant, a visible light camera, a music player, or any other appropriate mobile device. In this regard, infrared imaging module 2100 may be used to provide infrared imaging features to host device 2102. For example, infrared imaging module 2100 may be configured to capture, process, and/or otherwise manage infrared images and provide such infrared images to host device 2102 for use in any desired fashion (e.g., for further processing, to store in memory, to display, to use by various applications running on host device 2102, to export to other devices, or other uses).

In various embodiments, infrared imaging module 2100 may be configured to operate at low voltage levels and over a wide temperature range. For example, in one embodiment, infrared imaging module 2100 may operate using a power supply of approximately 2.4 volts, 2.5 volts, 2.8 volts, or lower voltages, and operate over a temperature range of approximately −20 degrees C. to approximately +60 degrees C. (e.g., providing a suitable dynamic range and performance over an environmental temperature range of approximately 80 degrees C.). In one embodiment, by operating infrared imaging module 2100 at low voltage levels, infrared imaging module 2100 may experience reduced amounts of self heating in comparison with other types of infrared imaging devices. As a result, infrared imaging module 2100 may be operated with reduced measures to compensate for such self heating.

Figure 13:
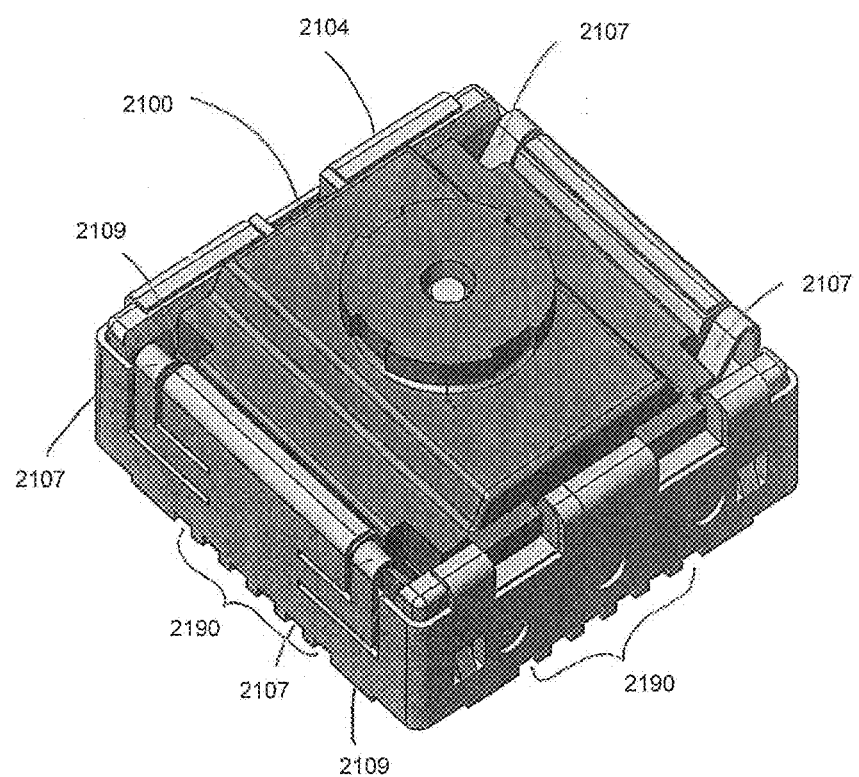
FIG. 13 illustrates an assembled infrared imaging module in accordance with an embodiment of the disclosure.

As shown in FIG. 12, host device 2102 may include a socket 2104, a shutter 2105, motion sensors 2194, a processor 2195, a memory 2196, a display 2197, and/or other components 2198. Socket 2104 may be configured to receive infrared imaging module 2100 as identified by arrow 2101. In this regard, FIG. 13 illustrates infrared imaging module 2100 assembled in socket 2104 in accordance with an embodiment of the disclosure.

Motion sensors 2194 may be implemented by one or more accelerometers, gyroscopes, or other appropriate devices that may be used to detect movement of host device 2102. Motion sensors 2194 may be monitored by and provide information to processing module 2160 or processor 2195 to detect motion. In various embodiments, motion sensors 2194 may be implemented as part of host device 2102 (as shown in FIG. 12), infrared imaging module 2100, or other devices attached to or otherwise interfaced with host device 2102.

Processor 2195 may be implemented as any appropriate processing device (e.g., logic device, microcontroller, processor, application specific integrated circuit (ASIC), or other device) that may be used by host device 2102 to execute appropriate instructions, such as software instructions provided in memory 2196. Display 2197 may be used to display captured and/or processed infrared images and/or other images, data, and information. Other components 2198 may be used to implement any features of host device 2102 as may be desired for various applications (e.g., clocks, temperature sensors, a visible light camera, or other components). In addition, a machine readable medium 2193 may be provided for storing non-transitory instructions for loading into memory 2196 and execution by processor 2195.

In various embodiments, infrared imaging module 2100 and socket 2104 may be implemented for mass production to facilitate high volume applications, such as for implementation in mobile telephones or other devices (e.g., requiring small form factors). In one embodiment, the combination of infrared imaging module 2100 and socket 2104 may exhibit overall dimensions of approximately 8.5 mm by 8.5 mm by 5.9 mm while infrared imaging module 2100 is installed in socket 2104.

Figure 14:
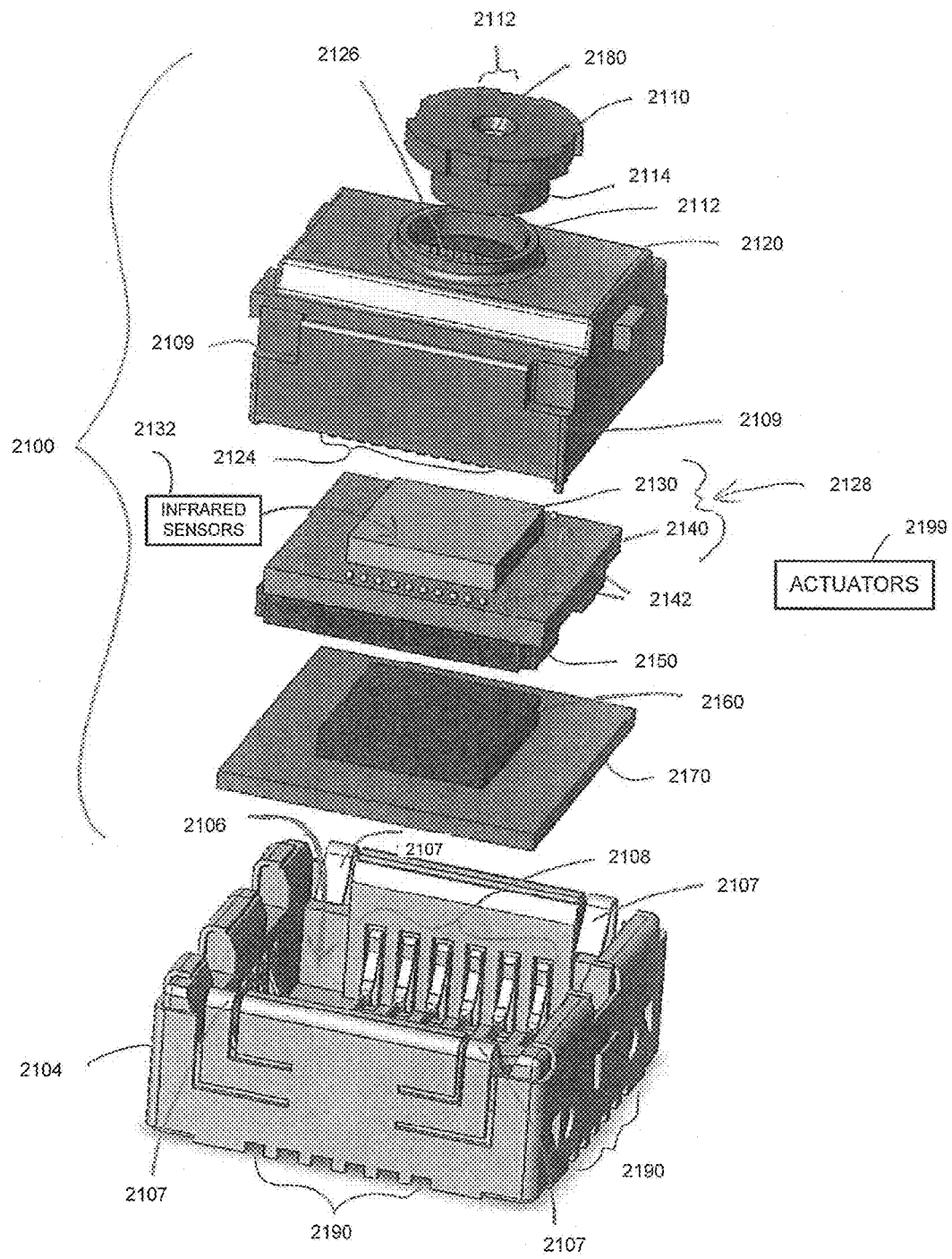
FIG. 14 illustrates an exploded view of an infrared imaging module juxtaposed over a socket in accordance with an embodiment of the disclosure.

FIG. 14 illustrates an exploded view of infrared imaging module 2100 juxtaposed over socket 2104 in accordance with an embodiment of the disclosure. Infrared imaging module 2100 may include a lens barrel 2110, a housing 2120, an infrared sensor assembly 2128, a circuit board 2170, a base 2150, and a processing module 2160.

Lens barrel 2110 may at least partially enclose an optical element 2180 (e.g., a lens) which is partially visible in FIG. 14 through an aperture 2112 in lens barrel 2110. Lens barrel 2110 may include a substantially cylindrical extension 2114 which may be used to interface lens barrel 2110 with an aperture 2122 in housing 2120.

Infrared sensor assembly 2128 may be implemented, for example, with a cap 2130 (e.g., a lid) mounted on a substrate 2140. Infrared sensor assembly 2128 may include a plurality of infrared sensors 2132 (e.g., infrared detectors) implemented in an array or other fashion on substrate 2140 and covered by cap 2130. For example, in one embodiment, infrared sensor assembly 2128 may be implemented as a focal plane array (FPA). Such a focal plane array may be implemented, for example, as a vacuum package assembly (e.g., sealed by cap 2130 and substrate 2140). In one embodiment, infrared sensor assembly 2128 may be implemented as a wafer level package (e.g., infrared sensor assembly 2128 may be singulated from a set of vacuum package assemblies provided on a wafer). In one embodiment, infrared sensor assembly 2128 may be implemented to operate using a power supply of approximately 2.4 volts, 2.5 volts, 2.8 volts, or similar voltages.

Infrared sensors 2132 may be configured to detect infrared radiation (e.g., infrared energy) from a target scene including, for example, mid wave infrared wave bands (MWIR), long wave infrared wave bands (LWIR), and/or other thermal imaging bands as may be desired in particular implementations. In one embodiment, infrared sensor assembly 2128 may be provided in accordance with wafer level packaging techniques.

Infrared sensors 2132 may be implemented, for example, as microbolometers or other types of thermal imaging infrared sensors arranged in any desired array pattern to provide a plurality of pixels. In one embodiment, infrared sensors 2132 may be implemented as vanadium oxide (VOx) detectors with a 17 μm pixel pitch. In various embodiments, arrays of approximately 32 by 32 infrared sensors 2132, approximately 64 by 64 infrared sensors 2132, approximately 80 by 64 infrared sensors 2132, or other array sizes may be used.

Substrate 2140 may include various circuitry including, for example, a read out integrated circuit (ROIC) with dimensions less than approximately 5.5 mm by 5.5 mm in one embodiment. Substrate 2140 may also include bond pads 2142 that may be used to contact complementary connections positioned on inside surfaces of housing 2120 when infrared imaging module 2100 is assembled as shown in FIG. 14. In one embodiment, the ROIC may be implemented with low-dropout regulators (LDO) to perform voltage regulation to reduce power supply noise introduced to infrared sensor assembly 2128 and thus provide an improved power supply rejection ratio (PSRR). Moreover, by implementing the LDO with the ROIC (e.g., within a wafer level package), less die area may be consumed and fewer discrete die (or chips) are needed.

Figure 15:
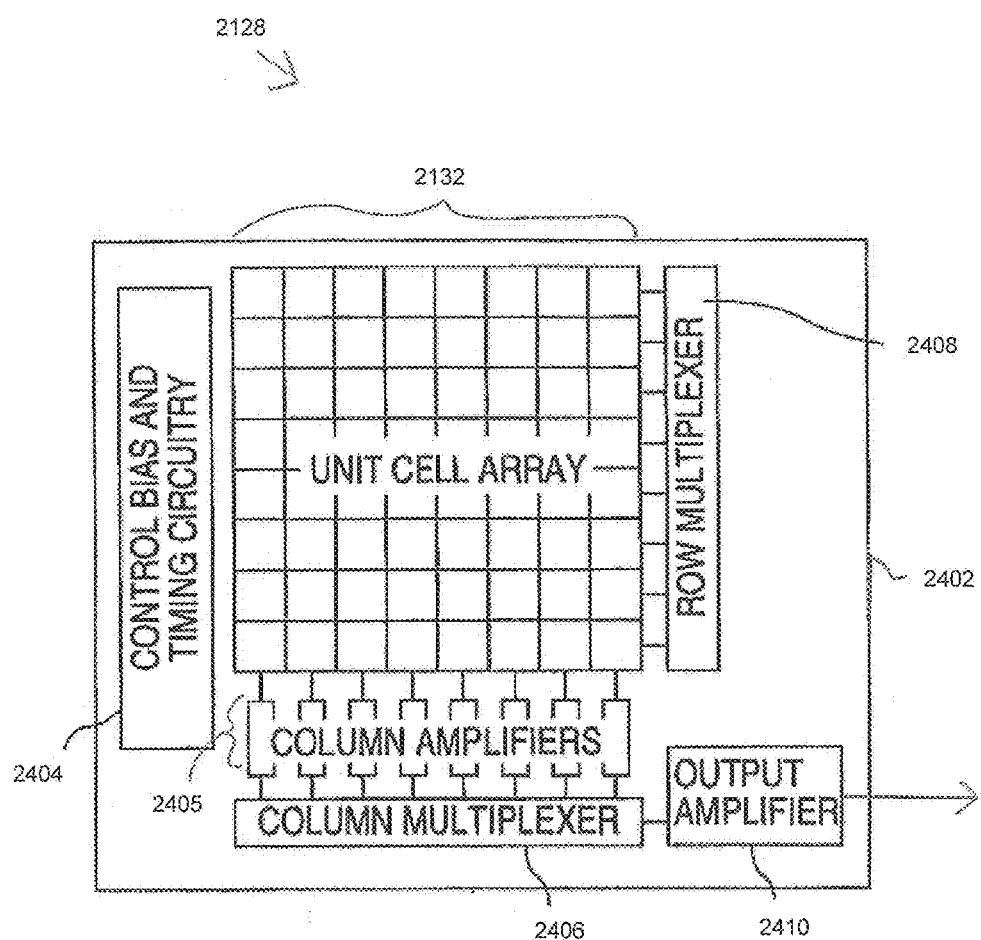
FIG. 15 illustrates a block diagram of an infrared sensor assembly including an array of infrared sensors in accordance with an embodiment of the disclosure.

FIG. 15 illustrates a block diagram of infrared sensor assembly 2128 including an array of infrared sensors 2132 in accordance with an embodiment of the disclosure. In the illustrated embodiment, infrared sensors 2132 are provided as part of a unit cell array of a ROIC 2402. ROIC 2402 includes bias generation and timing control circuitry 2404, column amplifiers 2405, a column multiplexer 2406, a row multiplexer 2408, and an output amplifier 2410. Image frames (e.g., thermal images) captured by infrared sensors 2132 may be provided by output amplifier 2410 to processing module 2160, processor 2195, and/or any other appropriate components to perform various processing techniques described herein. Although an 8 by 8 array is shown in FIG. 15, any desired array configuration may be used in other embodiments. Further descriptions of ROICs and infrared sensors (e.g., microbolometer circuits) may be found in U.S. Pat. No. 6,028,309 issued Feb. 22, 2000, which is incorporated herein by reference in its entirety.

Infrared sensor assembly 2128 may capture images (e.g., image frames) and provide such images from its ROIC at various rates. Processing module 2160 may be used to perform appropriate processing of captured infrared images and may be implemented in accordance with any appropriate architecture. In one embodiment, processing module 2160 may be implemented as an ASIC. In this regard, such an ASIC may be configured to perform image processing with high performance and/or high efficiency. In another embodiment, processing module 2160 may be implemented with a general purpose central processing unit (CPU) which may be configured to execute appropriate software instructions to perform image processing, coordinate and perform image processing with various image processing blocks, coordinate interfacing between processing module 2160 and host device 2102, and/or other operations. In yet another embodiment, processing module 2160 may be implemented with a field programmable gate array (FPGA). Processing module 2160 may be implemented with other types of processing and/or logic circuits in other embodiments as would be understood by one skilled in the art.

In these and other embodiments, processing module 2160 may also be implemented with other components where appropriate, such as, volatile memory, non-volatile memory, and/or one or more interfaces (e.g., infrared detector interfaces, inter-integrated circuit (I2C) interfaces, mobile industry processor interfaces (MIPI), joint test action group (JTAG) interfaces (e.g., IEEE 1149.1 standard test access port and boundary-scan architecture), and/or other interfaces).

In some embodiments, infrared imaging module 2100 may further include one or more actuators 2199 which may be used to adjust the focus of infrared image frames captured by infrared sensor assembly 2128. For example, actuators 2199 may be used to move optical element 2180, infrared sensors 2132, and/or other components relative to each other to selectively focus and defocus infrared image frames in accordance with techniques described herein. Actuators 2199 may be implemented in accordance with any type of motion-inducing apparatus or mechanism, and may positioned at any location within or external to infrared imaging module 2100 as appropriate for different applications.

When infrared imaging module 2100 is assembled, housing 2120 may substantially enclose infrared sensor assembly 2128, base 2150, and processing module 2160. Housing 2120 may facilitate connection of various components of infrared imaging module 2100. For example, in one embodiment, housing 2120 may provide electrical connections 2126 to connect various components as further described.

Electrical connections 2126 (e.g., conductive electrical paths, traces, or other types of connections) may be electrically connected with bond pads 2142 when infrared imaging module 2100 is assembled. In various embodiments, electrical connections 2126 may be embedded in housing 2120, provided on inside surfaces of housing 2120, and/or otherwise provided by housing 2120. Electrical connections 2126 may terminate in connections 2124 protruding from the bottom surface of housing 2120 as shown in FIG. 14. Connections 2124 may connect with circuit board 2170 when infrared imaging module 2100 is assembled (e.g., housing 2120 may rest atop circuit board 2170 in various embodiments). Processing module 2160 may be electrically connected with circuit board 2170 through appropriate electrical connections. As a result, infrared sensor assembly 2128 may be electrically connected with processing module 2160 through, for example, conductive electrical paths provided by: bond pads 2142, complementary connections on inside surfaces of housing 2120, electrical connections 2126 of housing 2120, connections 2124, and circuit board 2170. Advantageously, such an arrangement may be implemented without requiring wire bonds to be provided between infrared sensor assembly 2128 and processing module 2160.

In various embodiments, electrical connections 2126 in housing 2120 may be made from any desired material (e.g., copper or any other appropriate conductive material). In one embodiment, electrical connections 2126 may aid in dissipating heat from infrared imaging module 2100.

Other connections may be used in other embodiments. For example, in one embodiment, sensor assembly 2128 may be attached to processing module 2160 through a ceramic board that connects to sensor assembly 2128 by wire bonds and to processing module 2160 by a ball grid array (BGA). In another embodiment, sensor assembly 2128 may be mounted directly on a rigid flexible board and electrically connected with wire bonds, and processing module 2160 may be mounted and connected to the rigid flexible board with wire bonds or a BGA.

The various implementations of infrared imaging module 2100 and host device 2102 set forth herein are provided for purposes of example, rather than limitation. In this regard, any of the various techniques described herein may be applied to any infrared camera system, infrared imager, or other device for performing infrared/thermal imaging.

Substrate 2140 of infrared sensor assembly 2128 may be mounted on base 2150. In various embodiments, base 2150 (e.g., a pedestal) may be made, for example, of copper formed by metal injection molding (MIM) and provided with a black oxide or nickel-coated finish. In various embodiments, base 2150 may be made of any desired material, such as for example zinc, aluminum, or magnesium, as desired for a given application and may be formed by any desired applicable process, such as for example aluminum casting, MIM, or zinc rapid casting, as may be desired for particular applications. In various embodiments, base 2150 may be implemented to provide structural support, various circuit paths, thermal heat sink properties, and other features where appropriate. In one embodiment, base 2150 may be a multi-layer structure implemented at least in part using ceramic material.

In various embodiments, circuit board 2170 may receive housing 2120 and thus may physically support the various components of infrared imaging module 2100. In various embodiments, circuit board 2170 may be implemented as a printed circuit board (e.g., an FR4 circuit board or other types of circuit boards), a rigid or flexible interconnect (e.g., tape or other type of interconnects), a flexible circuit substrate, a flexible plastic substrate, or other appropriate structures. In various embodiments, base 2150 may be implemented with the various features and attributes described for circuit board 2170, and vice versa.

Socket 2104 may include a cavity 2106 configured to receive infrared imaging module 2100 (e.g., as shown in the assembled view of FIG. 13). Infrared imaging module 2100 and/or socket 2104 may include appropriate tabs, arms, pins, fasteners, or any other appropriate engagement members which may be used to secure infrared imaging module 2100 to or within socket 2104 using friction, tension, adhesion, and/or any other appropriate manner. Socket 2104 may include engagement members 2107 that may engage surfaces 2109 of housing 2120 when infrared imaging module 2100 is inserted into a cavity 2106 of socket 2104. Other types of engagement members may be used in other embodiments.

Infrared imaging module 2100 may be electrically connected with socket 2104 through appropriate electrical connections (e.g., contacts, pins, wires, or any other appropriate connections). For example, socket 2104 may include electrical connections 2108 which may contact corresponding electrical connections of infrared imaging module 2100 (e.g., interconnect pads, contacts, or other electrical connections on side or bottom surfaces of circuit board 2170, bond pads 2142 or other electrical connections on base 2150, or other connections). Electrical connections 2108 may be made from any desired material (e.g., copper or any other appropriate conductive material). In one embodiment, electrical connections 2108 may be mechanically biased to press against electrical connections of infrared imaging module 2100 when infrared imaging module 2100 is inserted into cavity 2106 of socket 2104. In one embodiment, electrical connections 2108 may at least partially secure infrared imaging module 2100 in socket 2104. Other types of electrical connections may be used in other embodiments.

Socket 2104 may be electrically connected with host device 2102 through similar types of electrical connections. For example, in one embodiment, host device 2102 may include electrical connections (e.g., soldered connections, snap-in connections, or other connections) that connect with electrical connections 2108 passing through apertures 2190. In various embodiments, such electrical connections may be made to the sides and/or bottom of socket 2104.

Various components of infrared imaging module 2100 may be implemented with flip chip technology which may be used to mount components directly to circuit boards without the additional clearances typically needed for wire bond connections. Flip chip connections may be used, as an example, to reduce the overall size of infrared imaging module 2100 for use in compact small form factor applications. For example, in one embodiment, processing module 2160 may be mounted to circuit board 2170 using flip chip connections. For example, infrared imaging module 2100 may be implemented with such flip chip configurations.

In various embodiments, infrared imaging module 2100 and/or associated components may be implemented in accordance with various techniques (e.g., wafer level packaging techniques) as set forth in U.S. patent application Ser. No. 12/844,124 filed Jul. 27, 2010, and U.S. Provisional Patent Application No. 61/469,651 filed Mar. 30, 2011, which are incorporated herein by reference in their entirety. Furthermore, in accordance with one or more embodiments, infrared imaging module 2100 and/or associated components may be implemented, calibrated, tested, and/or used in accordance with various techniques, such as for example as set forth in U.S. Pat. No. 7,470,902 issued Dec. 30, 2008, U.S. Pat. No. 6,028,309 issued Feb. 22, 2000, U.S. Pat. No. 6,812,465 issued Nov. 2, 2004, U.S. Pat. No. 7,034,301 issued Apr. 25, 2006, U.S. Pat. No. 7,679,048 issued Mar. 16, 2010, U.S. Pat. No. 7,470,904 issued Dec. 30, 2008, U.S. patent application Ser. No. 12/202,880 filed Sep. 2, 2008, and U.S. patent application Ser. No. 12/202,896 filed Sep. 2, 2008, which are incorporated herein by reference in their entirety.

In some embodiments, host device 2102 may include other components 2198 such as a non-thermal camera (e.g., a visible light camera or other type of non-thermal imager). The non-thermal camera may be a small form factor imaging module or imaging device, and may, in some embodiments, be implemented in a manner similar to the various embodiments of infrared imaging module 2100 disclosed herein, with one or more sensors and/or sensor arrays responsive to radiation in non-thermal spectrums (e.g., radiation in visible light wavelengths, ultraviolet wavelengths, and/or other non-thermal wavelengths). For example, in some embodiments, the non-thermal camera may be implemented with a charge-coupled device (CCD) sensor, an electron multiplying CCD (EMCCD) sensor, a complementary metal-oxide-semiconductor (CMOS) sensor, a scientific CMOS (sCMOS) sensor, or other filters and/or sensors.

In some embodiments, the non-thermal camera may be co-located with infrared imaging module 2100 and oriented such that a field-of-view (FoV) of the non-thermal camera at least partially overlaps a FoV of infrared imaging module 2100. In one example, infrared imaging module 2100 and a non-thermal camera may be implemented as a dual sensor module sharing a common substrate according to various techniques described in U.S. Provisional Patent Application No. 61/748,018 filed Dec. 31, 2012, which is incorporated herein by reference.

For embodiments having such a non-thermal light camera, various components (e.g., processor 2195, processing module 2160, and/or other processing component) may be configured to superimpose, fuse, blend, or otherwise combine infrared images (e.g., including thermal images) captured by infrared imaging module 2100 and non-thermal images (e.g., including visible light images) captured by a non-thermal camera, whether captured at substantially the same time or different times (e.g., time-spaced over hours, days, daytime versus nighttime, and/or otherwise).

In some embodiments, thermal and non-thermal images may be processed to generate combined images (e.g., one or more processes performed on such images in some embodiments). For example, scene-based NUC processing may be performed (as further described herein), true color processing may be performed, and/or high contrast processing may be performed.

Regarding true color processing, thermal images may be blended with non-thermal images by, for example, blending a radiometric component of a thermal image with a corresponding component of a non-thermal image according to a blending parameter, which may be adjustable by a user and/or machine in some embodiments. For example, luminance or chrominance components of the thermal and non-thermal images may be combined according to the blending parameter. In one embodiment, such blending techniques may be referred to as true color infrared imagery. For example, in daytime imaging, a blended image may comprise a non-thermal color image, which includes a luminance component and a chrominance component, with its luminance value replaced by the luminance value from a thermal image. The use of the luminance data from the thermal image causes the intensity of the true non-thermal color image to brighten or dim based on the temperature of the object. As such, these blending techniques provide thermal imaging for daytime or visible light images.

Regarding high contrast processing, high spatial frequency content may be obtained from one or more of the thermal and non-thermal images (e.g., by performing high pass filtering, difference imaging, and/or other techniques). A combined image may include a radiometric component of a thermal image and a blended component including infrared (e.g., thermal) characteristics of a scene blended with the high spatial frequency content, according to a blending parameter, which may be adjustable by a user and/or machine in some embodiments. In some embodiments, high spatial frequency content from non-thermal images may be blended with thermal images by superimposing the high spatial frequency content onto the thermal images, where the high spatial frequency content replaces or overwrites those portions of the thermal images corresponding to where the high spatial frequency content exists. For example, the high spatial frequency content may include edges of objects depicted in images of a scene, but may not exist within the interior of such objects. In such embodiments, blended image data may simply include the high spatial frequency content, which may subsequently be encoded into one or more components of combined images.

For example, a radiometric component of thermal image may be a chrominance component of the thermal image, and the high spatial frequency content may be derived from the luminance and/or chrominance components of a non-thermal image. In this embodiment, a combined image may include the radiometric component (e.g., the chrominance component of the thermal image) encoded into a chrominance component of the combined image and the high spatial frequency content directly encoded (e.g., as blended image data but with no thermal image contribution) into a luminance component of the combined image. By doing so, a radiometric calibration of the radiometric component of the thermal image may be retained. In similar embodiments, blended image data may include the high spatial frequency content added to a luminance component of the thermal images, and the resulting blended data encoded into a luminance component of resulting combined images.

For example, any of the techniques disclosed in the following applications may be used in various embodiments: U.S. patent application Ser. No. 12/477,828 filed Jun. 3, 2009; U.S. patent application Ser. No. 12/766,739 filed Apr. 23, 2010; U.S. patent application Ser. No. 13/105,765 filed May 11, 2011; U.S. patent application Ser. No. 13/437,645 filed Apr. 2, 2012; U.S. Provisional Patent Application No. 61/473,207 filed Apr. 8, 2011; U.S. Provisional Patent Application No. 61/746,069 filed Dec. 26, 2012; U.S. Provisional Patent Application No. 61/746,074 filed Dec. 26, 2012; U.S. Provisional Patent Application No. 61/748,018 filed Dec. 31, 2012; U.S. Provisional Patent Application No. 61/792,582 filed Mar. 15, 2013; U.S. Provisional Patent Application No. 61/793,952 filed Mar. 15, 2013; and International Patent Application No. PCT/EP2011/056432 filed Apr. 21, 2011, all of such applications are incorporated herein by reference in their entirety. Any of the techniques described herein, or described in other applications or patents referenced herein, may be applied to any of the various thermal devices, non-thermal devices, and uses described herein.

Referring again to FIG. 12, in various embodiments, host device 2102 may include shutter 2105. In this regard, shutter 2105 may be selectively positioned over socket 2104 (e.g., as identified by arrows 2103) while infrared imaging module 2100 is installed therein. In this regard, shutter 2105 may be used, for example, to protect infrared imaging module 2100 when not in use. Shutter 2105 may also be used as a temperature reference as part of a calibration process (e.g., a NUC process or other calibration processes) for infrared imaging module 2100 as would be understood by one skilled in the art.

In various embodiments, shutter 2105 may be made from various materials such as, for example, polymers, glass, aluminum (e.g., painted or anodized) or other materials. In various embodiments, shutter 2105 may include one or more coatings to selectively filter electromagnetic radiation and/or adjust various optical properties of shutter 2105 (e.g., a uniform blackbody coating or a reflective gold coating).

In another embodiment, shutter 2105 may be fixed in place to protect infrared imaging module 2100 at all times. In this case, shutter 2105 or a portion of shutter 2105 may be made from appropriate materials (e.g., polymers or infrared transmitting materials such as silicon, germanium, zinc selenide, or chalcogenide glasses) that do not substantially filter desired infrared wavelengths. In another embodiment, a shutter may be implemented as part of infrared imaging module 2100 (e.g., within or as part of a lens barrel or other components of infrared imaging module 2100), as would be understood by one skilled in the art.

Alternatively, in another embodiment, a shutter (e.g., shutter 2105 or other type of external or internal shutter) need not be provided, but rather a NUC process or other type of calibration may be performed using shutterless techniques. In another embodiment, a NUC process or other type of calibration using shutterless techniques may be performed in combination with shutter-based techniques.

Infrared imaging module 2100 and host device 2102 may be implemented in accordance with any of the various techniques set forth in U.S. Provisional Patent Application No. 61/495,873 filed Jun. 10, 2011, U.S. Provisional Patent Application No. 61/495,879 filed Jun. 10, 2011, and U.S. Provisional Patent Application No. 61/495,888 filed Jun. 10, 2011, which are incorporated herein by reference in their entirety.

In various embodiments, the components of host device 2102 and/or infrared imaging module 2100 may be implemented as a local or distributed system with components in communication with each other over wired and/or wireless networks. Accordingly, the various operations identified in this disclosure may be performed by local and/or remote components as may be desired in particular implementations.

Figure 16:
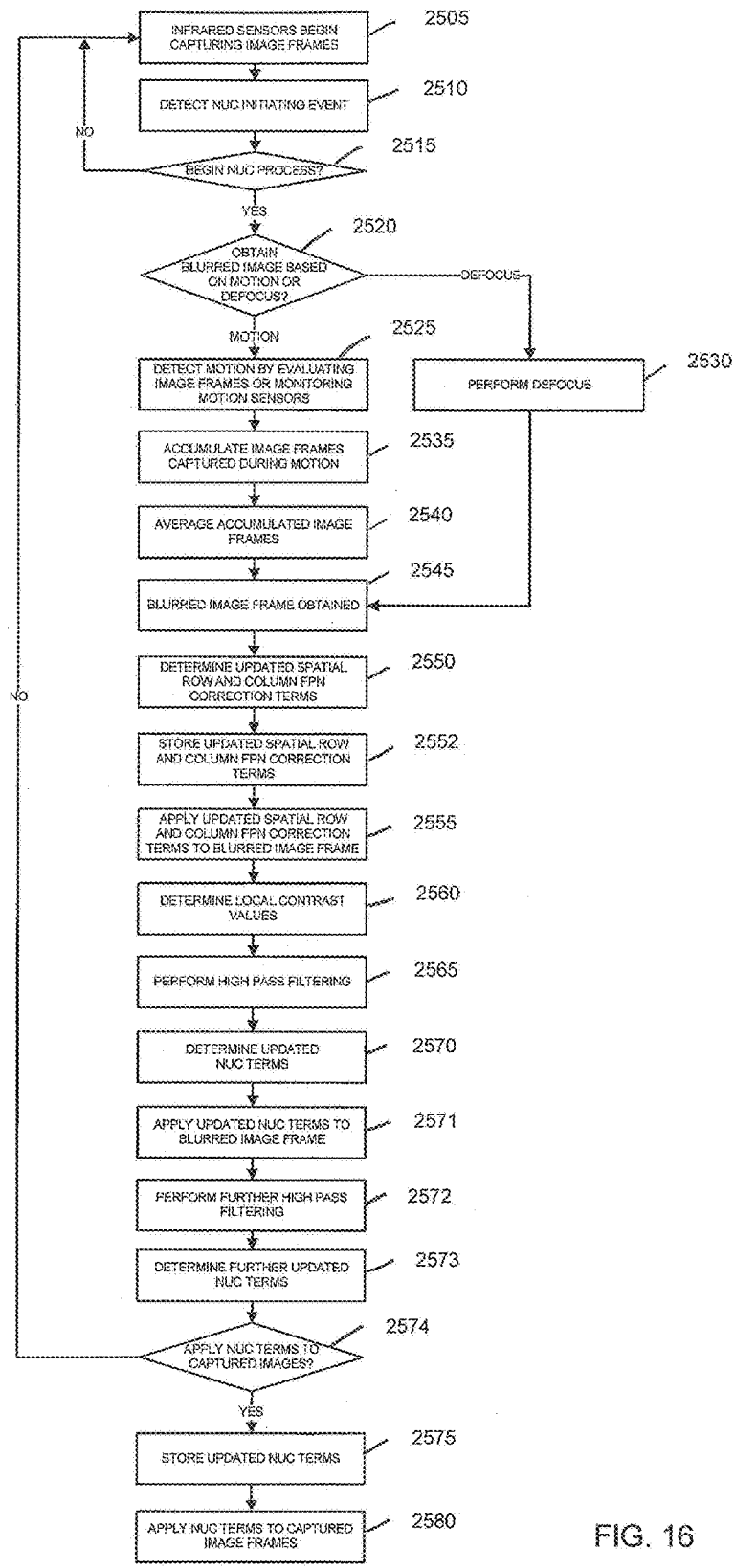
FIG. 16 illustrates a flow diagram of various operations to determine non-uniformity correction (NUC) terms in accordance with an embodiment of the disclosure.

FIG. 16 illustrates a flow diagram of various operations to determine NUC terms in accordance with an embodiment of the disclosure. In some embodiments, the operations of FIG. 16 may be performed by processing module 2160 or processor 2195 (both also generally referred to as a processor) operating on image frames captured by infrared sensors 2132.

In block 2505, infrared sensors 2132 begin capturing image frames of a scene. Typically, the scene will be the real world environment in which host device 2102 is currently located. In this regard, shutter 2105 (if optionally provided) may be opened to permit infrared imaging module to receive infrared radiation from the scene. Infrared sensors 2132 may continue capturing image frames during all operations shown in FIG. 16. In this regard, the continuously captured image frames may be used for various operations as further discussed. In one embodiment, the captured image frames may be temporally filtered (e.g., in accordance with the process of block 2826 further described herein with regard to FIG. 19) and be processed by other terms (e.g., factory gain terms 2812, factory offset terms 2816, previously determined NUC terms 2817, column FPN terms 2820, and row FPN terms 2824 as further described herein with regard to FIG. 19) before they are used in the operations shown in FIG. 16.

In block 2510, a NUC process initiating event is detected. In one embodiment, the NUC process may be initiated in response to physical movement of host device 2102. Such movement may be detected, for example, by motion sensors 2194 which may be polled by a processor. In one example, a user may move host device 2102 in a particular manner, such as by intentionally waving host device 2102 back and forth in an "erase" or "swipe" movement. In this regard, the user may move host device 2102 in accordance with a predetermined speed and direction (velocity), such as in an up and down, side to side, or other pattern to initiate the NUC process. In this example, the use of such movements may permit the user to intuitively operate host device 2102 to simulate the "erasing" of noise in captured image frames.

In another example, a NUC process may be initiated by host device 2102 if motion exceeding a threshold value is detected (e.g., motion greater than expected for ordinary use). It is contemplated that any desired type of spatial translation of host device 2102 may be used to initiate the NUC process.

In yet another example, a NUC process may be initiated by host device 2102 if a minimum time has elapsed since a previously performed NUC process. In a further example, a NUC process may be initiated by host device 2102 if infrared imaging module 2100 has experienced a minimum temperature change since a previously performed NUC process. In a still further example, a NUC process may be continuously initiated and repeated.

In block 2515, after a NUC process initiating event is detected, it is determined whether the NUC process should actually be performed. In this regard, the NUC process may be selectively initiated based on whether one or more additional conditions are met. For example, in one embodiment, the NUC process may not be performed unless a minimum time has elapsed since a previously performed NUC process. In another embodiment, the NUC process may not be performed unless infrared imaging module 2100 has experienced a minimum temperature change since a previously performed NUC process. Other criteria or conditions may be used in other embodiments. If appropriate criteria or conditions have been met, then the flow diagram continues to block 2520. Otherwise, the flow diagram returns to block 2505.

In the NUC process, blurred image frames may be used to determine NUC terms which may be applied to captured image frames to correct for FPN. As discussed, in one embodiment, the blurred image frames may be obtained by accumulating multiple image frames of a moving scene (e.g., captured while the scene and/or the thermal imager is in motion). In another embodiment, the blurred image frames may be obtained by defocusing an optical element or other component of the thermal imager.

Accordingly, in block 2520 a choice of either approach is provided. If the motion-based approach is used, then the flow diagram continues to block 2525. If the defocus-based approach is used, then the flow diagram continues to block 2530.

Referring now to the motion-based approach, in block 2525 motion is detected. For example, in one embodiment, motion may be detected based on the image frames captured by infrared sensors 2132. In this regard, an appropriate motion detection process (e.g., an image registration process, a frame-to-frame difference calculation, or other appropriate process) may be applied to captured image frames to determine whether motion is present (e.g., whether static or moving image frames have been captured). For example, in one embodiment, it can be determined whether pixels or regions around the pixels of consecutive image frames have changed more than a user defined amount (e.g., a percentage and/or threshold value). If at least a given percentage of pixels have changed by at least the user defined amount, then motion will be detected with sufficient certainty to proceed to block 2535.

In another embodiment, motion may be determined on a per pixel basis, wherein only pixels that exhibit significant changes are accumulated to provide the blurred image frame. For example, counters may be provided for each pixel and used to ensure that the same number of pixel values are accumulated for each pixel, or used to average the pixel values based on the number of pixel values actually accumulated for each pixel. Other types of image-based motion detection may be performed such as performing a Radon transform.

In another embodiment, motion may be detected based on data provided by motion sensors 2194. In one embodiment, such motion detection may include detecting whether host device 2102 is moving along a relatively straight trajectory through space. For example, if host device 2102 is moving along a relatively straight trajectory, then it is possible that certain objects appearing in the imaged scene may not be sufficiently blurred (e.g., objects in the scene that may be aligned with or moving substantially parallel to the straight trajectory). Thus, in such an embodiment, the motion detected by motion sensors 2194 may be conditioned on host device 2102 exhibiting, or not exhibiting, particular trajectories.

In yet another embodiment, both a motion detection process and motion sensors 2194 may be used. Thus, using any of these various embodiments, a determination can be made as to whether or not each image frame was captured while at least a portion of the scene and host device 2102 were in motion relative to each other (e.g., which may be caused by host device 2102 moving relative to the scene, at least a portion of the scene moving relative to host device 2102, or both).

It is expected that the image frames for which motion was detected may exhibit some secondary blurring of the captured scene (e.g., blurred thermal image data associated with the scene) due to the thermal time constants of infrared sensors 2132 (e.g., microbolometer thermal time constants) interacting with the scene movement.

In block 2535, image frames for which motion was detected are accumulated. For example, if motion is detected for a continuous series of image frames, then the image frames of the series may be accumulated. As another example, if motion is detected for only some image frames, then the non-moving image frames may be skipped and not included in the accumulation. Thus, a continuous or discontinuous set of image frames may be selected to be accumulated based on the detected motion.

In block 2540, the accumulated image frames are averaged to provide a blurred image frame. Because the accumulated image frames were captured during motion, it is expected that actual scene information will vary between the image frames and thus cause the scene information to be further blurred in the resulting blurred image frame (block 2545).

In contrast, FPN (e.g., caused by one or more components of infrared imaging module 2100) will remain fixed over at least short periods of time and over at least limited changes in scene irradiance during motion. As a result, image frames captured in close proximity in time and space during motion will suffer from identical or at least very similar FPN. Thus, although scene information may change in consecutive image frames, the FPN will stay essentially constant. By averaging, multiple image frames captured during motion will blur the scene information, but will not blur the FPN. As a result, FPN will remain more clearly defined in the blurred image frame provided in block 2545 than the scene information.

In one embodiment, 32 or more image frames are accumulated and averaged in blocks 2535 and 2540. However, any desired number of image frames may be used in other embodiments, but with generally decreasing correction accuracy as frame count is decreased.

Referring now to the defocus-based approach, in block 2530, a defocus operation may be performed to intentionally defocus the image frames captured by infrared sensors 2132. For example, in one embodiment, one or more actuators 2199 may be used to adjust, move, or otherwise translate optical element 2180, infrared sensor assembly 2128, and/or other components of infrared imaging module 2100 to cause infrared sensors 2132 to capture a blurred (e.g., unfocused) image frame of the scene. Other non-actuator based techniques are also contemplated for intentionally defocusing infrared image frames such as, for example, manual (e.g., user-initiated) defocusing.

Although the scene may appear blurred in the image frame, FPN (e.g., caused by one or more components of infrared imaging module 2100) will remain unaffected by the defocusing operation. As a result, a blurred image frame of the scene will be provided (block 2545) with FPN remaining more clearly defined in the blurred image than the scene information.

In the above discussion, the defocus-based approach has been described with regard to a single captured image frame. In another embodiment, the defocus-based approach may include accumulating multiple image frames while the infrared imaging module 2100 has been defocused and averaging the defocused image frames to remove the effects of temporal noise and provide a blurred image frame in block 2545.

Thus, it will be appreciated that a blurred image frame may be provided in block 2545 by either the motion-based approach or the defocus-based approach. Because much of the scene information will be blurred by either motion, defocusing, or both, the blurred image frame may be effectively considered a low pass filtered version of the original captured image frames with respect to scene information.

In block 2550, the blurred image frame is processed to determine updated row and column FPN terms (e.g., if row and column FPN terms have not been previously determined then the updated row and column FPN terms may be new row and column FPN terms in the first iteration of block 2550). As used in this disclosure, the terms row and column may be used interchangeably depending on the orientation of infrared sensors 2132 and/or other components of infrared imaging module 2100.

In one embodiment, block 2550 includes determining a spatial FPN correction term for each row of the blurred image frame (e.g., each row may have its own spatial FPN correction term), and also determining a spatial FPN correction term for each column of the blurred image frame (e.g., each column may have its own spatial FPN correction term). Such processing may be used to reduce the spatial and slowly varying (1/f) row and column FPN inherent in thermal imagers caused by, for example, 1/f noise characteristics of amplifiers in ROIC 2402 which may manifest as vertical and horizontal stripes in image frames.

Advantageously, by determining spatial row and column FPN terms using the blurred image frame, there will be a reduced risk of vertical and horizontal objects in the actual imaged scene from being mistaken for row and column noise (e.g., real scene content will be blurred while FPN remains unblurred).

Figure 17:
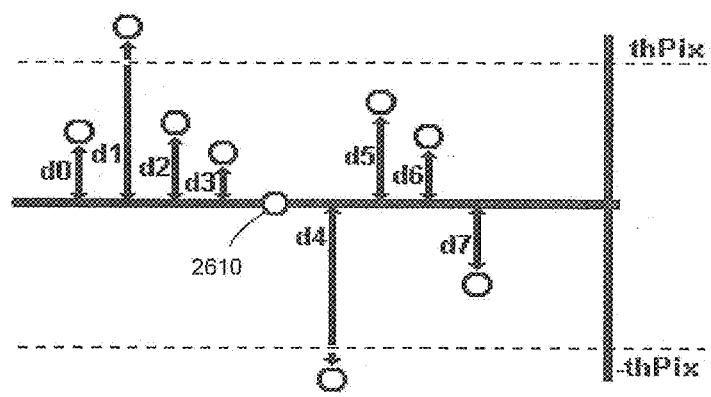
FIG. 17 illustrates differences between neighboring pixels in accordance with an embodiment of the disclosure.

In one embodiment, row and column FPN terms may be determined by considering differences between neighboring pixels of the blurred image frame. For example, FIG. 17 illustrates differences between neighboring pixels in accordance with an embodiment of the disclosure. Specifically, in FIG. 17 a pixel 2610 is compared to its 8 nearest horizontal neighbors: d0-d3 on one side and d4-d7 on the other side. Differences between the neighbor pixels can be averaged to obtain an estimate of the offset error of the illustrated group of pixels. An offset error may be calculated for each pixel in a row or column and the average result may be used to correct the entire row or column.

To prevent real scene data from being interpreted as noise, upper and lower threshold values may be used (thPix and −thPix). Pixel values falling outside these threshold values (pixels d1 and d4 in this example) are not used to obtain the offset error. In addition, the maximum amount of row and column FPN correction may be limited by these threshold values.

Further techniques for performing spatial row and column FPN correction processing are set forth in U.S. patent application Ser. No. 12/396,340 filed Mar. 2, 2009 which is incorporated herein by reference in its entirety.

Referring again to FIG. 16, the updated row and column FPN terms determined in block 2550 are stored (block 2552) and applied (block 2555) to the blurred image frame provided in block 2545. After these terms are applied, some of the spatial row and column FPN in the blurred image frame may be reduced. However, because such terms are applied generally to rows and columns, additional FPN may remain such as spatially uncorrelated FPN associated with pixel to pixel drift or other causes. Neighborhoods of spatially correlated FPN may also remain which may not be directly associated with individual rows and columns. Accordingly, further processing may be performed as discussed below to determine NUC terms.

In block 2560, local contrast values (e.g., edges or absolute values of gradients between adjacent or small groups of pixels) in the blurred image frame are determined. If scene information in the blurred image frame includes contrasting areas that have not been significantly blurred (e.g., high contrast edges in the original scene data), then such features may be identified by a contrast determination process in block 2560.

For example, local contrast values in the blurred image frame may be calculated, or any other desired type of edge detection process may be applied to identify certain pixels in the blurred image as being part of an area of local contrast. Pixels that are marked in this manner may be considered as containing excessive high spatial frequency scene information that would be interpreted as FPN (e.g., such regions may correspond to portions of the scene that have not been sufficiently blurred). As such, these pixels may be excluded from being used in the further determination of NUC terms. In one embodiment, such contrast detection processing may rely on a threshold that is higher than the expected contrast value associated with FPN (e.g., pixels exhibiting a contrast value higher than the threshold may be considered to be scene information, and those lower than the threshold may be considered to be exhibiting FPN).

In one embodiment, the contrast determination of block 2560 may be performed on the blurred image frame after row and column FPN terms have been applied to the blurred image frame (e.g., as shown in FIG. 16). In another embodiment, block 2560 may be performed prior to block 2550 to determine contrast before row and column FPN terms are determined (e.g., to prevent scene based contrast from contributing to the determination of such terms).

Following block 2560, it is expected that any high spatial frequency content remaining in the blurred image frame may be generally attributed to spatially uncorrelated FPN. In this regard, following block 2560, much of the other noise or actual desired scene based information has been removed or excluded from the blurred image frame due to: intentional blurring of the image frame (e.g., by motion or defocusing in blocks 2520 through 2545), application of row and column FPN terms (block 2555), and contrast determination (block 2560).

Thus, it can be expected that following block 2560, any remaining high spatial frequency content (e.g., exhibited as areas of contrast or differences in the blurred image frame) may be attributed to spatially uncorrelated FPN. Accordingly, in block 2565, the blurred image frame is high pass filtered. In one embodiment, this may include applying a high pass filter to extract the high spatial frequency content from the blurred image frame. In another embodiment, this may include applying a low pass filter to the blurred image frame and taking a difference between the low pass filtered image frame and the unfiltered blurred image frame to obtain the high spatial frequency content. In accordance with various embodiments of the present disclosure, a high pass filter may be implemented by calculating a mean difference between a sensor signal (e.g., a pixel value) and its neighbors.

In block 2570, a flat field correction process is performed on the high pass filtered blurred image frame to determine updated NUC terms (e.g., if a NUC process has not previously been performed then the updated NUC terms may be new NUC terms in the first iteration of block 2570).

Figure 18:
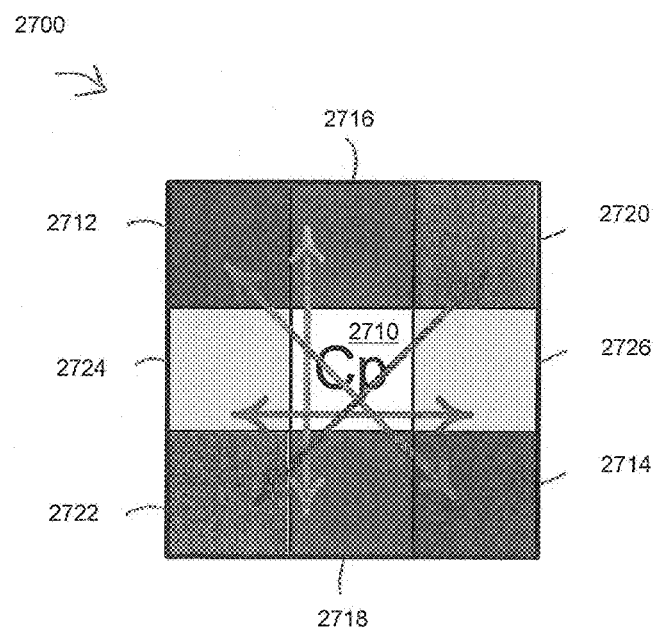
FIG. 18 illustrates a flat field correction technique in accordance with an embodiment of the disclosure.

For example, FIG. 18 illustrates a flat field correction technique 2700 in accordance with an embodiment of the disclosure. In FIG. 18, a NUC term may be determined for each pixel 2710 of the blurred image frame using the values of its neighboring pixels 2712 to 2726. For each pixel 2710, several gradients may be determined based on the absolute difference between the values of various adjacent pixels. For example, absolute value differences may be determined between: pixels 2712 and 2714 (a left to right diagonal gradient), pixels 2716 and 2718 (a top to bottom vertical gradient), pixels 2720 and 2722 (a right to left diagonal gradient), and pixels 2724 and 2726 (a left to right horizontal gradient).

These absolute differences may be summed to provide a summed gradient for pixel 2710. A weight value may be determined for pixel 2710 that is inversely proportional to the summed gradient. This process may be performed for all pixels 2710 of the blurred image frame until a weight value is provided for each pixel 2710. For areas with low gradients (e.g., areas that are blurry or have low contrast), the weight value will be close to one. Conversely, for areas with high gradients, the weight value will be zero or close to zero. The update to the NUC term as estimated by the high pass filter is multiplied with the weight value.

In one embodiment, the risk of introducing scene information into the NUC terms can be further reduced by applying some amount of temporal damping to the NUC term determination process. For example, a temporal damping factor $\lambda$ between 0 and 1 may be chosen such that the new NUC term ($NUC_{NEW}$) stored is a weighted average of the old NUC term ($NUC_{OLD}$) and the estimated updated NUC term ($NUC_{UPDATE}$). In one embodiment, this can be expressed as $NUC_{NEW} = \lambda \cdot NUC_{OLD} + (1-\lambda) \cdot (NUC_{OLD} + NUC_{UPDATE})$.

Although the determination of NUC terms has been described with regard to gradients, local contrast values may be used instead where appropriate. Other techniques may also be used such as, for example, standard deviation calculations. Other types flat field correction processes may be performed to determine NUC terms including, for example, various processes identified in U.S. Pat. No. 6,028,309 issued Feb. 22, 2000, U.S. Pat. No. 6,812,465 issued Nov. 2, 2004, and U.S. patent application Ser. No. 12/114,865 filed May 5, 2008, which are incorporated herein by reference in their entirety.

Referring again to FIG. 16, block 2570 may include additional processing of the NUC terms. For example, in one embodiment, to preserve the scene signal mean, the sum of all NUC terms may be normalized to zero by subtracting the NUC term mean from each NUC term. Also in block 2570, to avoid row and column noise from affecting the NUC terms, the mean value of each row and column may be subtracted from the NUC terms for each row and column. As a result, row and column FPN filters using the row and column FPN terms determined in block 2550 may be better able to filter out row and column noise in further iterations (e.g., as further shown in FIG. 19) after the NUC terms are applied to captured images (e.g., in block 2580 further discussed herein). In this regard, the row and column FPN filters may in general use more data to calculate the per row and per column offset coefficients (e.g., row and column FPN terms) and may thus provide a more robust alternative for reducing spatially correlated FPN than the NUC terms which are based on high pass filtering to capture spatially uncorrelated noise.

In blocks 2571-2573, additional high pass filtering and further determinations of updated NUC terms may be optionally performed to remove spatially correlated FPN with lower spatial frequency than previously removed by row and column FPN terms. In this regard, some variability in infrared sensors 2132 or other components of infrared imaging module 2100 may result in spatially correlated FPN noise that cannot be easily modeled as row or column noise. Such spatially correlated FPN may include, for example, window defects on a sensor package or a cluster of infrared sensors 2132 that respond differently to irradiance than neighboring infrared sensors 2132. In one embodiment, such spatially correlated FPN may be mitigated with an offset correction. If the amount of such spatially correlated FPN is significant, then the noise may also be detectable in the blurred image frame. Since this type of noise may affect a neighborhood of pixels, a high pass filter with a small kernel may not detect the FPN in the neighborhood (e.g., all values used in high pass filter may be taken from the neighborhood of affected pixels and thus may be affected by the same offset error). For example, if the high pass filtering of block 2565 is performed with a small kernel (e.g., considering only immediately adjacent pixels that fall within a neighborhood of pixels affected by spatially correlated FPN), then broadly distributed spatially correlated FPN may not be detected.

Figure 22:
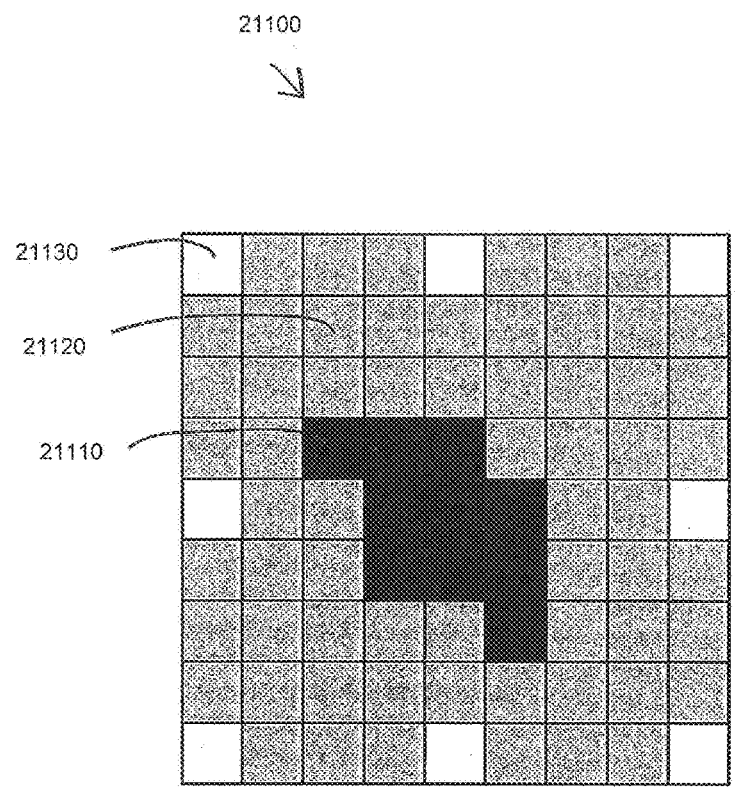
FIG. 22 illustrates spatially correlated fixed pattern noise (FPN) in a neighborhood of pixels in accordance with an embodiment of the disclosure.

For example, FIG. 22 illustrates spatially correlated FPN in a neighborhood of pixels in accordance with an embodiment of the disclosure. As shown in a sample image frame 21100, a neighborhood of pixels 21110 may exhibit spatially correlated FPN that is not precisely correlated to individual rows and columns and is distributed over a neighborhood of several pixels (e.g., a neighborhood of approximately 4 by 4 pixels in this example). Sample image frame 21100 also includes a set of pixels 21120 exhibiting substantially uniform response that are not used in filtering calculations, and a set of pixels 21130 that are used to estimate a low pass value for the neighborhood of pixels 21110. In one embodiment, pixels 21130 may be a number of pixels divisible by two in order to facilitate efficient hardware or software calculations.

Referring again to FIG. 16, in blocks 2571-2573, additional high pass filtering and further determinations of updated NUC terms may be optionally performed to remove spatially correlated FPN such as exhibited by pixels 21110. In block 2571, the updated NUC terms determined in block 2570 are applied to the blurred image frame. Thus, at this time, the blurred image frame will have been initially corrected for spatially correlated FPN (e.g., by application of the updated row and column FPN terms in block 2555), and also initially corrected for spatially uncorrelated FPN (e.g., by application of the updated NUC terms applied in block 2571).

In block 2572, a further high pass filter is applied with a larger kernel than was used in block 2565, and further updated NUC terms may be determined in block 2573. For example, to detect the spatially correlated FPN present in pixels 21110, the high pass filter applied in block 2572 may include data from a sufficiently large enough neighborhood of pixels such that differences can be determined between unaffected pixels (e.g., pixels 21120) and affected pixels (e.g., pixels 21110). For example, a low pass filter with a large kernel can be used (e.g., an N by N kernel that is much greater than 3 by 3 pixels) and the results may be subtracted to perform appropriate high pass filtering.

In one embodiment, for computational efficiency, a sparse kernel may be used such that only a small number of neighboring pixels inside an N by N neighborhood are used. For any given high pass filter operation using distant neighbors (e.g., a large kernel), there is a risk of modeling actual (potentially blurred) scene information as spatially correlated FPN. Accordingly, in one embodiment, the temporal damping factor λ may be set close to 1 for updated NUC terms determined in block 2573.

In various embodiments, blocks 2571-2573 may be repeated (e.g., cascaded) to iteratively perform high pass filtering with increasing kernel sizes to provide further updated NUC terms further correct for spatially correlated FPN of desired neighborhood sizes. In one embodiment, the decision to perform such iterations may be determined by whether spatially correlated FPN has actually been removed by the updated NUC terms of the previous performance of blocks 2571-2573.

After blocks 2571-2573 are finished, a decision is made regarding whether to apply the updated NUC terms to captured image frames (block 2574). For example, if an average of the absolute value of the NUC terms for the entire image frame is less than a minimum threshold value, or greater than a maximum threshold value, the NUC terms may be deemed spurious or unlikely to provide meaningful correction. Alternatively, thresholding criteria may be applied to individual pixels to determine which pixels receive updated NUC terms. In one embodiment, the threshold values may correspond to differences between the newly calculated NUC terms and previously calculated NUC terms. In another embodiment, the threshold values may be independent of previously calculated NUC terms. Other tests may be applied (e.g., spatial correlation tests) to determine whether the NUC terms should be applied.

If the NUC terms are deemed spurious or unlikely to provide meaningful correction, then the flow diagram returns to block 2505. Otherwise, the newly determined NUC terms are stored (block 2575) to replace previous NUC terms (e.g., determined by a previously performed iteration of FIG. 16) and applied (block 2580) to captured image frames.

Figure 19:
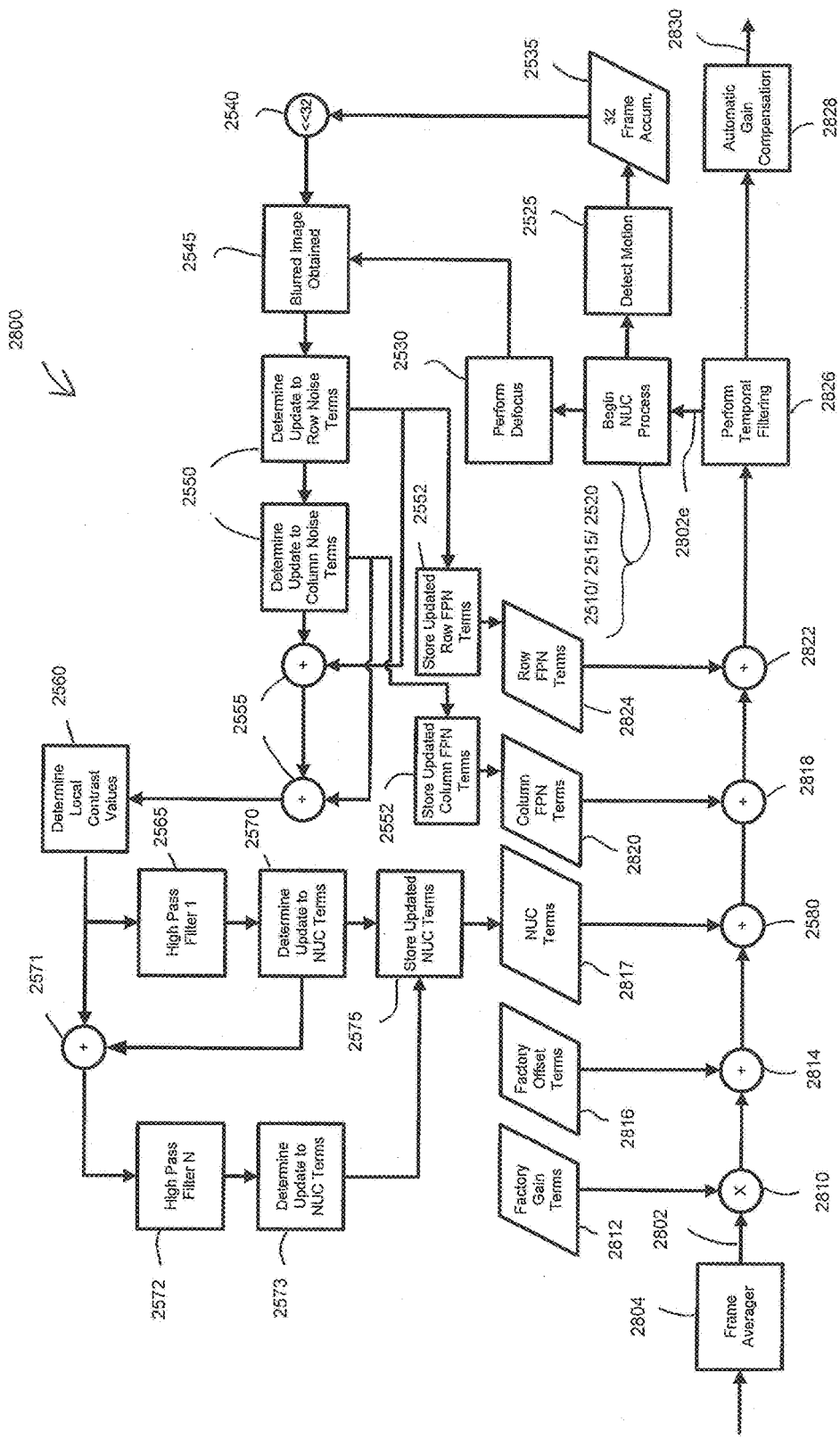
FIG. 19 illustrates various image processing techniques of FIG. 16 and other operations applied in an image processing pipeline in accordance with an embodiment of the disclosure.

FIG. 19 illustrates various image processing techniques of FIG. 16 and other operations applied in an image processing pipeline 2800 in accordance with an embodiment of the disclosure. In this regard, pipeline 2800 identifies various operations of FIG. 16 in the context of an overall iterative image processing scheme for correcting image frames provided by infrared imaging module 2100. In some embodiments, pipeline 2800 may be provided by processing module 2160 or processor 2195 (both also generally referred to as a processor) operating on image frames captured by infrared sensors 2132.

Image frames captured by infrared sensors 2132 may be provided to a frame averager 2804 that integrates multiple image frames to provide image frames 2802 with an improved signal to noise ratio. Frame averager 2804 may be effectively provided by infrared sensors 2132, ROIC 2402, and other components of infrared sensor assembly 2128 that are implemented to support high image capture rates. For example, in one embodiment, infrared sensor assembly 2128 may capture infrared image frames at a frame rate of 240 Hz (e.g., 240 images per second). In this embodiment, such a high frame rate may be implemented, for example, by operating infrared sensor assembly 2128 at relatively low voltages (e.g., compatible with mobile telephone voltages) and by using a relatively small array of infrared sensors 2132 (e.g., an array of 64 by 64 infrared sensors in one embodiment).

In one embodiment, such infrared image frames may be provided from infrared sensor assembly 2128 to processing module 2160 at a high frame rate (e.g., 240 Hz or other frame rates). In another embodiment, infrared sensor assembly 2128 may integrate over longer time periods, or multiple time periods, to provide integrated (e.g., averaged) infrared image frames to processing module 2160 at a lower frame rate (e.g., 30 Hz, 9 Hz, or other frame rates). Further information regarding implementations that may be used to provide high image capture rates may be found in U.S. Provisional Patent Application No. 61/495,879 filed Jun. 10, 2011 which is incorporated herein by reference in its entirety.

Image frames 2802 proceed through pipeline 2800 where they are adjusted by various terms, temporally filtered, used to determine the various adjustment terms, and gain compensated.

In blocks 2810 and 2814, factory gain terms 2812 and factory offset terms 2816 are applied to image frames 2802 to compensate for gain and offset differences, respectively, between the various infrared sensors 2132 and/or other components of infrared imaging module 2100 determined during manufacturing and testing.

In block 2580, NUC terms 2817 are applied to image frames 2802 to correct for FPN as discussed. In one embodiment, if NUC terms 2817 have not yet been determined (e.g., before a NUC process has been initiated), then block 2580 may not be performed or initialization values may be used for NUC terms 2817 that result in no alteration to the image data (e.g., offsets for every pixel would be equal to zero).

In blocks 2818 and 2822, column FPN terms 2820 and row FPN terms 2824, respectively, are applied to image frames 2802. Column FPN terms 2820 and row FPN terms 2824 may be determined in accordance with block 2550 as discussed. In one embodiment, if the column FPN terms 2820 and row FPN terms 2824 have not yet been determined (e.g., before a NUC process has been initiated), then blocks 2818 and 2822 may not be performed or initialization values may be used for the column FPN terms 2820 and row FPN terms 2824 that result in no alteration to the image data (e.g., offsets for every pixel would be equal to zero).

Figure 20:
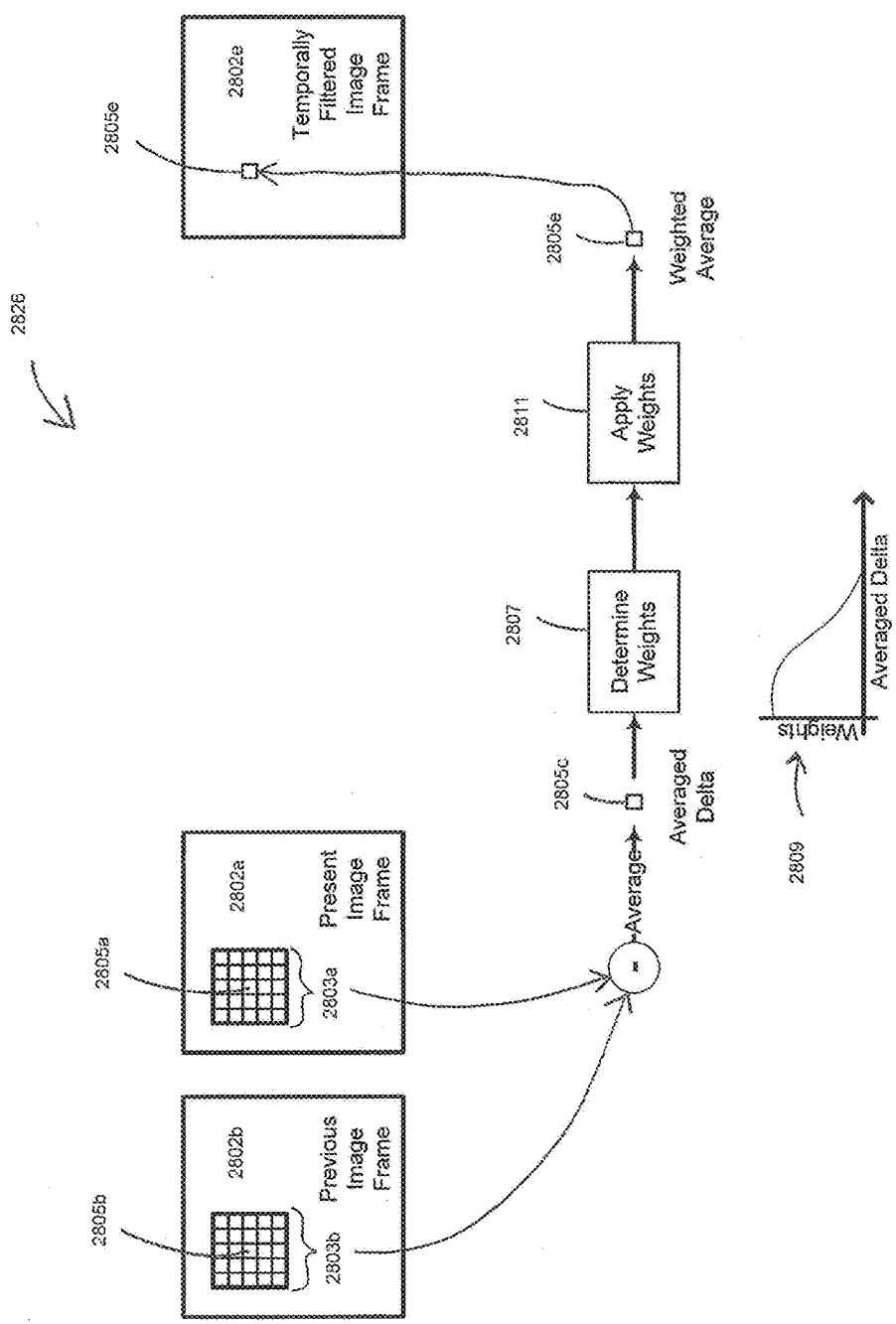
FIG. 20 illustrates a temporal noise reduction process in accordance with an embodiment of the disclosure.

In block 2826, temporal filtering is performed on image frames 2802 in accordance with a temporal noise reduction (TNR) process. FIG. 20 illustrates a TNR process in accordance with an embodiment of the disclosure. In FIG. 20, a presently received image frame 2802a and a previously temporally filtered image frame 2802b are processed to determine a new temporally filtered image frame 2802e. Image frames 2802a and 2802b include local neighborhoods of pixels 2803a and 2803b centered around pixels 2805a and 2805b, respectively. Neighborhoods 2803a and 2803b correspond to the same locations within image frames 2802a and 2802b and are subsets of the total pixels in image frames 2802a and 2802b. In the illustrated embodiment, neighborhoods 2803a and 2803b include areas of 5 by 5 pixels. Other neighborhood sizes may be used in other embodiments.

Differences between corresponding pixels of neighborhoods 2803a and 2803b are determined and averaged to provide an averaged delta value 2805c for the location corresponding to pixels 2805a and 2805b. Averaged delta value 2805c may be used to determine weight values in block 2807 to be applied to pixels 2805a and 2805b of image frames 2802a and 2802b.

In one embodiment, as shown in graph 2809, the weight values determined in block 2807 may be inversely proportional to averaged delta value 2805c such that weight values drop rapidly towards zero when there are large differences between neighborhoods 2803a and 2803b. In this regard, large differences between neighborhoods 2803a and 2803b may indicate that changes have occurred within the scene (e.g., due to motion) and pixels 2802a and 2802b may be appropriately weighted, in one embodiment, to avoid introducing blur across frame-to-frame scene changes. Other associations between weight values and averaged delta value 2805c may be used in various embodiments.

The weight values determined in block 2807 may be applied to pixels 2805a and 2805b to determine a value for corresponding pixel 2805e of image frame 2802e (block 2811). In this regard, pixel 2805e may have a value that is a weighted average (or other combination) of pixels 2805a and 2805b, depending on averaged delta value 2805c and the weight values determined in block 2807.

For example, pixel 2805e of temporally filtered image frame 2802e may be a weighted sum of pixels 2805a and 2805b of image frames 2802a and 2802b. If the average difference between pixels 2805a and 2805b is due to noise, then it may be expected that the average change between neighborhoods 2805a and 2805b will be close to zero (e.g., corresponding to the average of uncorrelated changes). Under such circumstances, it may be expected that the sum of the differences between neighborhoods 2805a and 2805b will be close to zero. In this case, pixel 2805a of image frame 2802a may both be appropriately weighted so as to contribute to the value of pixel 2805e.

However, if the sum of such differences is not zero (e.g., even differing from zero by a small amount in one embodiment), then the changes may be interpreted as being attributed to motion instead of noise. Thus, motion may be detected based on the average change exhibited by neighborhoods 2805a and 2805b. Under these circumstances, pixel 2805a of image frame 2802a may be weighted heavily, while pixel 2805b of image frame 2802b may be weighted lightly.

Other embodiments are also contemplated. For example, although averaged delta value 2805c has been described as being determined based on neighborhoods 2805a and 2805b, in other embodiments averaged delta value 2805c may be determined based on any desired criteria (e.g., based on individual pixels or other types of groups of sets of pixels).

In the above embodiments, image frame 2802a has been described as a presently received image frame and image frame 2802b has been described as a previously temporally filtered image frame. In another embodiment, image frames 2802a and 2802b may be first and second image frames captured by infrared imaging module 2100 that have not been temporally filtered.

Figure 21:
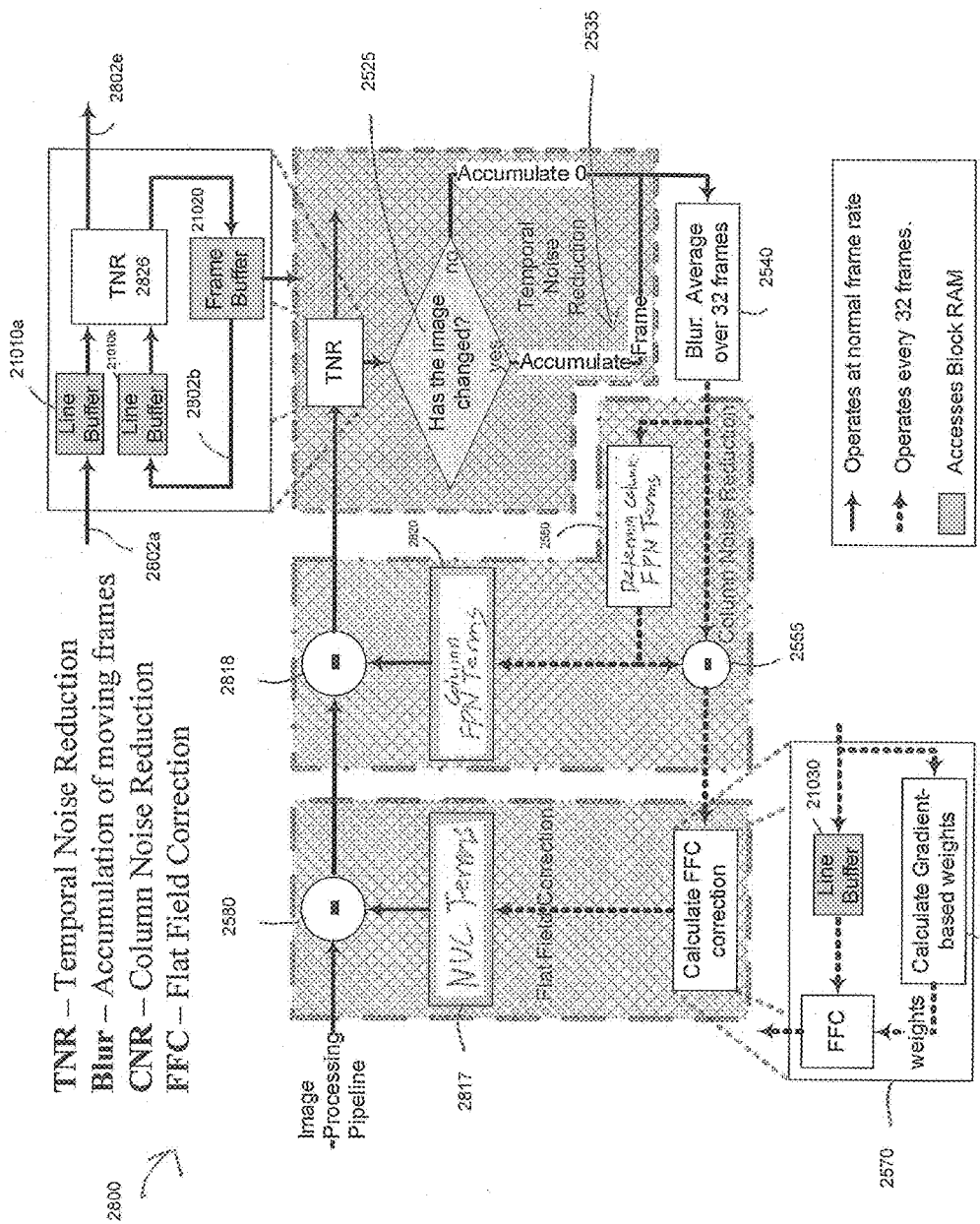
FIG. 21 illustrates particular implementation details of several processes of the image processing pipeline of FIG. 19 in accordance with an embodiment of the disclosure.

FIG. 21 illustrates further implementation details in relation to the TNR process of block 2826. As shown in FIG. 21, image frames 2802a and 2802b may be read into line buffers 21010a and 21010b, respectively, and image frame 2802b (e.g., the previous image frame) may be stored in a frame buffer 21020 before being read into line buffer 21010b. In one embodiment, line buffers 21010a-b and frame buffer 21020 may be implemented by a block of random access memory (RAM) provided by any appropriate component of infrared imaging module 2100 and/or host device 2102.

Referring again to FIG. 19, image frame 2802e may be passed to an automatic gain compensation block 2828 for further processing to provide a result image frame 2830 that may be used by host device 2102 as desired.

FIG. 19 further illustrates various operations that may be performed to determine row and column FPN terms and NUC terms as discussed. In one embodiment, these operations may use image frames 2802e as shown in FIG. 19. Because image frames 2802e have already been temporally filtered, at least some temporal noise may be removed and thus will not inadvertently affect the determination of row and column FPN terms 2824 and 2820 and NUC terms 2817. In another embodiment, non-temporally filtered image frames 2802 may be used.

In FIG. 19, blocks 2510, 2515, and 2520 of FIG. 16 are collectively represented together. As discussed, a NUC process may be selectively initiated and performed in response to various NUC process initiating events and based on various criteria or conditions. As also discussed, the NUC process may be performed in accordance with a motion-based approach (blocks 2525, 2535, and 2540) or a defocus-based approach (block 2530) to provide a blurred image frame (block 2545). FIG. 19 further illustrates various additional blocks 2550, 2552, 2555, 2560, 2565, 2570, 2571, 2572, 2573, and 2575 previously discussed with regard to FIG. 16.

As shown in FIG. 19, row and column FPN terms 2824 and 2820 and NUC terms 2817 may be determined and applied in an iterative fashion such that updated terms are determined using image frames 2802 to which previous terms have already been applied. As a result, the overall process of FIG. 19 may repeatedly update and apply such terms to continuously reduce the noise in image frames 2830 to be used by host device 2102.

Referring again to FIG. 21, further implementation details are illustrated for various blocks of FIGS. 5 and 8 in relation to pipeline 2800. For example, blocks 2525, 2535, and 2540 are shown as operating at the normal frame rate of image frames 2802 received by pipeline 2800. In the embodiment shown in FIG. 21, the determination made in block 2525 is represented as a decision diamond used to determine whether a given image frame 2802 has sufficiently changed such that it may be considered an image frame that will enhance the blur if added to other image frames and is therefore accumulated (block 2535 is represented by an arrow in this embodiment) and averaged (block 2540).

Also in FIG. 21, the determination of column FPN terms 2820 (block 2550) is shown as operating at an update rate that in this example is 1/32 of the sensor frame rate (e.g., normal frame rate) due to the averaging performed in block 2540. Other update rates may be used in other embodiments. Although only column FPN terms 2820 are identified in FIG. 21, row FPN terms 2824 may be implemented in a similar fashion at the reduced frame rate.

FIG. 21 also illustrates further implementation details in relation to the NUC determination process of block 2570. In this regard, the blurred image frame may be read to a line buffer 21030 (e.g., implemented by a block of RAM provided by any appropriate component of infrared imaging module 2100 and/or host device 2102). The flat field correction technique 2700 of FIG. 18 may be performed on the blurred image frame.

In view of the present disclosure, it will be appreciated that techniques described herein may be used to remove various types of FPN (e.g., including very high amplitude FPN) such as spatially correlated row and column FPN and spatially uncorrelated FPN.

Other embodiments are also contemplated. For example, in one embodiment, the rate at which row and column FPN terms and/or NUC terms are updated can be inversely proportional to the estimated amount of blur in the blurred image frame and/or inversely proportional to the magnitude of local contrast values (e.g., determined in block 2560).

In various embodiments, the described techniques may provide advantages over conventional shutter-based noise correction techniques. For example, by using a shutterless process, a shutter (e.g., such as shutter 2105) need not be provided, thus permitting reductions in size, weight, cost, and mechanical complexity. Power and maximum voltage supplied to, or generated by, infrared imaging module 2100 may also be reduced if a shutter does not need to be mechanically operated. Reliability will be improved by removing the shutter as a potential point of failure. A shutterless process also eliminates potential image interruption caused by the temporary blockage of the imaged scene by a shutter.

Also, by correcting for noise using intentionally blurred image frames captured from a real world scene (not a uniform scene provided by a shutter), noise correction may be performed on image frames that have irradiance levels similar to those of the actual scene desired to be imaged. This can improve the accuracy and effectiveness of noise correction terms determined in accordance with the various described techniques.

As discussed, in various embodiments, infrared imaging module 2100 may be configured to operate at low voltage levels. In particular, infrared imaging module 2100 may be implemented with circuitry configured to operate at low power and/or in accordance with other parameters that permit infrared imaging module 2100 to be conveniently and effectively implemented in various types of host devices 2102, such as mobile devices and other devices.

Figure 23:
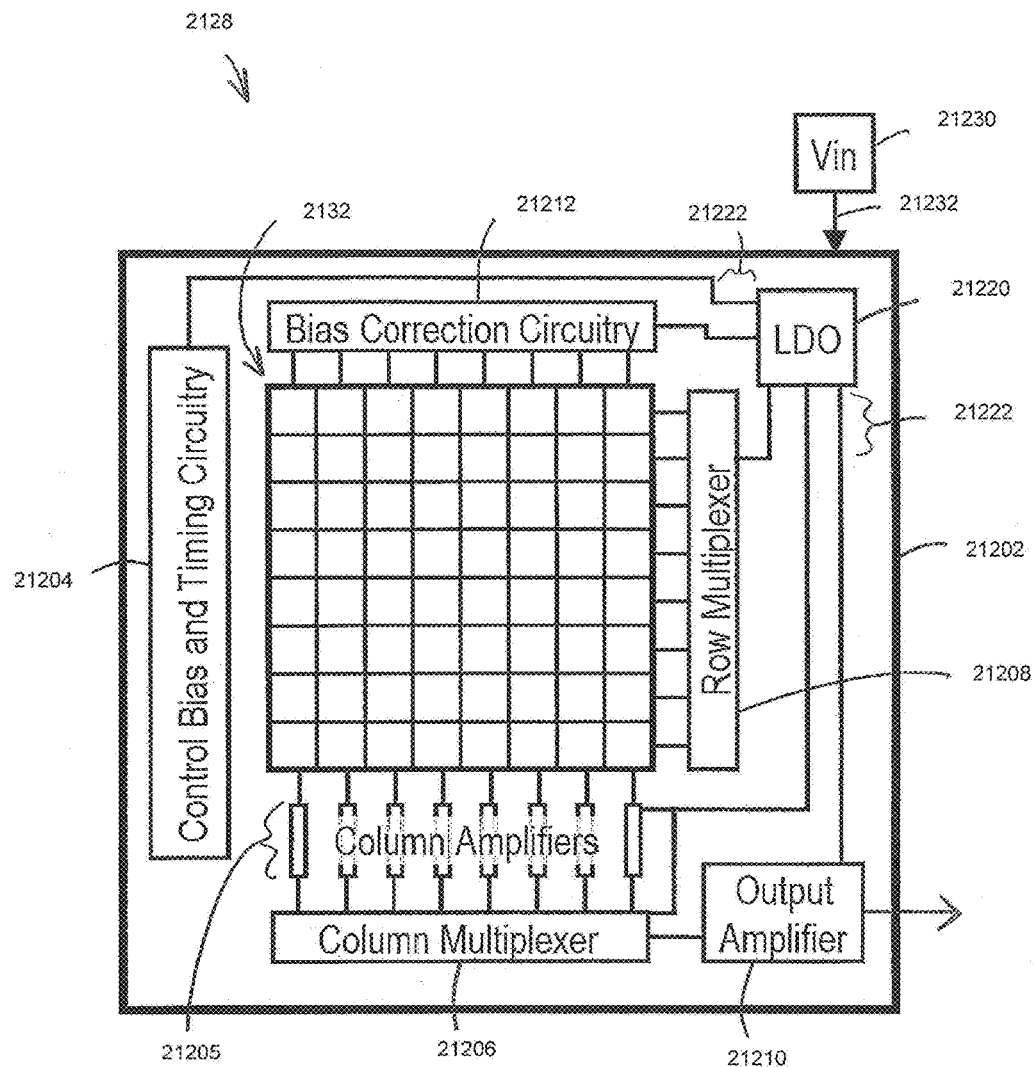
FIG. 23 illustrates a block diagram of another implementation of an infrared sensor assembly including an array of infrared sensors and a low-dropout regulator in accordance with an embodiment of the disclosure.

For example, FIG. 23 illustrates a block diagram of another implementation of infrared sensor assembly 2128 including infrared sensors 2132 and an LDO 21220 in accordance with an embodiment of the disclosure. As shown, FIG. 23 also illustrates various components 21202, 21204, 21205, 21206, 21208, and 21210 which may implemented in the same or similar manner as corresponding components previously described with regard to FIG. 15. FIG. 23 also illustrates bias correction circuitry 21212 which may be used to adjust one or more bias voltages provided to infrared sensors 2132 (e.g., to compensate for temperature changes, self-heating, and/or other factors).

In some embodiments, LDO 21220 may be provided as part of infrared sensor assembly 2128 (e.g., on the same chip and/or wafer level package as the ROIC). For example, LDO 21220 may be provided as part of an FPA with infrared sensor assembly 2128. As discussed, such implementations may reduce power supply noise introduced to infrared sensor assembly 2128 and thus provide an improved PSRR. In addition, by implementing the LDO with the ROIC, less die area may be consumed and fewer discrete die (or chips) are needed.

LDO 21220 receives an input voltage provided by a power source 21230 over a supply line 21232. LDO 21220 provides an output voltage to various components of infrared sensor assembly 2128 over supply lines 21222. In this regard, LDO 21220 may provide substantially identical regulated output voltages to various components of infrared sensor assembly 2128 in response to a single input voltage received from power source 21230, in accordance with various techniques described in, for example, U.S. patent application Ser. No. 14/101,245 filed Dec. 9, 2013 incorporated herein by reference in its entirety.

For example, in some embodiments, power source 21230 may provide an input voltage in a range of approximately 2.8 volts to approximately 11 volts (e.g., approximately 2.8 volts in one embodiment), and LDO 21220 may provide an output voltage in a range of approximately 1.5 volts to approximately 2.8 volts (e.g., approximately 2.8, 2.5, 2.4, and/or lower voltages in various embodiments). In this regard, LDO 21220 may be used to provide a consistent regulated output voltage, regardless of whether power source 21230 is implemented with a conventional voltage range of approximately 9 volts to approximately 11 volts, or a low voltage such as approximately 2.8 volts. As such, although various voltage ranges are provided for the input and output voltages, it is contemplated that the output voltage of LDO 21220 will remain fixed despite changes in the input voltage.

The implementation of LDO 21220 as part of infrared sensor assembly 2128 provides various advantages over conventional power implementations for FPAs. For example, conventional FPAs typically rely on multiple power sources, each of which may be provided separately to the FPA, and separately distributed to the various components of the FPA. By regulating a single power source 21230 by LDO 21220, appropriate voltages may be separately provided (e.g., to reduce possible noise) to all components of infrared sensor assembly 2128 with reduced complexity. The use of LDO 21220 also allows infrared sensor assembly 2128 to operate in a consistent manner, even if the input voltage from power source 21230 changes (e.g., if the input voltage increases or decreases as a result of charging or discharging a battery or other type of device used for power source 21230).

The various components of infrared sensor assembly 2128 shown in FIG. 23 may also be implemented to operate at lower voltages than conventional devices. For example, as discussed, LDO 21220 may be implemented to provide a low voltage (e.g., approximately 2.5 volts). This contrasts with the multiple higher voltages typically used to power conventional FPAs, such as: approximately 3.3 volts to approximately 5 volts used to power digital circuitry; approximately 3.3 volts used to power analog circuitry; and approximately 9 volts to approximately 11 volts used to power loads. Also, in some embodiments, the use of LDO 21220 may reduce or eliminate the need for a separate negative reference voltage to be provided to infrared sensor assembly 2128.

Figure 24:
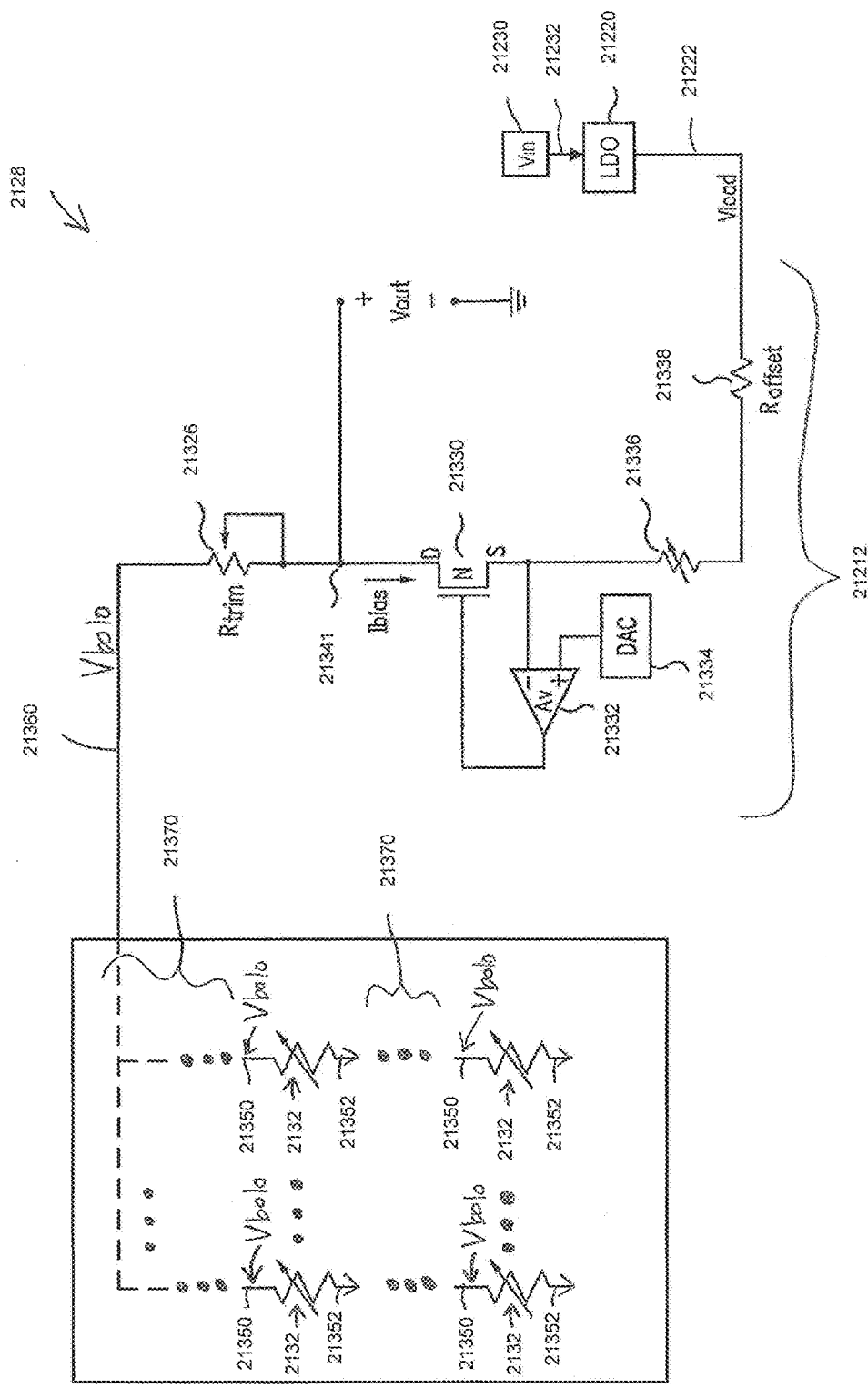
FIG. 24 illustrates a circuit diagram of a portion of the infrared sensor assembly of FIG. 23 in accordance with an embodiment of the disclosure.

Additional aspects of the low voltage operation of infrared sensor assembly 2128 may be further understood with reference to FIG. 24. FIG. 24 illustrates a circuit diagram of a portion of infrared sensor assembly 2128 of FIG. 23 in accordance with an embodiment of the disclosure. In particular, FIG. 24 illustrates additional components of bias correction circuitry 21212 (e.g., components 21326, 21330, 21332, 21334, 21336, 21338, and 21341) connected to LDO 21220 and infrared sensors 2132. For example, bias correction circuitry 21212 may be used to compensate for temperature-dependent changes in bias voltages in accordance with an embodiment of the present disclosure. The operation of such additional components may be further understood with reference to similar components identified in U.S. Pat. No. 7,679,048 issued Mar. 16, 2010 which is hereby incorporated by reference in its entirety. Infrared sensor assembly 2128 may also be implemented in accordance with the various components identified in U.S. Pat. No. 6,812,465 issued Nov. 2, 2004 which is hereby incorporated by reference in its entirety.

In various embodiments, some or all of the bias correction circuitry 21212 may be implemented on a global array basis as shown in FIG. 24 (e.g., used for all infrared sensors 2132 collectively in an array). In other embodiments, some or all of the bias correction circuitry 21212 may be implemented an individual sensor basis (e.g., entirely or partially duplicated for each infrared sensor 2132). In some embodiments, bias correction circuitry 21212 and other components of FIG. 24 may be implemented as part of ROIC 21202.

As shown in FIG. 24, LDO 21220 provides a load voltage Vload to bias correction circuitry 21212 along one of supply lines 21222. As discussed, in some embodiments, Vload may be approximately 2.5 volts which contrasts with larger voltages of approximately 9 volts to approximately 11 volts that may be used as load voltages in conventional infrared imaging devices.

Based on Vload, bias correction circuitry 21212 provides a sensor bias voltage Vbolo at a node 21360. Vbolo may be distributed to one or more infrared sensors 2132 through appropriate switching circuitry 21370 (e.g., represented by broken lines in FIG. 24). In some examples, switching circuitry 21370 may be implemented in accordance with appropriate components identified in U.S. Pat. Nos. 6,812,465 and 7,679,048 previously referenced herein.

Each infrared sensor 2132 includes a node 21350 which receives Vbolo through switching circuitry 21370, and another node 21352 which may be connected to ground, a substrate, and/or a negative reference voltage. In some embodiments, the voltage at node 21360 may be substantially the same as Vbolo provided at nodes 21350. In other embodiments, the voltage at node 21360 may be adjusted to compensate for possible voltage drops associated with switching circuitry 21370 and/or other factors.

Vbolo may be implemented with lower voltages than are typically used for conventional infrared sensor biasing. In one embodiment, Vbolo may be in a range of approximately 0.2 volts to approximately 0.7 volts. In another embodiment, Vbolo may be in a range of approximately 0.4 volts to approximately 0.6 volts. In another embodiment, Vbolo may be approximately 0.5 volts. In contrast, conventional infrared sensors typically use bias voltages of approximately 1 volt.

The use of a lower bias voltage for infrared sensors 2132 in accordance with the present disclosure permits infrared sensor assembly 2128 to exhibit significantly reduced power consumption in comparison with conventional infrared imaging devices. In particular, the power consumption of each infrared sensor 2132 is reduced by the square of the bias voltage. As a result, a reduction from, for example, 1.0 volt to 0.5 volts provides a significant reduction in power, especially when applied to many infrared sensors 2132 in an infrared sensor array. This reduction in power may also result in reduced self-heating of infrared sensor assembly 2128.

In accordance with additional embodiments of the present disclosure, various techniques are provided for reducing the effects of noise in image frames provided by infrared imaging devices operating at low voltages. In this regard, when infrared sensor assembly 2128 is operated with low voltages as described, noise, self-heating, and/or other phenomena may, if uncorrected, become more pronounced in image frames provided by infrared sensor assembly 2128.

For example, referring to FIG. 24, when LDO 21220 maintains Vload at a low voltage in the manner described herein, Vbolo will also be maintained at its corresponding low voltage and the relative size of its output signals may be reduced. As a result, noise, self-heating, and/or other phenomena may have a greater effect on the smaller output signals read out from infrared sensors 2132, resulting in variations (e.g., errors) in the output signals. If uncorrected, these variations may be exhibited as noise in the image frames. Moreover, although low voltage operation may reduce the overall amount of certain phenomena (e.g., self-heating), the smaller output signals may permit the remaining error sources (e.g., residual self-heating) to have a disproportionate effect on the output signals during low voltage operation.

To compensate for such phenomena, infrared sensor assembly 2128, infrared imaging module 2100, and/or host device 2102 may be implemented with various array sizes, frame rates, and/or frame averaging techniques. For example, as discussed, a variety of different array sizes are contemplated for infrared sensors 2132. In some embodiments, infrared sensors 2132 may be implemented with array sizes ranging from 32 by 32 to 160 by 120 infrared sensors 2132. Other example array sizes include 80 by 64, 80 by 60, 64 by 64, and 64 by 32. Any desired array size may be used.

Advantageously, when implemented with such relatively small array sizes, infrared sensor assembly 2128 may provide image frames at relatively high frame rates without requiring significant changes to ROIC and related circuitry. For example, in some embodiments, frame rates may range from approximately 120 Hz to approximately 480 Hz.

In some embodiments, the array size and the frame rate may be scaled relative to each other (e.g., in an inversely proportional manner or otherwise) such that larger arrays are implemented with lower frame rates, and smaller arrays are implemented with higher frame rates. For example, in one embodiment, an array of 160 by 120 may provide a frame rate of approximately 120 Hz. In another embodiment, an array of 80 by 60 may provide a correspondingly higher frame rate of approximately 240 Hz. Other frame rates are also contemplated.

By scaling the array size and the frame rate relative to each other, the particular readout timing of rows and/or columns of the FPA may remain consistent, regardless of the actual FPA size or frame rate. In one embodiment, the readout timing may be approximately 63 microseconds per row or column.

As previously discussed with regard to FIG. 19, the image frames captured by infrared sensors 2132 may be provided to a frame averager 2804 that integrates multiple image frames to provide image frames 2802 (e.g., processed image frames) with a lower frame rate (e.g., approximately 30 Hz, approximately 60 Hz, or other frame rates) and with an improved signal to noise ratio. In particular, by averaging the high frame rate image frames provided by a relatively small FPA, image noise attributable to low voltage operation may be effectively averaged out and/or substantially reduced in image frames 2802. Accordingly, infrared sensor assembly 2128 may be operated at relatively low voltages provided by LDO 21220 as discussed without experiencing additional noise and related side effects in the resulting image frames 2802 after processing by frame averager 2804.

Other embodiments are also contemplated. For example, although a single array of infrared sensors 2132 is illustrated, it is contemplated that multiple such arrays may be used together to provide higher resolution image frames (e.g., a scene may be imaged across multiple such arrays). Such arrays may be provided in multiple infrared sensor assemblies 2128 and/or provided in the same infrared sensor assembly 2128. Each such array may be operated at low voltages as described, and also may be provided with associated ROIC circuitry such that each array may still be operated at a relatively high frame rate. The high frame rate image frames provided by such arrays may be averaged by shared or dedicated frame averagers 2804 to reduce and/or eliminate noise associated with low voltage operation. As a result, high resolution infrared images may be obtained while still operating at low voltages.

In various embodiments, infrared sensor assembly 2128 may be implemented with appropriate dimensions to permit infrared imaging module 2100 to be used with a small form factor socket 2104, such as a socket used for mobile devices. For example, in some embodiments, infrared sensor assembly 2128 may be implemented with a chip size in a range of approximately 4.0 mm by approximately 4.0 mm to approximately 5.5 mm by approximately 5.5 mm (e.g., approximately 4.0 mm by approximately 5.5 mm in one example). Infrared sensor assembly 2128 may be implemented with such sizes or other appropriate sizes to permit use with socket 2104 implemented with various sizes such as: 8.5 mm by 8.5 mm, 8.5 mm by 5.9 mm, 6.0 mm by 6.0 mm, 5.5 mm by 5.5 mm, 4.5 mm by 4.5 mm, and/or other socket sizes such as, for example, those identified in Table 1 of U.S. Provisional Patent Application No. 61/495,873 filed Jun. 10, 2011 incorporated herein by reference in its entirety.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

The foregoing disclosure is not intended to limit the present invention to the precise forms or particular fields of use disclosed. It is contemplated that various alternate embodiments and/or modifications to the present invention, whether explicitly described or implied herein, are possible in light of the disclosure.

Embodiments described above illustrate but do not limit the invention. It should also be understood that numerous modifications and variations are possible in accordance with the principles of the invention. Accordingly, the scope of the invention is defined only by the following claims.

What is claimed is:

1. An imaging system comprising:
    a system housing;
    an imager array disposed in the system housing and adapted to image a scene, wherein the imager array comprises a base and a plurality of infrared imaging modules arranged in an array comprising a plurality of rows and a plurality of columns, wherein each infrared imaging module comprises:
        a module housing,
        an optical element fixed relative to the module housing and adapted to receive infrared radiation from the scene, and
        a plurality of infrared sensors in a focal plane array (FPA) adapted to capture an image of the scene based on the infrared radiation received through the optical element; and
    wherein the infrared imaging modules are arranged within the system housing in a multi-level staggered configuration such that first and second levels of the infrared imaging modules including the plurality of infrared sensors are disposed at corresponding first and second distances from the base, wherein the first distance is different than the second distance.

2. The imaging system of claim 1, wherein the multi-level staggered configuration increases a packing ratio of the imager array and reduces parallax associated with at least two of the infrared imaging modules.

3. The imaging system of claim 1, wherein:
a first one of the infrared imaging modules comprises a first filter adapted to limit the infrared radiation received by the first infrared imaging module to a first spectral range; and
a second one of the infrared imaging modules comprises a second filter adapted to limit the infrared radiation received by the second infrared imaging module to a second spectral range.

4. The imaging system of claim 1, wherein:
at least a first one of the infrared imaging modules is greater in size than a second one of the infrared imaging modules; and
the first infrared imaging module is adapted to capture an image of the scene with a higher resolution and a narrower field of view than the second infrared imaging module.

5. The imaging system of claim 1, wherein at least one of the infrared imaging modules is adapted to block infrared radiation outside a desired field of view of its infrared sensors.

6. The imaging system of claim 1, wherein at least two of the infrared imaging modules exhibit parallax relative to each other and are adapted to provide stereo images of the scene, wherein the system is configured to selectively compensate for the parallax.

7. The imaging system of claim 1, wherein:
each infrared imaging module comprises an optical axis extending from its infrared sensors through its optical element;
the optical axes of at least two of the infrared imaging modules exhibit phase shifts relative to each other;
images provided by the at least two infrared imaging modules are phase shifted relative to each other; and
the imaging system further comprises a processor adapted to perform super resolution processing of the phase shifted images to provide a result image of the scene with a resolution greater than the resolution of the at least two infrared imaging modules.

8. The imaging system of claim 1, wherein:
the imager array is adapted to capture a first image of the scene using at least a first one of the infrared imaging modules;
the imager array is adapted to capture a second image of the scene using at least a second one of the infrared imaging modules substantially simultaneously with the first image, wherein the second image has a higher resolution than the first image; and
the imaging system further comprises:
a database comprising a mapping from the first image to the second image, and
a processor adapted to:
map a third image provided by the imager array to the first image, wherein the third image has a resolution substantially equal to the first image, and
replace the third image with the second image to provide a high resolution result image.

9. The imaging system of claim 1, wherein:
one of the infrared sensors in a first one of the infrared imaging modules is defective; and
the imaging system further comprises a processor adapted to replace image data associated with the defective infrared sensor with image data associated with a corresponding one of the infrared sensors in a second one of the infrared imaging modules.

10. The imaging system of claim 1, further comprising a processor adapted to:
map the infrared sensors of at least two of the infrared imaging modules to a grid comprising a plurality of pixels;
accumulate signals from the at least two infrared imaging modules for each of the grid pixels; and
provide a result image of the scene from the grid pixels, wherein the result image has a signal to noise ratio higher than signal to noise ratios of the images captured by the infrared imaging modules.

11. The imaging system of claim 1, wherein the imager array further comprises:
a plurality of visible light sensor arrays, wherein each visible light sensor array comprises:
a lens adapted to receive visible light radiation from the scene; and
a plurality of visible light sensors adapted to capture an image of the scene based on the visible light radiation received through the lens.

12. The imaging system of claim 1, wherein:
a first one of the infrared imaging modules is adapted to capture a first image of a first wavelength range of the infrared radiation;
a second one of the infrared imaging modules is adapted to capture a second image of a second wavelength range of the infrared radiation;
the second wavelength range is a subset of the first wavelength range and substantially corresponds to an absorption band of a gas; and
the imaging system further comprises a processor adapted to compare the first and second images to determine a presence of the gas in the scene.

13. The imaging system of claim 12, wherein:
a third one of the infrared imaging modules is adapted to capture a third image of a third wavelength range of the infrared radiation;
the third wavelength range substantially corresponds to another absorption band of the gas; and
the processor is adapted to compare the first or second images to the third image to determine the presence of the gas in the scene.

14. The imaging system of claim 1, wherein each infrared imaging module further comprises a processor adapted to:
receive a plurality of pixel values associated with the images captured by the infrared sensors of the infrared imaging modules;
map the infrared sensors to a coordinate space, wherein at least one infrared sensor of each infrared imaging module is mapped to each coordinate of the coordinate space; and
calculate an offset correction term for each infrared sensor based on the pixel values of all infrared sensors mapped to the same coordinate.

15. The imaging system of claim 1, wherein the FPA of each infrared imaging module comprises an array of microbolometers adapted to receive a bias voltage selected from a range of approximately 0.2 volts to approximately 0.7 volts.

16. The imaging system of claim 15, wherein:
a size of the array of microbolometers is approximately 80 by 60; and
each infrared imaging module is adapted to be inserted into a socket having dimensions less than approximately 8.5 mm by 8.5 mm.

17. The imaging system of claim 1, wherein:
the images are unblurred infrared images of the scene;
at least one of the infrared imaging modules is configured to capture an intentionally blurred infrared image of the scene; and
the imaging system further comprises a processor adapted to determine a plurality of non-uniform correction (NUC) terms based on the intentionally blurred infrared image and apply the NUC terms to a corresponding unblurred infrared image to remove noise from the unblurred infrared image.

18. A method of imaging, the method comprising:
receiving infrared radiation from a scene at an imager array disposed in a system housing of an imaging system, wherein the imager array comprises a base and a plurality of infrared imaging modules arranged in an array comprising a plurality of rows and a plurality of columns, wherein each infrared imaging module comprises a module housing, an optical element fixed relative to the module housing and adapted to receive the infrared radiation from the scene, and a plurality of infrared sensors in a focal plane array (FPA) adapted to capture an image of the scene based on the infrared radiation received through the optical element;
capturing a plurality of images of the scene substantially simultaneously using the infrared sensors of the infrared imaging modules; and
wherein the infrared imaging modules are arranged within the system housing in a multi-level staggered configuration such that first and second levels of the infrared imaging modules including the plurality of infrared sensors are disposed at corresponding first and second distances from the base, wherein the first distance is different than the second distance.

19. The method of claim 18, wherein the multi-level staggered configuration increases a packing ratio of the imager array and reduces parallax associated with at least two of the infrared imaging modules.

20. The method of claim 18, further comprising:
filtering the infrared radiation received by a first one of the infrared imaging modules to a first spectral range; and
filtering the infrared radiation received by a second one of the infrared imaging modules to a second spectral range.

21. The method of claim 18, wherein:
at least a first one of the infrared imaging modules is greater in size than a second one of the infrared imaging modules; and
the image captured by the first infrared imaging module has a higher resolution and a narrower field of view than the image captured by the second infrared imaging modules.

22. The method of claim 18, wherein at least one of the infrared imaging modules is adapted to block infrared radiation outside a desired field of view of its infrared sensors.

23. The method of claim 18, wherein at least two of the infrared imaging modules exhibit parallax relative to each other and their captured images are stereo images of the scene, wherein the system is configured to selectively compensate for the parallax.

24. The method of claim 18, wherein:
each infrared imaging module comprises an optical axis extending from its infrared sensors through its optical element;
the optical axes of at least two of the infrared imaging modules exhibit phase shifts relative to each other;
images provided by the at least two infrared imaging modules are phase shifted relative to each other; and
the method further comprises performing super resolution processing of the phase shifted images to provide a result image of the scene with a resolution greater than the resolution of the at least two infrared imaging modules.

25. The method of claim 18, wherein the capturing comprises:
capturing a first image of the scene using at least a first one of the infrared imaging modules;
capturing a second image of the scene using at least a second one of the infrared imaging modules substantially simultaneously with the first image, wherein the second image has a higher resolution than the first image;
mapping the first image to the second image;
mapping a third image provided by the imager array to the first image, wherein the third image has a resolution substantially equal to the first image; and
replacing the third image with the second image to provide a high resolution result image.

26. The method of claim 18, wherein:
one of the infrared sensors in a first one of the infrared imaging modules is defective; and
the method further comprises replacing image data associated with the defective infrared sensor with image data associated with a corresponding one of the infrared sensors in a second one of the infrared imaging modules.

27. The method of claim 18, further comprising:
mapping the infrared sensors of at least two of the infrared imaging modules to a grid comprising a plurality of pixels;
accumulating signals from the at least two infrared imaging modules for each of the grid pixels; and
providing a result image of the scene from the grid pixels, wherein the result image has a signal to noise ratio higher than signal to noise ratios of the images captured by the infrared imaging modules.

28. The method of claim 18, wherein the imager array further comprises a plurality of visible light sensor arrays, wherein each visible light sensor array comprises a lens adapted to receive visible light radiation from the scene and a plurality of visible light sensors adapted to capture an image of the scene based on the visible light radiation received through the lens.

29. The method of claim 18, further comprising:
capturing a first image of a first wavelength range of the infrared radiation;
capturing a second image of a second wavelength range of the infrared radiation, wherein the second wavelength range is a subset of the first wavelength range and substantially corresponds to an absorption band of a gas; and
comparing the first and second images to determine a presence of the gas in the scene.

30. The method of claim 29, further comprising:
capturing a third image of a third wavelength range of the infrared radiation, wherein the third wavelength range substantially corresponds to another absorption band of the gas; and
comparing the first or second images to the third image to determine the presence of the gas in the scene.

31. The method of claim 18, further comprising:
- receiving a plurality of pixel values associated with the images captured by the infrared sensors of the infrared imaging modules;
- mapping the infrared sensors to a coordinate space, wherein at least one infrared sensor of infrared imaging module is mapped to each coordinate of the coordinate space; and
- calculating an offset correction term for each infrared sensor based on the pixel values of all infrared sensors mapped to the same coordinate.

32. The method of claim 18, wherein the FPA of each infrared imaging module comprises an array of microbolometers adapted to receive a bias voltage selected from a range of approximately 0.2 volts to approximately 0.7 volts.

33. The method of claim 32, wherein:
- a size of the array of microbolometers is approximately 80 by 60; and
- each infrared imaging module is adapted to be inserted into a socket having dimensions less than approximately 8.5 mm by 8.5 mm.

34. The method of claim 18, wherein the images are unblurred infrared images of the scene, the method further comprising:
- capturing, by at least one of the infrared imaging modules, an intentionally blurred infrared image of the scene; and
- determining a plurality of non-uniform correction (NUC) terms based on the intentionally blurred infrared image and applying the NUC terms to a corresponding unblurred infrared image to remove noise from the unblurred infrared image.

35. The system of claim 1, wherein the rows of the array of infrared imaging modules extend in a first direction and the columns of the array of infrared imaging modules extend in a second direction, and
- wherein the first level and the second level are displaced relative to each other along a third direction normal to a plane formed by the first direction and the second direction.

36. The method of claim 18, wherein the rows of the array of infrared imaging modules extend in a first direction and the columns of the array of infrared imaging modules extend in a second direction, and
- wherein the first level and the second level are displaced relative to each other along a third direction normal to a plane formed by the first direction and the second direction.

* * * * *